(12) United States Patent
Otake et al.

(10) Patent No.: US 10,320,380 B2
(45) Date of Patent: Jun. 11, 2019

(54) POWER CIRCUIT AND POWER MODULE USING MISFET HAVING CONTROL CIRCUIT DISPOSED BETWEEN GATE AND SOURCE

(71) Applicant: ROHM CO., LTD., Kyoto-shi, Kyoto (JP)

(72) Inventors: Hirotaka Otake, Kyoto (JP); Tatsuya Yanagi, Kyoto (JP); Yusuke Nakakohara, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 15/724,491

(22) Filed: Oct. 4, 2017

(65) Prior Publication Data

US 2018/0048306 A1    Feb. 15, 2018

Related U.S. Application Data

(63) Continuation of application No. 15/192,677, filed on Jun. 24, 2016, now Pat. No. 9,819,338, which is a
(Continued)

(30) Foreign Application Priority Data

Dec. 26, 2013 (JP) .................. 2013-268787

(51) Int. Cl.
*H03K 17/16* (2006.01)
*H01L 23/10* (2006.01)
(Continued)

(52) U.S. Cl.
CPC ........... *H03K 17/162* (2013.01); *H01L 23/10* (2013.01); *H01L 23/495* (2013.01);
(Continued)

(58) Field of Classification Search
CPC .......... H01L 23/10; H01L 23/495; H01L 23/234952; H01L 23/49548;
(Continued)

(56) References Cited

U.S. PATENT DOCUMENTS 5,202,752 A * 4/1993 Honjo .................. H01L 23/481
257/678
5,880,621 A   3/1999 Ohashi
(Continued)

FOREIGN PATENT DOCUMENTS

JP    5-226994       9/1993
JP    H10-313570 A   11/1998
(Continued)

OTHER PUBLICATIONS

Japanese Official Action, Japanese Patent Application No. JP 2013-268787, dated Jan. 30, 2018, with machine translation (11 pages).
(Continued)

*Primary Examiner* — Nathan W Ha
(74) *Attorney, Agent, or Firm* — Hamre, Schumann, Mueller & Larson, P.C.

(57) ABSTRACT

The power circuit includes: a main substrate; a first electrode pattern disposed on the main substrate and connected to a positive-side power terminal P; a second electrode pattern disposed on a main substrate and connected to a negative-side power terminal N; a third electrode pattern disposed on the main substrate and connected to an output terminal O; a first MISFET Q1 of which a first drain is disposed on the first electrode pattern; a second MISFET Q4 of which a second drain is disposed on the third electrode pattern; a first control circuit (DG1) connected between a first gate G1 and a first source S1 of the first MISFET, and configured to control a current path conducted from the first source towards the first gate.

50 Claims, 32 Drawing Sheets

Related U.S. Application Data continuation of application No. PCT/JP2014/084292, filed on Dec. 25, 2014.

(51) Int. Cl.
| | |
|---|---|
| *H01L 29/16* | (2006.01) |
| *H01L 29/78* | (2006.01) |
| *H03K 17/041* | (2006.01) |
| *H01L 23/495* | (2006.01) |
| *H01L 23/552* | (2006.01) |
| *H01L 29/66* | (2006.01) |
| *H01L 23/498* | (2006.01) |
| *H01L 23/31* | (2006.01) |

(52) U.S. Cl.
CPC .... *H01L 23/4952* (2013.01); *H01L 23/49541* (2013.01); *H01L 23/49548* (2013.01); *H01L 23/49562* (2013.01); *H01L 23/552* (2013.01); *H01L 29/1608* (2013.01); *H01L 29/66068* (2013.01); *H01L 29/7802* (2013.01); *H01L 29/7805* (2013.01); *H01L 29/7813* (2013.01); *H03K 17/04106* (2013.01); *H03K 17/165* (2013.01); *H01L 23/3107* (2013.01); *H01L 23/49833* (2013.01); *H01L 23/49844* (2013.01); *H01L 2224/0603* (2013.01); *H01L 2224/48137* (2013.01); *H01L 2224/48247* (2013.01); *H01L 2224/49111* (2013.01); *H01L 2224/49113* (2013.01); *H01L 2924/00* (2013.01); *H01L 2924/13055* (2013.01)

(58) Field of Classification Search
CPC ............. H01L 23/49562; H01L 23/552; H01L 29/1608; H01L 29/7805; H01L 29/7813; H03K 17/162

See application file for complete search history.

(56) References Cited

U.S. PATENT DOCUMENTS

| | | |
|---|---|---|
| 5,977,814 A | 11/1999 | Ishii |
| 2004/0145407 A1 | 7/2004 | Shirasawa et al. |
| 2005/0062508 A1 | 3/2005 | Nishimura |
| 2006/0125456 A1 | 6/2006 | Wu et al. |
| 2007/0200537 A1 | 8/2007 | Akiyama et al. |
| 2008/0290927 A1 | 11/2008 | Mazzola et al. |
| 2009/0015224 A1 | 1/2009 | Hirao et al. |
| 2010/0164077 A1* | 7/2010 | Bando ............... H01L 23/49503 257/659 |
| 2010/0230789 A1* | 9/2010 | Yorita ................. H01L 23/3121 257/659 |
| 2012/0068739 A1 | 7/2012 | Horbach et al. |
| 2012/0229200 A1 | 9/2012 | Takao et al. |
| 2013/0147540 A1 | 6/2013 | Wu et al. |
| 2013/0200929 A1 | 8/2013 | Sawada et al. |
| 2013/0265029 A1 | 10/2013 | Akiyama et al. |
| 2013/0271101 A1* | 10/2013 | Nanov ................. H03K 17/162 323/282 |
| 2014/0225661 A1* | 8/2014 | Otremba .................. G05F 3/02 327/530 |

FOREIGN PATENT DOCUMENTS

| | | |
|---|---|---|
| JP | 2000-214821 A | 8/2000 |
| JP | 2002-118258 | 4/2002 |
| JP | 2012-239061 A | 6/2012 |
| JP | 2013-125916 A | 6/2013 |
| WO | 2012/018073 | 2/2012 |

OTHER PUBLICATIONS

International Search report issued in PCT/JP2014/084292 dated Mar. 31, 2015.

\* cited by examiner

POWER CIRCUIT AND POWER MODULE USING MISFET HAVING CONTROL CIRCUIT DISPOSED BETWEEN GATE AND SOURCE

CROSS REFERENCE TO RELATED APPLICATIONS

This is a continuation application (CA) of PCT Application No.PCT/JP2014/84292, filed on Dec. 25, 2014, which claims priority to Japan Patent Application No. P2013-268787 filed on Dec. 26, 2013 and is based upon and claims the benefit of priority from prior Japanese Patent Applications P2013-268787 filed on Dec. 26, 2013 and PCT Application No.PCT/JP2014/84292, filed on Dec. 25, 2014, the entire contents of each of which are incorporated herein by reference.

FIELD

The embodiment described herein relates to a power circuit and a power module.

BACKGROUND

In half bridge circuits, when a switching element of a one-sided arm turns on from a dead time state, there is a phenomenon in which gate erroneous turning-on occurs (misfiring (erroneous firing)) in another-sided switching element caused by a drain voltage change. This is a problem which can occur in three phase inverter circuits, synchronous-rectification DC/DC converters, etc., for example, used for motor driving.

On the other hand, many research institutions are currently conducting research to develop Silicon Carbide (SiC) devices. Advantages of SiC power devices over Si power devices include low on resistance, high switching speed, high temperature operation, etc.

Moreover, if an energy stored in a negative direction in a capacitance between gate and source resonates when a short-circuit current due to the gate erroneous turning-on converges, re-erroneous turning-on (oscillation) will be caused, and then gate surge and drain surge voltages at that time not only can break down the switching element, but can become a noise source.

Extreme high-speed operation is limited since a portion shared between signal wiring and power wiring is in source wiring when forming a bridge with a discrete device and therefore a gate signal is reduced due to electrification of the source wiring.

On the other hand, in power modules in which gate signal wiring and source signal wiring become longer by separating the signal wiring and the power wiring from each other using source sense wiring and by connecting in parallel a semiconductor chip in order to allow large capacities, since it does not receive an inhibition of gate driving due to electrification of the source wiring if using a switching element which performs high-speed operation, the occurrence of erroneous turning-on and an oscillation triggered by the erroneous turning-on is in particular a problem, and is also an important problem which should be avoided in particular.

SUMMARY

The embodiment provides a power circuit capable of reducing a misoperation and a parasitic oscillation and further capable of realizing high speed switching performance, and a power module in which such a power circuit is mounted.

According to one aspect of the embodiment, there is provided a power circuit comprising: a main substrate; a first electrode pattern disposed on the main substrate, the first electrode pattern connected to a positive-side power terminal; a second electrode pattern disposed on the main substrate, the second electrode pattern connected to a negative-side power terminal; a third electrode pattern disposed on the main substrate, the third electrode pattern connected to an output terminal; a first MISFET in which a first drain is disposed on the first electrode pattern; a second MISFET in which a second drain is disposed on the third electrode pattern; and a first control circuit connected between a first gate and a first source of the first MISFET, the first control circuit configured to control a current path conducted from the first source towards the first gate.

According to another aspect of the embodiment, there is provided a power module comprising a power circuit, wherein the power circuit comprises: a main substrate; a first electrode pattern disposed on the main substrate, the first electrode pattern connected to a positive-side power terminal; a second electrode pattern disposed on the main substrate, the second electrode pattern connected to a negative-side power terminal; a third electrode pattern disposed on the main substrate, the third electrode pattern connected to an output terminal; a first MISFET in which a first drain is disposed on the first electrode pattern; a second MISFET in which a second drain is disposed on the third electrode pattern; and a first control circuit connected between a first gate and a first source of the first MISFET, the first control circuit configured to control a current path conducted from the first source towards the first gate.

According to the embodiment, there can be provided the power circuit capable of reducing the misoperation and the parasitic oscillation and further capable of realizing the high speed switching performance; and the power module in which such a power circuit is mounted.

DESCRIPTION OF EMBODIMENTS

Figure 1:
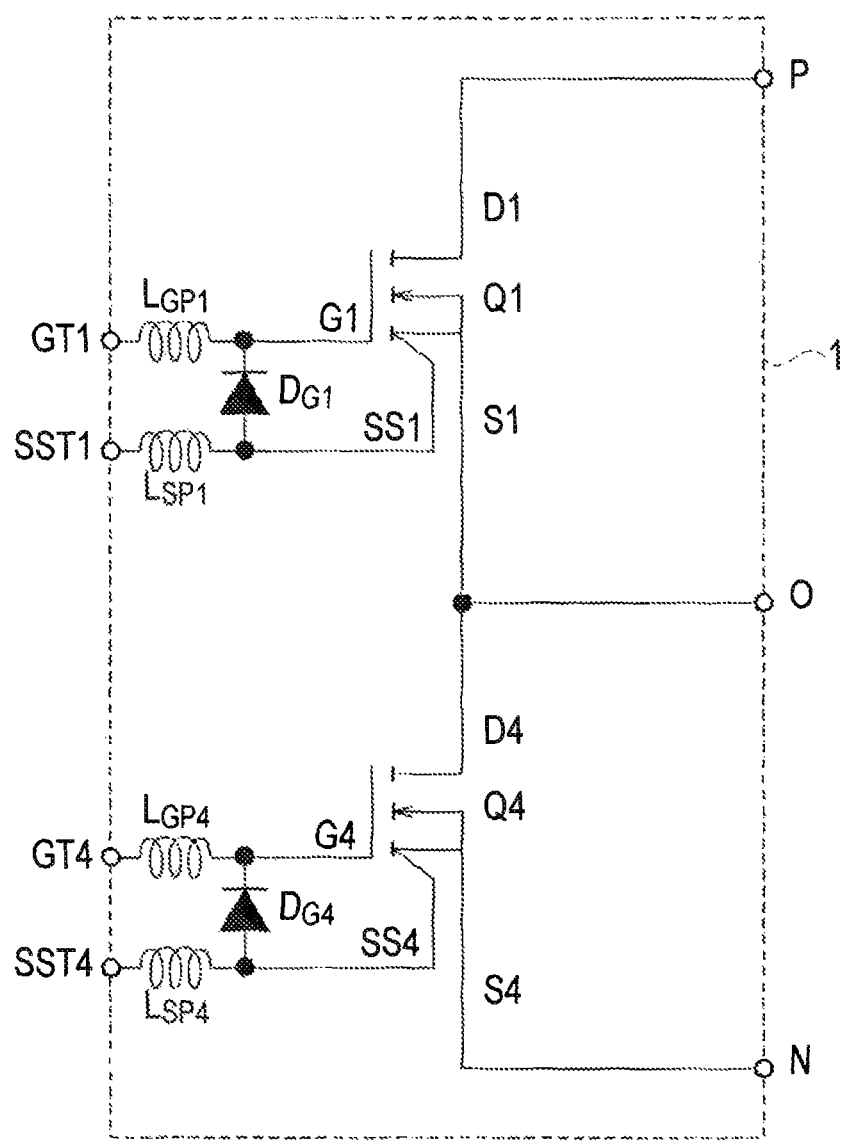
FIG. 1 is a schematic circuit configuration diagram of a half bridge circuit, which is a power circuit according to a first embodiment.

Next, certain embodiments will be described with reference to drawings. In the description of the following drawings, the identical or similar reference numeral is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

First Embodiment (Power Circuit)

Figure 15:
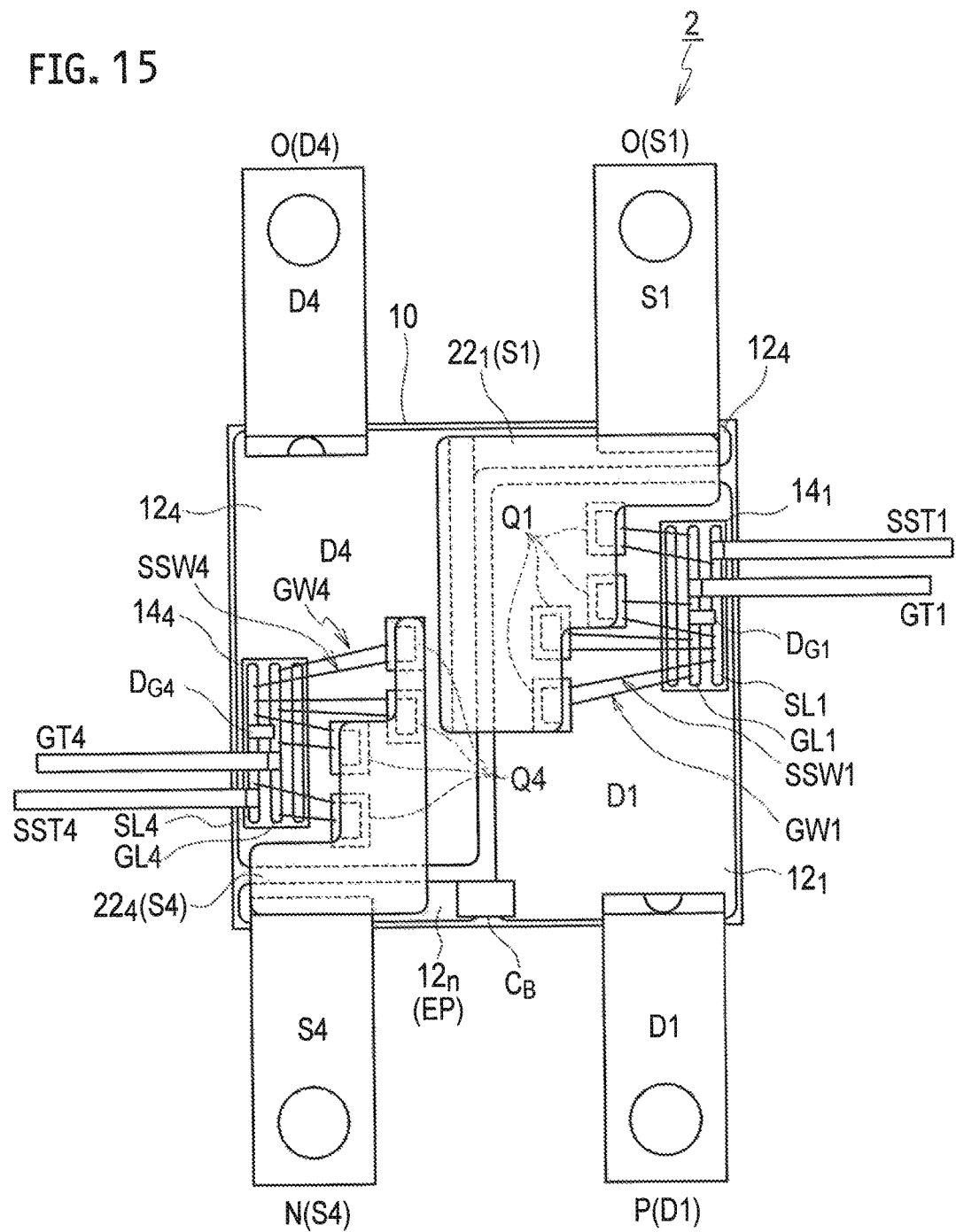
FIG. 15 is a schematic planar pattern configuration diagram before forming a resin layer in a 2-in-1 module (module with a built-in half-bridge), in the power module according to the first embodiment.

FIG. 1 shows a schematic circuit configuration of a half bridge circuit, in a power circuit 1 according to a first embodiment. Moreover, FIG. 15 shows a schematic planar pattern configuration before forming a resin layer 120 in a 2-in-1 module (module with the built-in half-bridge), in a power module 2 in which the power circuit 1 according to the first embodiment is mounted. Note that the power circuit 1 according to the first embodiment is not limited to such a half bridge circuit, but can be applied also to a full bridge circuit or a three-phase bridge circuit.

As shown in FIGS. 1 and 15, the power circuit 1 according to the first embodiment is a circuit in which a plurality of Metal-Insulator-Semiconductor Field Effect Transistors (MISFETs) are included, and drains D1, D4 of a first MISFET Q1 and a second MISFET Q4 are electrically connected on a main substrate 10 including electrode patterns $12_1$, $12_n$, $12_4$. The power circuit 1 according to the first embodiment simultaneously includes gates G1, G4, source senses SS1, SS4, a gate terminal GT1 for external extraction, a source sense terminal SST1, and power terminals P, N; and includes a first control circuit for controlling at least a current path conducted from the first source S1 towards the first gate G1 of the first MISFET Q1.

More particularly, as shown in FIGS. 1 and 15, the power circuit 1 according to the first embodiment includes: a main substrate 10; a first electrode pattern $12_1$ disposed on the main substrate 10 and connected to a positive-side power terminal P; a second electrode pattern $12_n$ disposed on the main substrate 10 and connected to a negative-side power terminal N; a third electrode pattern $12_4$ disposed on the main substrate 10 and connected to an output terminal O; a first MISFET Q1 in which a first drain D1 is disposed on the first electrode pattern $12_1$; a second MISFET Q4 in which a second drain D4 is disposed on the third electrode pattern $12_4$; and a first control circuit connected between a first gate G1 and a first source Si of the first MISFET Q1, the first control circuit configured to control a current path conducted from the first source S1 towards the first gate G1.

The power circuit 1 according to the first embodiment further may include a second control circuit connected between the second gate G4 and the second source S4 of the second MISFET Q4, the second control circuit configured to control a current path conducted from the second source S4 towards the second gate G4.

In this embodiment, the first control circuit includes: a first gated diode $D_{G1}$ of which a cathode is connected to the first gate G1 and an anode is connected to the first source S1.

Moreover, the second control circuit includes: a second gated diode $D_{G4}$ of which a cathode is connected to the second gate G4 and an anode is connected to the second source S4.

Moreover, as shown in FIGS. 1 and 15, in the power circuit 1 according to the first embodiment, a part of the electrode patterns $12_1$, $12_4$ may be disposed on signal substrates $14_1$, $14_4$ different from the main substrate 10, the signal substrates $14_1$, $14_4$ may be disposed on the main substrate 10, and the control circuit may be disposed on the signal substrates $14_1$, $14_4$. By adopting such a configuration, the control circuit becomes difficult to receive an effect of instantaneous heat generation of the transistor, and thereby can avoid a misoperation.

More particularly, as shown in FIG. 15, the power circuit 1 according to the first embodiment may include a first signal substrate $14_1$ disposed on the main substrate 10, the first signal substrate 141 in which a signal wiring pattern GL1 for first gate connected to the first gate G1 and a signal wiring pattern SL1 for first source sense connected to the first source S1 are mounted thereon.

Moreover, as shown in FIG. 15, the power circuit 1 according to the first embodiment may include a second signal substrate $14_4$ disposed on the main substrate 10, the second signal substrate 144 in which a signal wiring pattern GL4 for second gate connected to the second gate G4 and a signal wiring pattern SL4 for the second source sense connected to the second source S4 are mounted thereon.

In this embodiment, as shown in FIG. 15, the first control circuit may include a first gated diode $D_{G1}$ connected between the signal wiring pattern GL1 for first gate and the signal wiring pattern SL1 for first source sense. As for these patterns, it is preferable to reduce a parasitic inductance by having parallel or face-to-face disposition with each other.

Moreover, as shown in FIG. 15, the second control circuit may include a second gated diode DG4 connected between the signal wiring pattern $G_{L4}$ for second gate and the signal wiring pattern SL4 for second source sense.

Moreover, it is effective to set up a circuit constant also by taking into consideration a parasitic inductance of wiring from the first MISFET to the first gated diode so that a forward voltage when the first gated diode $D_{G1}$ is conducting becomes lower than a negative-side absolute maximum rating of the voltage between the gate and the source in the first MISFET. Similarly, it is effective to set up a circuit constant also by taking into consideration a parasitic inductance of wiring from the second MISFET to the second gated diode so that a forward voltage when the second gated diode $D_{G4}$ is conducting becomes lower than a negative-side absolute maximum rating of the voltage between the gate and the source in the second MISFET.

In the power circuit 1 according to the first embodiment, voltage is applied between the gate and the source in the first MISFET for the amount of the forward voltage drop of the first gated diode $D_{G1}$ in a gate-negative direction. Accordingly, a dielectric breakdown can be prevented by designing the on-characteristics of the first gated diode $D_{G1}$.

Moreover, a Zener diode or a Schottky Barrier Diode (SBD) is applicable, as the first gated diode $D_{G1}$. Similarly, such a Zener diode or SBD is also applicable as the second gated diode $D_{G4}$.

As the first gated diode $D_{G1}$, although a voltage applied in the gate-negative direction becomes slightly higher since the forward voltage is higher if the Zener diode is applied thereto, a voltage applied in the gate-negative direction becomes lower since the forward voltage is lower if the Schottky barrier diode is applied thereto, and thereby coping therewith will be easy.

More specifically, the forward voltage when the first gated diode $D_{G1}$ is conducting needs to be lower than a gate breakdown voltage of the voltage between the gate and the source in the first MISFET. A value of negative-side absolute maximum rating of the voltage between the gate and the source in the first MISFET is approximately 6V, for example.

In the power circuit 1 according to the first embodiment and the power module 2 in which such a power circuit 1 is mounted thereon, the gated diode $D_{G1}$ for reducing a vibration of the voltage between the gate and the source is connected to the gate G1 and source sense SS1 wiring patterns in which the first MISFET is mounted thereon (anode A is connected to the source sense SS1 side and the cathode K is connected to the gate G1 side) (it is important to be disposed inside from the signal terminals GT1, SST1 connected to outside). By connecting gated diode $D_{G1}$ thereto like such a manner, the vibration and oscillation of the voltage between the gate and the source in the case of the voltage is applied to a capacitance between gate and source in the negative direction can be reduced, stable operation can be obtained, and configuration with a simple circuit to be miniaturized can be realized.

In the implementation example shown in FIG. 15, the gated diodes $D_{G1}$, $D_{O2}$ are disposed on the signal substrates $14_1$, $14_4$ disposed on the main substrate 10.

As shown in FIG. 1, there are parasitic inductances $L_{GP1}$, $L_{SP1}$ associated with routing of signal terminals GT1, SST1 and electrode wiring, etc. between the signal terminals GT1, SST1 for external extraction and the gate G1, the source sense SS1 in the first MISFET Q1. Since such an inductance component exists in a gate closed circuit of the first MISFET Q1, it causes an operation delay in gate driving of the first MISFET Q1, or increase of the voltage variation between the gate and the source sense at the time when the voltage between the drain and the source is changed.

Although the gated diode $D_{G1}$ is disposed between the gate G1 wiring and the source sense SS1 wiring, the effect becomes higher as the distance from the cathode K and the anode A in the diode $D_{G1}$ to the gate pad electrode GP and the source pad electrode SP in the first MISFET Q1 becomes shorter in order to reduce the parasitic effect due to such an inductance component. In the present embodiment, the gate pad electrode GP and the source pad electrode SP in the first MISFET Q1 are formed on a front side surface of the first MISFET Q1. Accordingly, even if the gated diode $D_{G1}$ is built in the same chip as the first MISFET Q1, the anode A of the gated diode $D_{G1}$ chip can also directly be soldered on the source pad electrode SP of the first MISFET Q1.

Moreover, although the gated diode $D_{G1}$ may be disposed collectively for every first MISFET Q1 disposed in parallel, it is more effective to individually connect the gated diode DG1 to every first MISFET Q1, respectively.

Although, it is important for the gated diode DG1 to be disposed inside from the signal terminals $G_{T1}$, SST1 for external extraction having parasitic inductances $L_{GP1}$ $L_{SP1}$, and it is more effective as nearest to the first MISFET Q1, the effect is expectable even if it is connected so as to bridge between the terminals or between edge parts of the terminals.

However, since temperature becomes higher when connecting the gated diode $D_{G1}$ directly on the chip of the first MISFET Q1, it is preferable to compose the gated diode DG1 from wideband gap semiconductors, e.g. SiC, GaN, etc. with satisfactory high-temperature characteristics.

Although the Zener diode is applicable to the gated diode $D_{G1}$ in disposition, the SBD having the sufficient characteristics, etc. are more effective since the forward characteristic is utilized.

On the other hand, in the case of applying the Zener diode thereto, it is expected that a clamp function of the positive-direction gate voltage can be held.

The above-mentioned explanation is the same also as that for the gated diode DG2.

As explained above, according to the power circuit 1 according to the first embodiment, there can be obtained the small-sized half bridge circuit for reducing the oscillation. Note that it is not limited to such a half bridge circuit, but a full bridge circuit or a three-phase bridge circuit can also similarly be applied thereto.

Moreover, any one the first MISFET Q1 or the second MISFET Q2 can be composed of the SiC MISFET.

SiC can realize low on resistance $R_{on}$ by realizing high concentration of a thin film and drift layer since the dielectric breakdown electric field is higher. However, since an expansion width of depletion layer with respect to the drift layer is limited for the amount thereof and a feedback capacitance $C_{rss}$ is not easily reduced, a ratio of $C_{gs}$:$C_{gd}$ is smaller and a gate erroneous turning-on operation easily occurs caused by drain voltage change $dV_{ds}/dt$, where $C_{gs}$ is the capacitance between gate and source and $C_{gd}$ is the capacitance between the gate and the drain.

The parasitic oscillation can be reduced and high speed switching performance can be secured by applying the power circuit 1 according to the first embodiment thereto.

Moreover, any one of the first MISFET Q1 or the second MISFET Q2 may be composed of SiC Trench MISFET (SiC TMISFET). In SiC TMISFET, since it is difficult to set the ratio of $C_{gs}$:$C_{gd}$ larger, the capacity ratio $C_{gd}/C_{gs}$ becomes approximately ½ to ¹⁄₂₀ in regions in which the drain voltage is not more than 100V, for example. Although a feedback capacitance $C_{rss}$ is not further easily decreased since the SiC TMISFET does not include JFET in the current path fundamentally, the parasitic oscillation can be reduced and high speed switching performance can be secured by applying the power circuit 1 according to the first embodiment thereto.

According to the power module 2 including the power circuit 1 according to the first embodiment therein, there can be composed a module into which the control circuit is also incorporated. Accordingly, a variation in the distance between the control circuit and the MISFET can be reduced, and therefore the effect of the parasitic inductance can be controlled.

(Configuration Example of Semiconductor Device)

—SiC DIMISFET—

Figure 2:
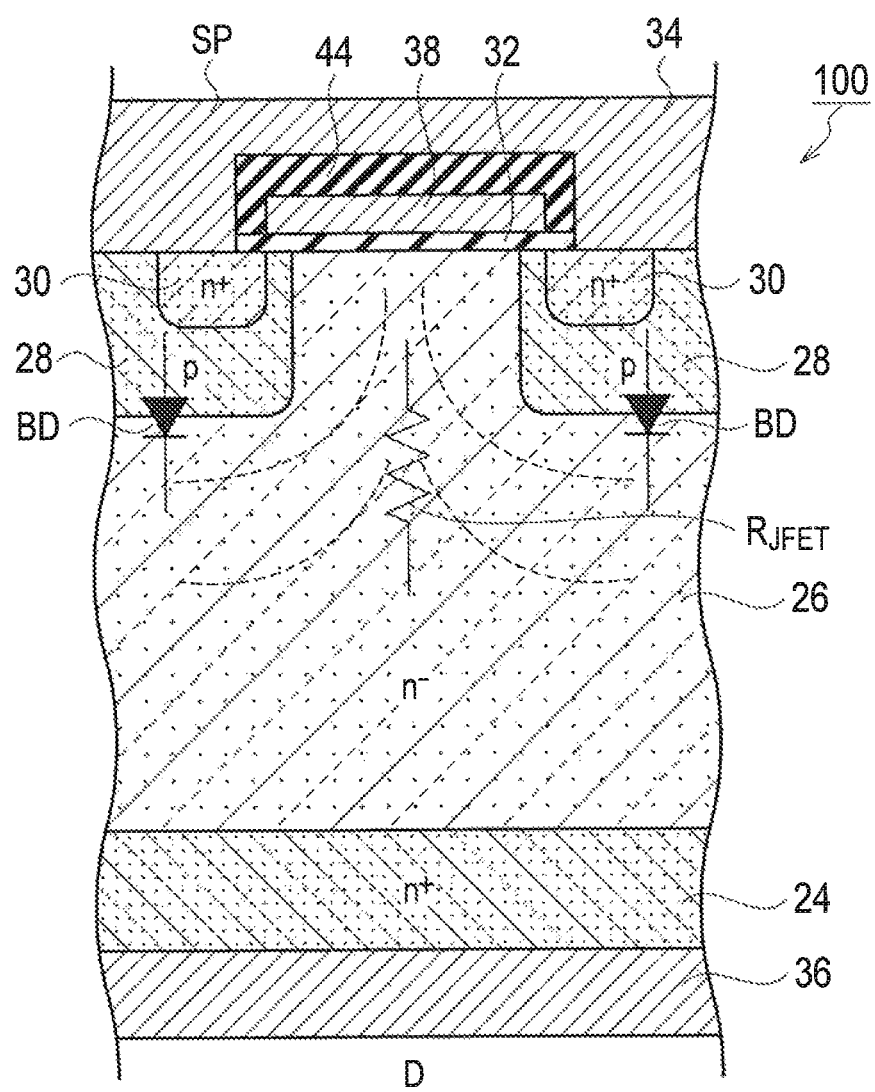
FIG. 2 is a schematic cross-sectional structure diagram of SiC DIMISFET, in an example of a semiconductor device applicable to the power circuit according to the first embodiment.

FIG. 2 shows a schematic cross-sectional structure of SiC Double Implanted MISFET (SiC DIMISFET), in an example of the semiconductor device 100 applicable to the power circuit 1 according to the first embodiment.

As shown in FIG. 2, the SiC DIMISFET applicable to the power circuit 1 according to the first embodiment includes: a semiconductor substrate 26 composed of an n⁻ type high resistivity layer; a p body region 28 formed on a front surface side of the semiconductor substrate 26; an n⁺ source region 30 formed on a front side surface of the p body region 28; a gate insulating film 32 disposed on a front side surface of the semiconductor substrate 26 between the p body regions 28; agate electrode 38 disposed on the gate insulating film 32; a source electrode 34 connected to the source region 30 and the p body region 28; an n⁻ drain region 24 disposed on a back side surface opposite to the surface of the semiconductor substrate 26; and a drain electrode 36 connected to the n⁺ type drain area 24.

In the semiconductor device 100 shown in FIG. 2, the p body region 28 and the n⁺ source region 30 formed on the front side surface of the p body region 28 are formed with double ion implantation (DI), and the source pad electrode SP is connected to the source region 30 and the source electrode 34 connected to the p body region 28. A gate pad electrode GP (not shown) is connected to the gate electrode 38 disposed on the gate insulating film 32. Moreover, as shown in FIG. 2, the source pad electrode SP and the gate pad electrode GP (not shown) are disposed on an interlayer insulating film 44 for passivation configured to cover the front side surface of the semiconductor device 100.

As shown in FIG. 2, in the SiC DIMISFET, since a depletion layer as shown with the dashed lines is formed in the semiconductor substrate 26 composed of a n⁻ type high resistivity layer inserted into the p body regions 28, channel resistance $R_{JFET}$ accompanying the junction type FET (JFET) effect is formed. Moreover, as shown in FIG. 2, body diodes BD are respectively formed between the p body regions 28 and the semiconductor substrates 26.

—SiC TMISFET—

Figure 3:
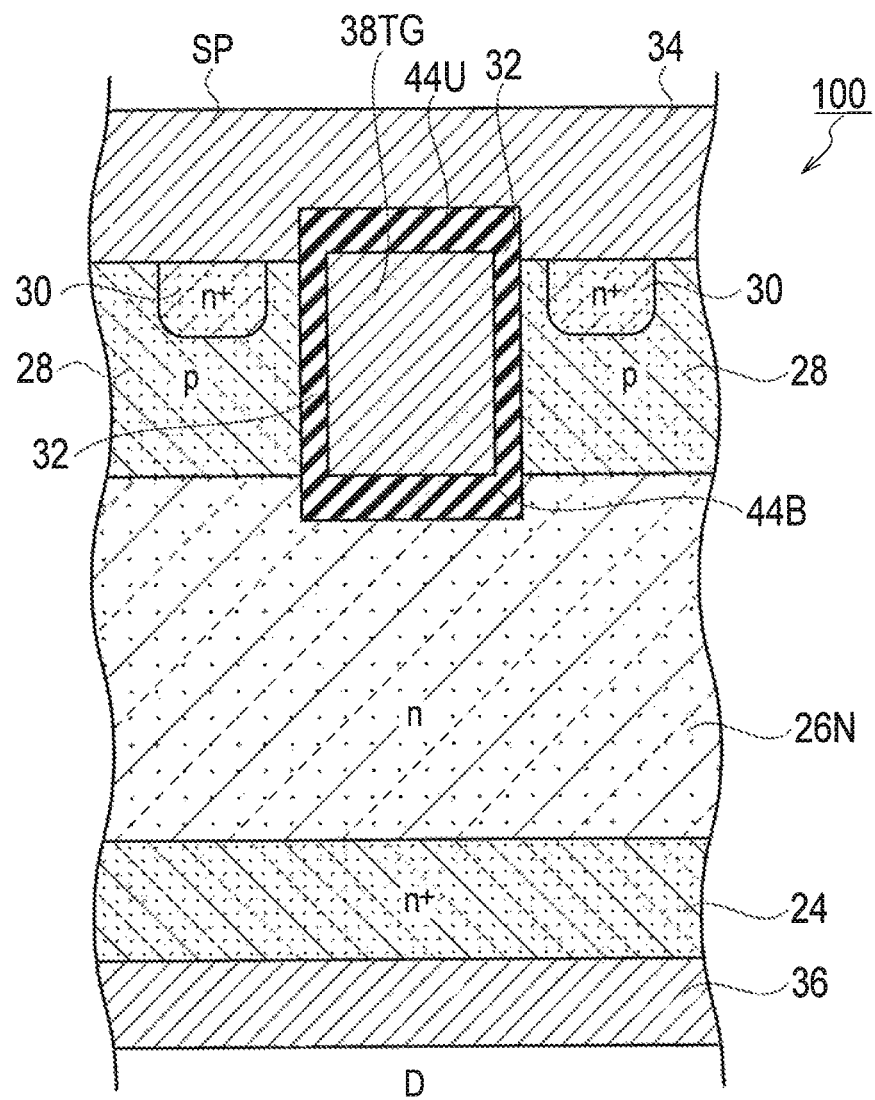
FIG. 3 is a schematic cross-sectional structure diagram of SiC TMISFET, in an example of the semiconductor device applicable to the power circuit according to the first embodiment.

FIG. 3 shows a schematic cross-sectional structure of the SiC TMISFET, in an example of the semiconductor device 100 applicable to the power circuit 1 according to the first embodiment.

As shown in FIG. 3, the SiC TMISFET applicable to the power circuit 1 according to the first embodiment includes: a semiconductor substrate 26N composed of an n layer; a p body region 28 formed on a front surface side of the semiconductor substrate 26N; an n⁺ source region 30 formed on a front side surface of the p body region 28; a trench gate electrode 38TG passing through the p body region 28, the trench gate electrode 38TG formed in the trench formed up to the semiconductor substrate 26N via the gate insulating layer 32 and the interlayer insulating films 44U, 44B; a source electrode 34 connected to the source region 30 and the p body region 28; an n+ type drain area 24 disposed on a back side surface of the semiconductor substrate 26N opposite to the front side surface thereof; and a drain pad electrode 36 connected to the n⁺ drain region 24.

In the semiconductor device 100 shown in FIG. 3, a trench gate electrode 38TG passes through the p body region 28, and the trench gate electrode 38TG formed in the trench formed up to the semiconductor substrate 26N is formed via the gate insulating layer 32 and the interlayer insulating films 44U, 44B, and the source pad electrode SP is connected to the source region 30 and the source electrode 34 connected to the p body region 28. A gate pad electrode GP (not shown) is connected to the gate electrode 38 disposed on the gate insulating film 32. Moreover, as shown in FIG. 3, the source pad electrode SP and the gate pad electrode GP (not shown) are disposed on an interlayer insulating film 44U for passivation configured to cover the front side surface of the semiconductor device 100.

In the SiC TMISFET, channel resistance $R_{JFET}$ accompanying the junction type FET (JFET) effect as the SiC DIMISFET is not formed. Moreover, the body diode BD is formed between p body region 28 and the semiconductor substrate 26 and the n+ type drain region 24, in the same manner as that shown in FIG. 2.

Moreover, a GaN based FET etc. instead of SiC based MISFET are also applicable to the semiconductor chip 100 (Q1, Q4) applied to the power circuit 1 according to the first embodiment.

Any one of the SiC based power device or GaN based power device is applicable to the semiconductor device 100 (Q1, Q4) applicable to the power circuit 1 according to the first embodiment.

Furthermore, a semiconductor of which the bandgap energy is from 1.1 eV to 8 eV, for example, can be used for the semiconductor device 110 (Q1, Q4) applied to the power circuit 1 according to the first embodiment.

(Electric Field Distribution)

Figure 4A:
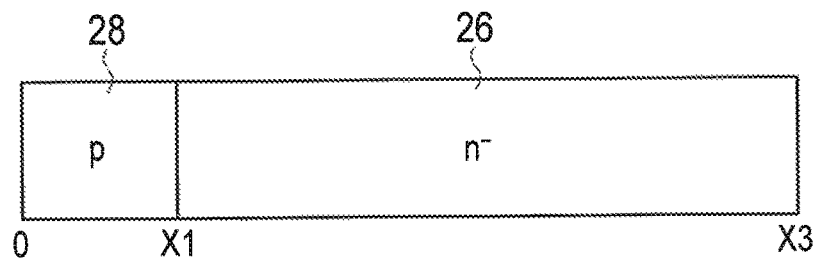
FIG. 4A is a schematic diagram of a p body region 28 and an n⁻ drift layer 26 of the Si MISFET, in a comparison between an Si device and an SiC device.
Figure 4B:
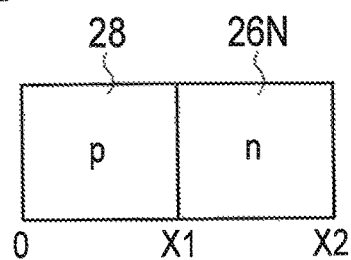
FIG. 4B is a schematic diagram of a p body region and an n drift layer of the SiC MISFET, in the comparison between the Si device and the SiC device.
Figure 4C:
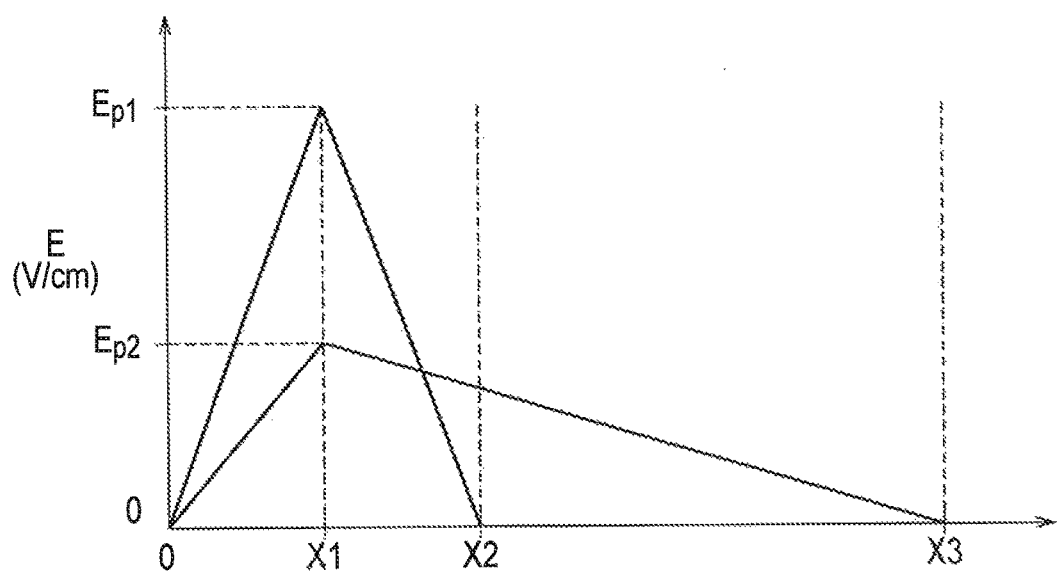
FIG. 4C is a comparative diagram between field intensity distributions respectively corresponding to FIGS. 4A and 4B, in the comparison between the Si device and the SiC device.

Since the SiC device has high dielectric breakdown electric fields (for example, being approximately 3 MV/cm, and approximately 3 times of Si), it can secure a breakdown voltage even if a layer thickness of the drift layer is formed thinner and the impurity concentration thereof is set higher than those of the Si. FIG. 4A is a schematic diagram of a p body region 28 and an n⁻ drift layer 26 of the Si MISFET, in a comparison between the Si device and the SiC device. FIG. 4B shows a schematic diagram of the p body region 28 and the drift layer 26N in the SiC MISFET. FIG. 4C shows a field intensity distribution corresponding to FIGS. 4A and 4B.

As shown in FIG. 4C, peak electric field intensity $E_{p2}$ of the Si MISFET can be obtained from a position of the distance X1 measured from a junction interface between the p body region 28 and the n⁻ drift layer 26 (i.e., front side surface of the p body region 28). Similarly, peak electric field intensity $E_{p1}$ of the SiC MISFET can be obtained from a position of the distance X1 measured from a junction interface between the p body region 28 and then drift layer 26N (i.e., front side surface of the p body region 28). Due to a difference between the dielectric breakdown electric fields, the peak electric field intensity $E_{p1}$ of the SiC MISFET can be set up higher than the peak electric field intensity $E_{p2}$ of the Si MISFET.

An expansion width of the depletion layer in the Si MISFET is a range of the distance X1-X3 measured from the front side surface of the p body region 28. On the other hand, an expansion width of the depletion layer in the SiC MISFET is a range of the distance X1-X2 measured from the front side surface of the p body region 28. Accordingly, the required layer thickness of the n⁻ drift layer is small, a resistance value of the n⁻ drift layer can be reduced due to a merit of both sides of impurity concentration and the layer thickness, the on resistance $R_{on}$ can be made low, and thereby the chip area can be reduced (the chip size can be reduced). Since the breakdown voltage which may equal to that of the Si IGBT can be realized as in the MISFET structure which is a unipolar device, high breakdown voltages and high speed switching can be realized, and thereby reduction of switching power loss can be expected.

On the other hand, there is a demerit of being hard to reduce the output capacitance and feedback capacitance since the high concentration and thin-layer (X2<X3) of the drift layers 26, 26N limit the expansion width of depletion layer.

Furthermore, the demerit in particular appears notably in the SiC TMISFET having no Junction FET (JFET) structure in the current path fundamentally, and therefore the reduction of on resistance $R_{on}$ and the ease of the erroneous turning-on are traded off with each other, thereby inhibiting the high-speed response performance of the SiC based MISFET.

According to the power circuit 1 according to the first embodiment, the phenomenon of the oscillation by which at least one of the transistors repeats ON and OFF which cannot be controlled triggered by the switching operation except intended operation can be prevented, in the circuit where at least one SiC based MISFET is electrically connected thereto.

According to the first embodiment, in particular in the circuit where at least one SiC based MISFET is electrically connected thereto, there can be provided the power circuit capable of reducing the parasitic oscillation and further capable of realizing the high speed switching performance; and the power module in which such a power circuit is mounted.

(Gate Erroneous Turning-on and Drain Surge Voltage)

Figure 5A:
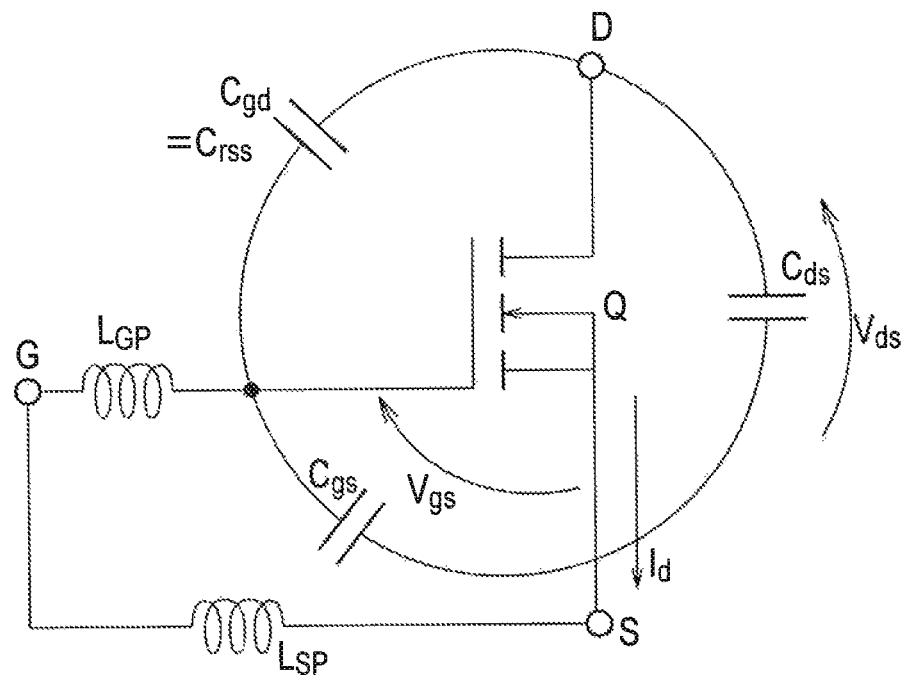
FIG. 5A is an explanatory diagram of a parasitic effect of the semiconductor device applicable to the power circuit according to the first embodiment.
Figure 5B:
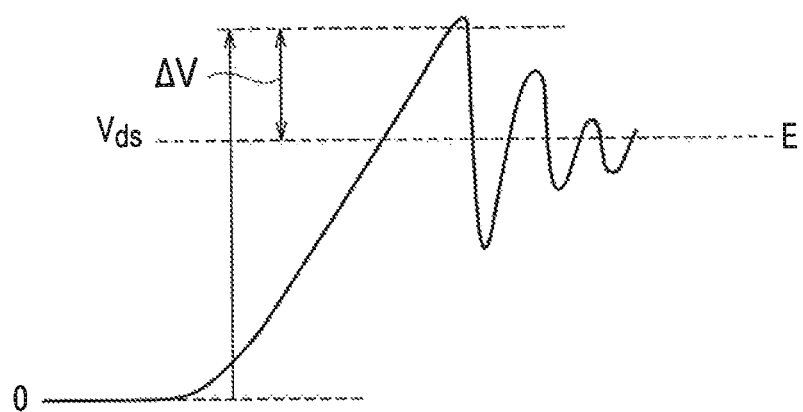
FIG. 5B is an explanatory diagram of an oscillatory waveform of a voltage $V_{ds}$ between the drain and the source of the semiconductor device applicable to the power circuit according to the first embodiment.

FIG. 5A shows an explanatory diagram of a parasitic effect in the semiconductor device Q applicable to the power circuit 1 according to the first embodiment, and FIG. 5B shows an explanatory diagram of an oscillatory waveform of the voltage $V_{ds}$ between the drain and the source.

In FIG. 5A, reference numeral $C_{gs}$ denotes the capacitance between gate and source, $C_{ds}$ denotes the capacitance between the drain and the source, $C_{gd}$ denotes the capacitance between the gate and the drain, and $I_d$ denotes the drain current. The capacitance between the gate and the drain $C_{gd}$ is equal to the feedback capacitance $C_{rss}$ of the semiconductor device Q. Moreover, reference numerals $L_{GP}$, $L_{SP}$ denote parasitic inductances accompanying the gate terminal G and the source terminal S. As shown in FIG. 5A, in a short circuited state between the gate and the source, an inductance component which exists in the closed circuit between the gate and the source becomes $L_{GP}+L_{SP}$.

Since the parasitic gate resistance and the inductance component $L_{GP}+L_{SP}$ of the semiconductor device Q exist in the short circuit wiring if the drain voltage $V_{ds}$ changes, in the short circuited state between the gate and the source, if a divide value of voltage occurs momentarily in the capacitance $C_{gs}$ between the gate and the source in a transient response and then it exceeds the gate threshold voltage, an erroneous turning-on (misfiring (erroneous firing)) will occur.

The phenomenon in which the gate erroneous turning-on (misfiring (erroneous firing)) occurs resulting from the drain voltage change $dV_{ds}/dt$ occurs easily when the switching element having the small ratio of $C_{gs}:C_{gd}$ is operated at high speed switching.

The drain surge voltage $\Delta V$ when the drain current is converged is expressed with $-L(dI_d/dt)$, and it becomes the oscillatory waveform as shown in FIG. 5B, and it not only can break down the MISFET but also becomes a noise source if the drain surge voltage $\Delta V$ is too large. In this case, reference numeral L denotes the resultant parasitic inductance of the main circuit part (the half bridge and the power source supply circuit (whole portion composed of the power supply and the capacitor)).

Figure 6A:
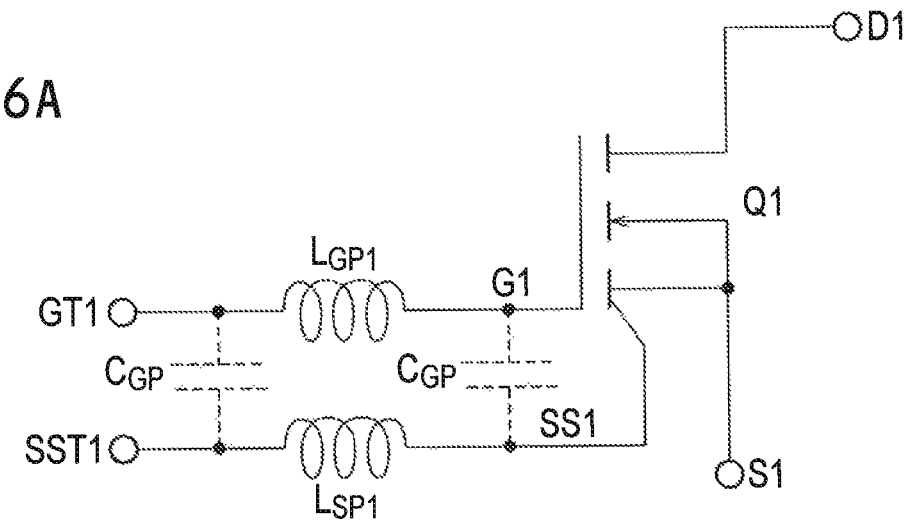
FIG. 6A is an explanatory diagram of a parasitic effect between the gate and the source of the SiC MISFET applicable to the power circuit according to the first embodiment.
Figure 6B:
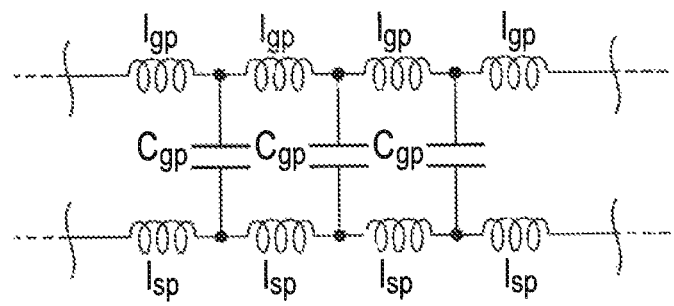
FIG. 6B is an explanatory diagram of a distributed transmission line circuit between the gate and the source of the SiC MISFET applicable to the power circuit according to the first embodiment.
Figure 6C:
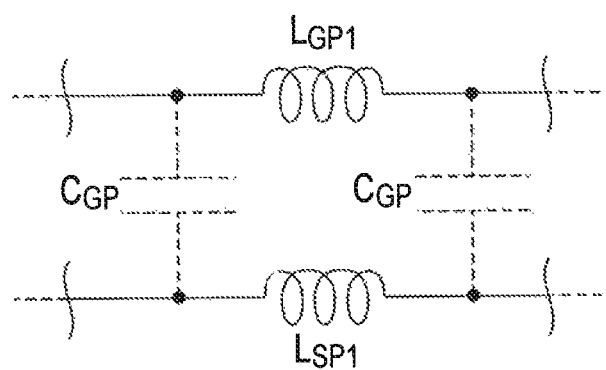
FIG. 6C is an equivalent circuit diagram of the distributed transmission line circuit between the gate and the source of the SiC MISFET applicable to the power circuit according to the first embodiment.

FIG. 6A shows an explanatory diagram of a parasitic effect between the gate and the source of the SiC MISFET Q1 applicable to the power circuit 1 according to the first embodiment, FIG. 6B shows an explanatory diagram of a distributed transmission line circuit between the gate and the source, and FIG. 6C shows an equivalent circuit diagram of the distributed transmission line circuit between the gate and the source.

Between the gate and the source of the SiC MISFET Q1 applicable to the power circuit 1 according to the first embodiment, a parasitic inductance $L_{GP1}$ between the gate terminal GT1 and the gate G1, and a parasitic inductance $L_{SP1}$ between the source sense terminal SST1 and the source sense SS1 exist as an inductance component, and Parasitic capacitances $C_{GP}$, $C_{GP}$ exist as a capacitance component. More particularly, as shown in FIG. 6B, the inductance components and capacitance components can be expressed with the distributed transmission line circuit composed of the distributed gate inductance $l_{gp}$, the distribution source inductance $l_{sp}$, and the distribution gate capacitance $C_{gp}$. More specifically, the distributed transmission line circuit shown in FIG. 6B corresponds to the equivalent circuit between the gate and the source shown in FIG. 6C. Such an equivalent circuit of the distributed transmission line circuit is disposed between the gate and the source of the SiC MISFET Q1, as shown in FIG. 6A.

(Oscillation Phenomenon)

Figure 7:
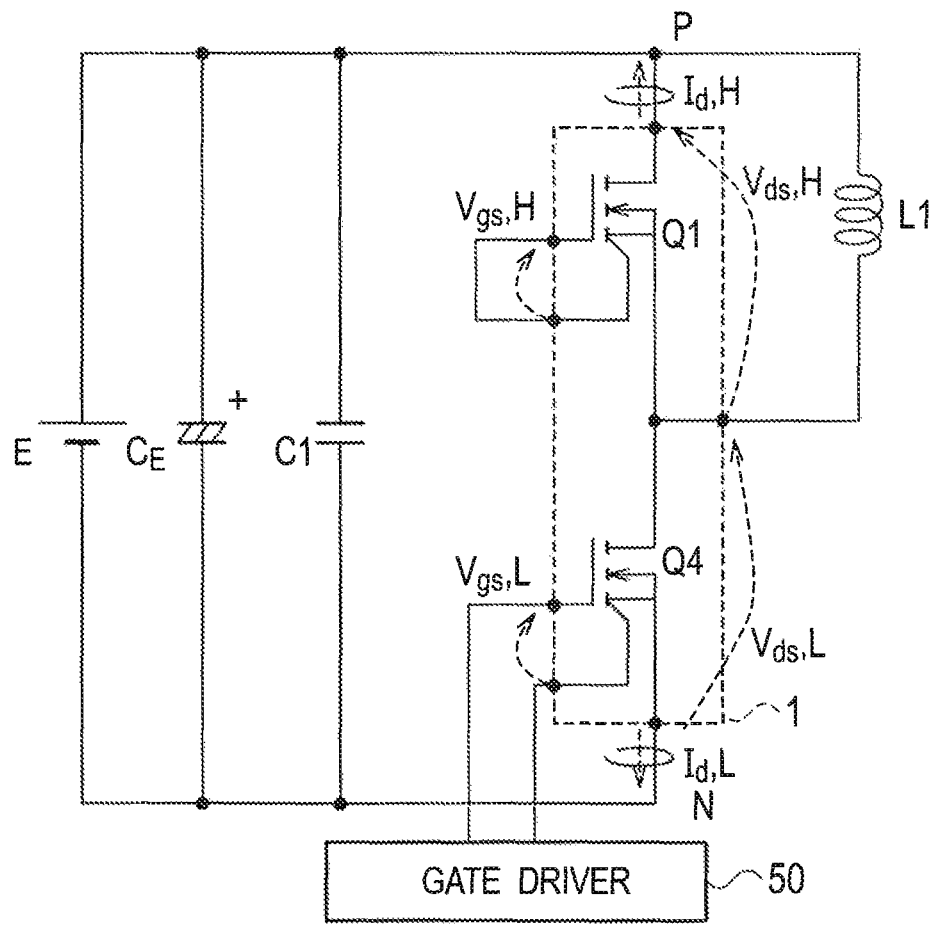
FIG. 7 is a circuit diagram for explaining an oscillation phenomenon in the power circuit according to the first embodiment.

FIG. 7 shows a circuit diagram for explaining an oscillation phenomenon which is occurred, in the power circuit 1 according to the first embodiment using the SiC MISFET.

In the configuration of FIG. 7, there is explained a problem of the oscillation which has occurred in an inductive load switching evaluation of the module with the built-in half-bridge using the SiC TMISFET.

As shown in FIG. 7, a power supply voltage E, an electrolytic capacitor $C_E$, and a lumped snubber capacitor C1 are connected between the positive-side power terminal P and the negative-side power terminal N, in the half bridge circuit configuration of the first MISFET Q1 and the second MISFET Q4. In the present embodiment, the load inductance L1 is connected between the drain and the source in the first MISFET Q1 at a reflux side (high side), between the gate and the source in the first MISFET Q1 is short-circuited by a signal terminal portion, and then the gate drive voltage is applied from the gate driver 50 to between the gate and the source in the second MISFET Q4 at a driving side (low side) in a state where the first MISFET Q1 is turned OFF.

In the present embodiment, the power supply voltage E is 100V, the load inductance L1 is 500 pH, the gate drive voltage is 18V/0V, and the externally connected gate resistance is 0Ω.

Figure 8:
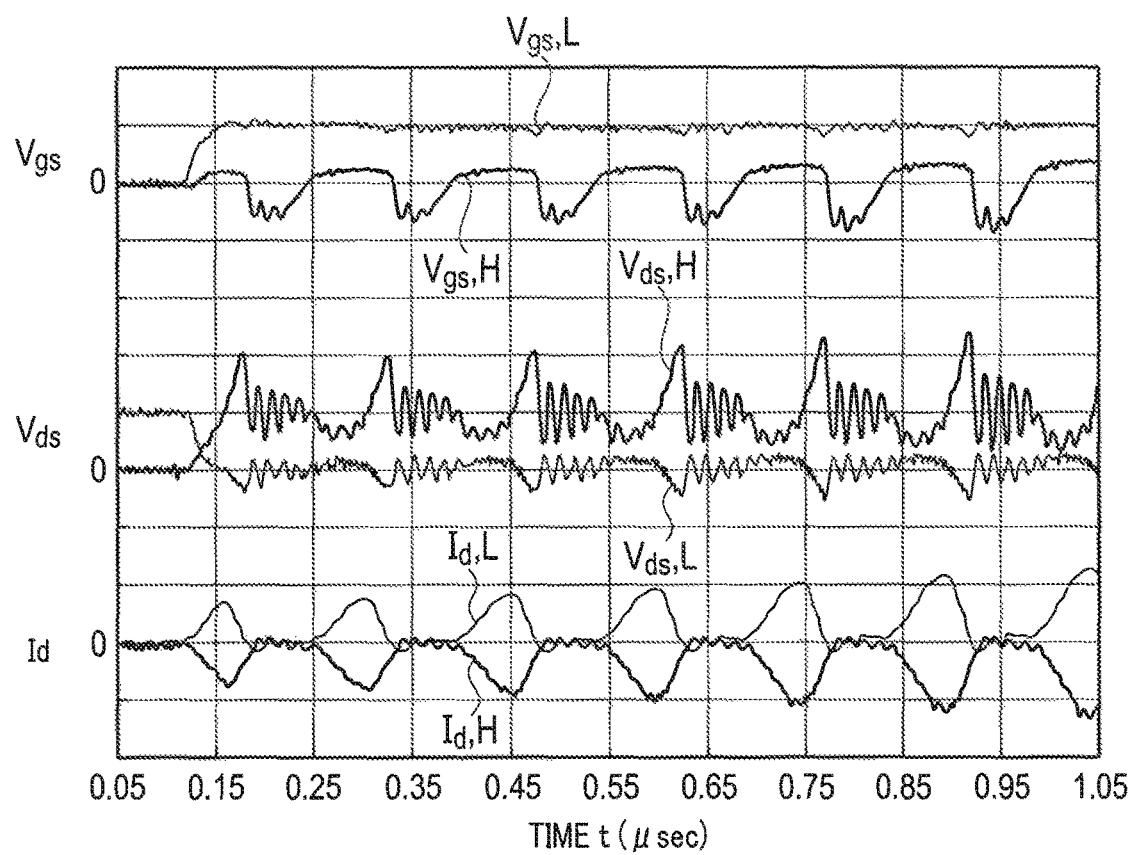
FIG. 8 shows a waveform example voltages ($V_{gs}$, H), ($V_{gs}$, L) between the gate and the source sense, a waveform example of voltages ($V_{ds}$, H), ($V_{ds}$, L) between the drain and the source, and a waveform example of drain currents ($I_d$, H), ($I_d$, L), after applying the gate drive voltage in the configuration shown in FIG. 7.

FIG. 8 shows a waveform example of voltages ($V_{gs}$, H), ($V_{gs}$, L) between the gate and the source sense, a waveform example of voltages ($V_{ds}$, H), ($V_{ds}$, L) between the drain and the source, and a waveform example of the drain currents ($I_d$, H) ($I_d$, L), after applying the gate drive voltage, on the above-mentioned conditions. In FIG. 8, the voltages ($V_{gs}$, H), ($V_{gs}$, L) between the gate and the source sense are 20V/div, voltages ($V_{ds}$, H), ($V_{ds}$, L) between the drain and the source are 100V/div, and drain currents ($I_d$, H), ($I_d$, L) are 50 A/div.

In the present embodiment, $V_{gs}$, H denotes a voltage between the gate and the source sense in the first MISFET Q1 at a high side, and $V_{gs}$, L denotes a voltage between the gate and the source sense in the second MISFET Q4 at a low side. Moreover, $V_{ds}$, H denotes a voltage between the drain and the source in the first MISFET Q1 at the high side, and $V_{ds}$, L denotes a voltage between the drain and the source in the second MISFET Q4 at the low side. Moreover, $I_d$, H denotes a drain current in the first MISFET Q1 at the high side (direction from the source to the drain), and $I_d$, L denotes a drain current in the second MISFET Q4 at the low side (direction from the drain to the source).

As shown in FIG. 8, a phenomenon (oscillation) in which the gate in the first MISFET Q1 at the high side which should continue OFF repeats ON and OFF not be intended has occurred at the time when the second MISFET Q4 at the low side is ON. Although such a phenomenon indicates different waveforms in accordance with the parasitic inductances and the parasitic capacitances of each part of the inside of circuit, it is intended for the whole phenomenon which has occurred due to the same cause, regardless of a shape of each waveform. Moreover, a surge voltage equal to or greater than twice to four times of the power supply voltage E=100V is applied to the voltage ($V_{ds}$, H) between the drain and the source in the first MISFET Q1 at the high side, and it will easily lead to a device breakdown if the power supply voltage E is higher.

Moreover, since $I_d$, H denotes a drain current in the first MISFET Q1 at the high side (direction from the source to the drain), and $I_d$, L denotes a drain current in the second MISFET Q4 at the low side (direction from the drain to the source), the short-circuit current between high-side and low-side arms between the first MISFET Q1 at the high side and the second MISFET Q4 at the low side are observed, as shown in FIG. 8.

—Target Power Supply Circuit—

The power module in which the power circuit 1 according to the first embodiment is mounted is applicable to a module for a power supply circuits in which bridge structures, e.g. a half bridge circuit, a full bridge circuit, or a three-phase bridge circuit, is built. A two-phase inverter can be composed for the full bridge circuit, a three-phase AC inverter can be composed for the three-phase bridge circuit, and the same configuration is realized also by using a plurality of the half bridge circuits.

Figure 9:
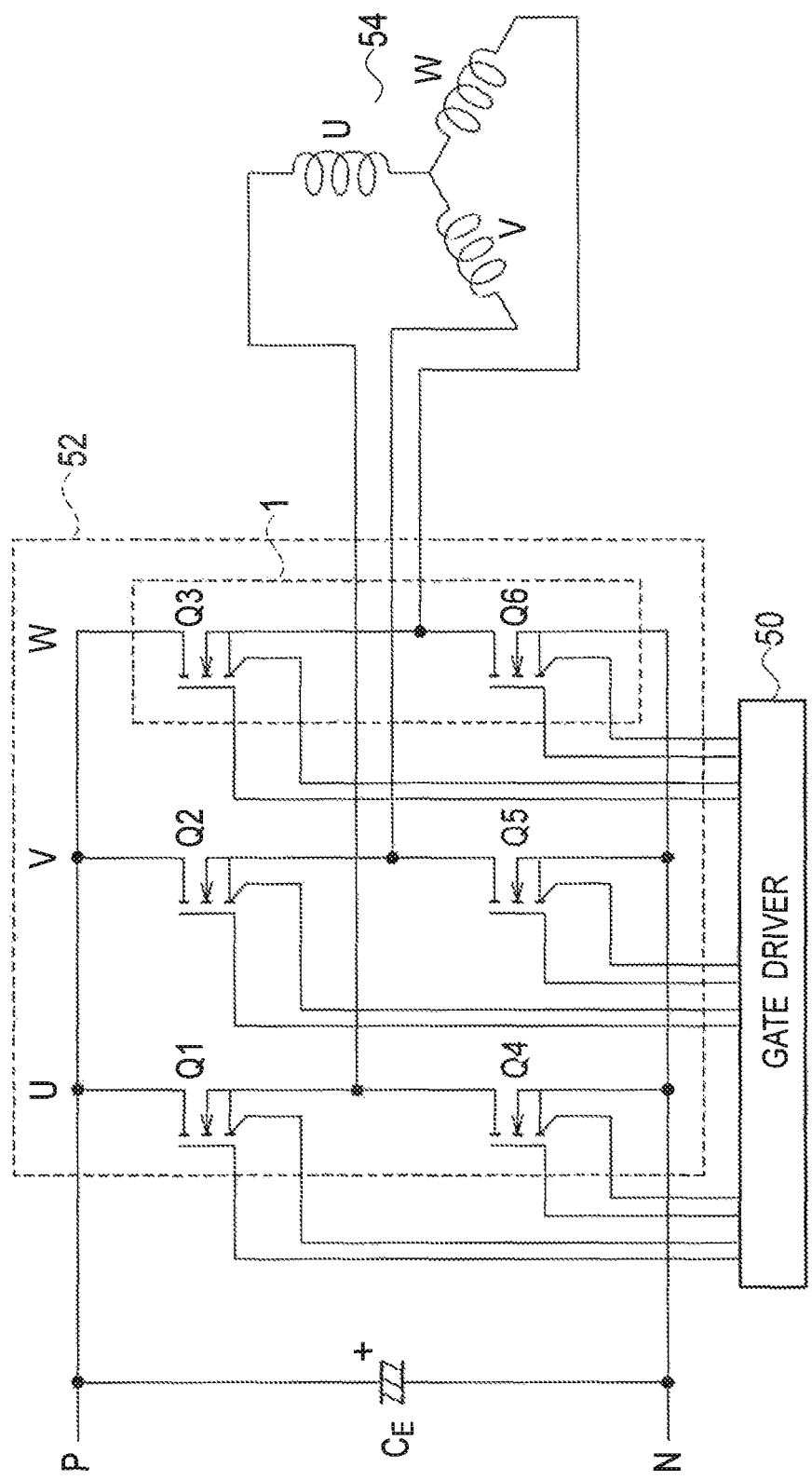
FIG. 9 is a schematic circuit configuration diagram of a three-phase alternating current (AC) inverter for driving three-phase motor to which the power circuit according to the first embodiment can be applied.

FIG. 9 shows a schematic circuit configuration of a three-phase AC inverter to which the power circuit 1 according to the first embodiment using the SiC MISFET can be applied.

As shown in FIG. 9, the three-phase AC inverter includes a gate driver 50, a power module unit 52 connected to the gate driver 50, and a three-phase AC motor 54. U-phase, V-phase, and W-phase inverters are respectively connected to the three-phase AC motor 54 so as to correspond to U phase, V phase, and W phase of the three-phase AC motor unit 54, in the power module unit 52. In the present embodiment, the gate driver 50 is connected to SiC MISFETs Q1, Q4, SiC MISFETs Q2, Q5 and Q3, Q6.

As for the power module unit 52, the SiC MISFETs (Q1, Q4), (Q2, Q5) and (Q3, Q6) having the inverter configuration are connected between the positive-side power terminal P and the negative-side power terminal N to which the power supply voltage E is connected. Furthermore, diodes (not shown) are connected inversely in parallel to one another between the source and the drain of the SiC-MOSFETs Q1 to Q6.

In the configuration of FIG. 9, there is explained a problem of an oscillation which has occurred in the power module for three-phase AC inverter using the SiC MISFET.

Also in the configuration shown in FIG. 9, the same problem of the oscillation as the phenomenon explained in FIGS. 7 and 8 can occur. More specifically, in the state where the switching elements of the first MISFET Q1 at the high side and the second MISFET Q4 at the low side in the half bridge is connected thereto also in the configuration shown in FIG. 9, the same problem of oscillation as the phenomenon explained in FIGS. 7 and 8 can occur when the switching element of one-side arm turns ON during dead time. In such an operational mode, there is the corresponding operational mode also during a continuous operation. The same problem is easy to occur as high speed switching is performed.

It may occur not only in the three phase inverter circuit but also in a converter using synchronous rectification.

In a half bridge circuit, a full bridge circuit, a three-phase bridge circuit, etc., when a switching element of one-sided arm turns ON from a dead time state when operating a converter or inverter, the phenomenon in which the gate erroneous turning-on (misfiring (erroneous firing)) occurs resulting from the drain voltage change $dV_{ds}/dt$ occurs easily when the switching element having the small ratio of $C_{gs}:C_{gd}$ (the capacitance $C_{gs}$ between the gate and the source: the capacitance $C_{gd}$ between the gate and the drain) is operated at high speed switching.

—Trigger for Oscillation and Energy Supply Source—

Figure 10A:
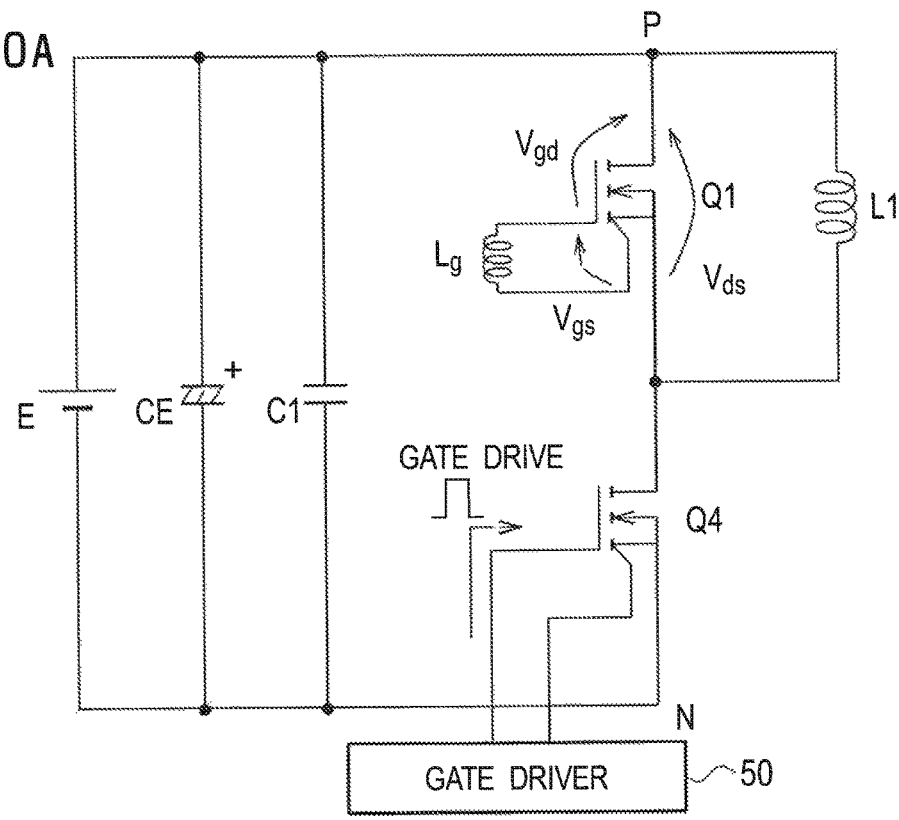
FIG. 10A is a circuit diagram for explaining a trigger for oscillation in the oscillation phenomenon, in the power circuit according to the first embodiment.
Figure 10B:
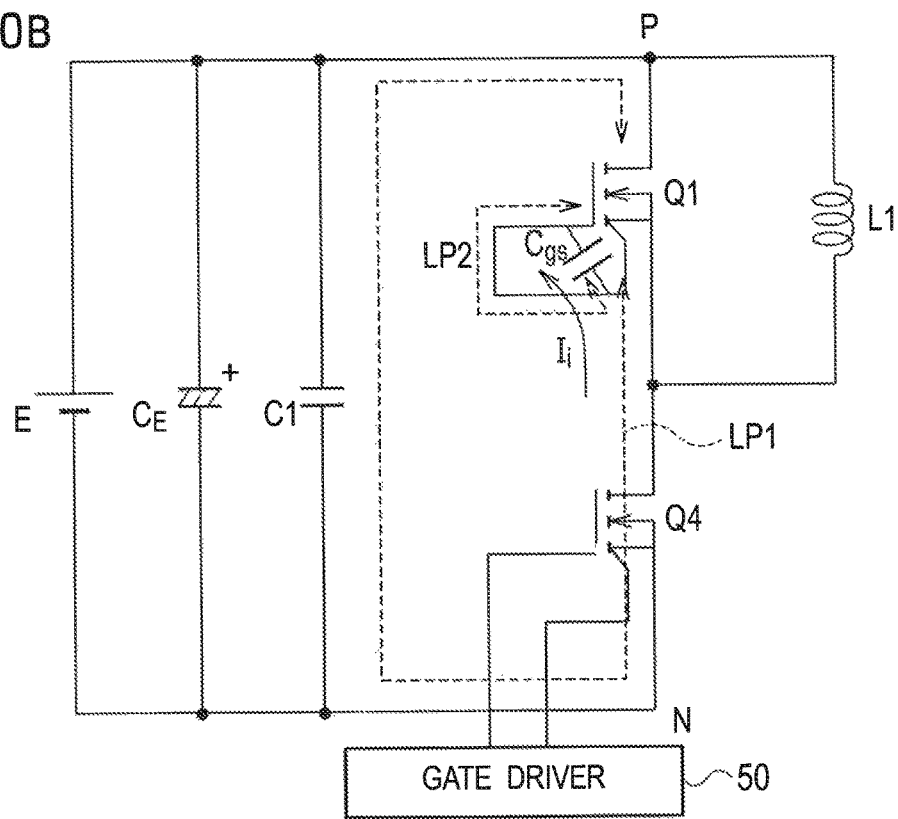
FIG. 10B is a circuit diagram for explaining an energy supply source during the oscillation, in the power circuit according to the first embodiment.

FIG. 10A shows a circuit diagram for explaining a trigger for oscillation in the oscillation phenomenon, in the power circuit according to the first embodiment using the SiC MISFET. FIG. 10B shows a circuit diagram for explaining an energy supply source during the oscillation.

As shown in FIG. 10A, in the power circuit 1 according to the first embodiment, a trigger for oscillation in the oscillation phenomenon occurs when a threshold voltage of the first MISFET Q1 is exceeded by an increment in the voltage ($V_{gs}$, H) between the gate and the source sense resulting from rapid voltage change ($dV_{ds}$, H)/dt between the drain and the source in the first MISFET Q1 at the high side accompanying an on-operation of the second MISFET Q4 at the low side, and thereby an electric current which short-circuits between the positive-side power terminal P and the negative-side power terminal N flows.

Since there are the parasitic gate resistance and the parasitic inductance $L_G$ although between the gate and the source in the first MISFET Q1 at the high side is short-circuited, the voltage change ($dV_{ds}$, H)/dt between the drain and the source is momentarily divided and applied also between the gate and the source, if a voltage is applied between the drain and the source in the first MISFET Q1. More specifically, the voltage ($V_{gs}$, H) between the gate and the source sense is also increased as affected by the rapid voltage change (increment) between the drain and the source in the first MISFET Q1.

In the power circuit 1 according to the first embodiment, as shown in FIG. 10B, an energy supply source during the oscillation has occurred, when a part of energy stored as drain voltage serge at the time of short-circuit current convergence resulting from the resonance of the voltage ($V_{gs}$, H) between the gate and the source sense flows into the capacitance $C_{gs}$ between the gate and the source through ringing of closed loop LP1. More specifically, an injection current $I_t$ flows into the capacitance $C_{gs}$ between the gate and the source, and the negative voltage is applied between the gate and the source in the first MISFET Q1, and thereby it leads to re-erroneous turning-on due to the voltage vibrating in closed loops LP1, LP2. The energy during the oscillation is supplied whenever the short circuit is converged. An example of the ringing waveform of the voltage ($V_{ds}$, H) between the drain and the source in the first MISFET Q1 is as shown in FIG. 8.

The characteristics of devices and modules which are easy to perform the erroneous turning-on are that the gate threshold voltage is low, that the parasitic gate resistance and the parasitic inductance of the short circuit closed loop LP2 between the gate and the source are large, and that a ratio between the capacitance $C_{gs}$ between the gate and the source and the capacitance $C_{gd}$ between the gate and the drain is small.

On the other hand, the characteristics of devices and modules which are easy to continue the oscillation are that the parasitic inductance of the short circuit closed loop LP2 between the gate and the source is large, and that the parasitic inductance of the closed loop LP1 which supplies the short-circuit current at the time of the erroneous turning-on is large.

The SiC based MISFET essentially has a small ratio between the capacitance $C_{gs}$ between the gate and the source and the capacitance $C_{gd}$ between the gate and the drain. Particularly, the SiC TMISFET does not have junction type FET (JFET) in the current path, the voltage between the gate and the source sense for flowing the same drain current becomes lower since the on resistance $R_{on}$ is low, and thereby a synthetic phenomenon between the erroneous turning-on and the oscillation energy supply appears easily and notably.

A suppression effect of the misoperation and the parasitic oscillation in the power circuit 1 according to the first embodiment is fundamentally assumed a point of after the erroneous turning-on of the drain voltage change cause has occurred.

In the power circuit 1 according to the first embodiment, the gated diode $D_{G1}$ is connected between the first gate G1 and the first source sense SS1 of the first MISFET Q1. The gated diode $D_{G1}$ is turned ON when the voltage is applied to the gate of the first MISFET Q1 in a negative direction, a low impedance current path is formed at the short circuit wiring between the gate G1 and the source sense SS1, and thereby it is made to discharge from the source sense SS1 towards the gate G1 in the path which does not include the signal terminals GT1, SST1 etc. having a high parasitic inductance. Consequently, electric charging in the negative direction to the capacitance $C_{gs}$ between the gate and the source and the vibration of the gate voltage are reduced, and thereby preventing from leading to the re-erroneous turning-on.

In the power circuit 1 according to the first embodiment, there is no time delay through IC when applying IC control since the gated diode $D_{G1}$ passively operates with respect to a movement of the gate voltage. Accordingly, response is available also to the phenomenon occurring for an extremely short time. Furthermore, since it is not necessary to increase new control terminals, the function can be obtained without also impairing a merit of miniaturization of the whole module.

The above-mentioned countermeasure leads to efficiently use the merit of the SiC power modules in which the unipolar switching element is mounted, as a method for reducing the gate oscillation without impairing the high speed switching performance.

(Explanation of Effect in Simulation)

Figure 11A:
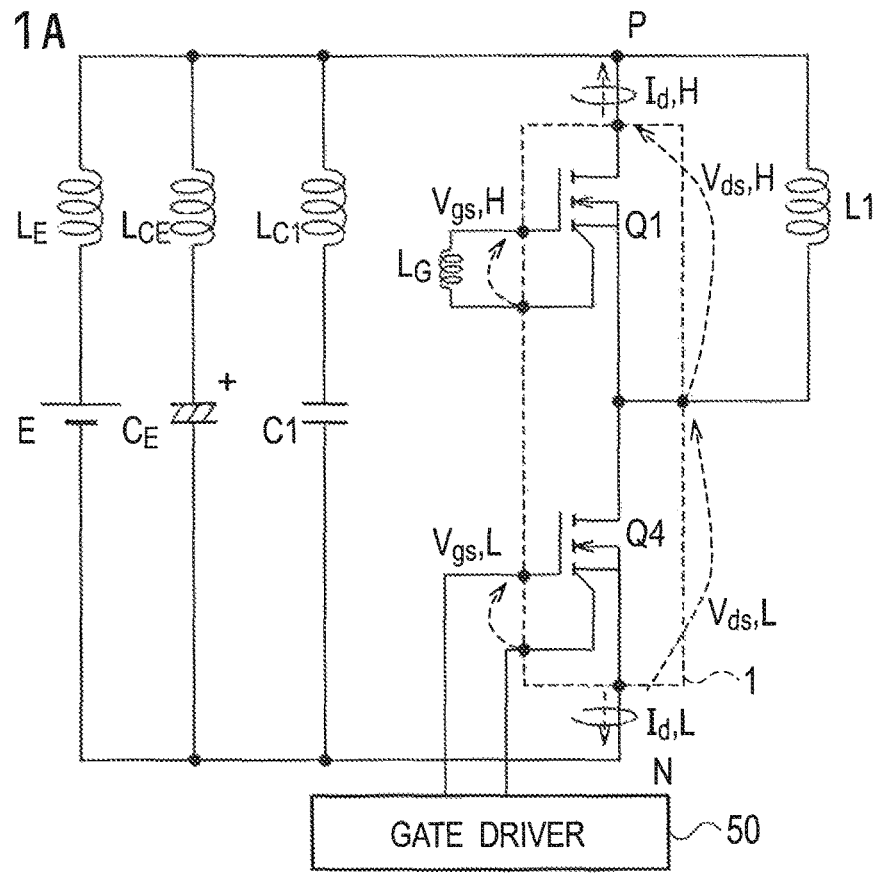
FIG. 11A is a circuit diagram for explaining an operation simulation when not connecting a gated diode as a control circuit thereto, in the power circuit according to the first embodiment.

FIG. 11A shows a circuit diagram for explaining an operation simulation when not connecting a gated diode as a control circuit thereto, in the power circuit 1 according to the first embodiment.

As shown in FIG. 11A, in the half bridge configuration between the first MISFET Q1 and the second MISFET Q4, a power supply voltage E, an electrolytic capacitor $C_E$, and a snubber capacitor C1 are connected between the positive-side power terminal P and the negative-side power terminal N. A parasitic inductance $L_E$ is connected to the power supply voltage E, a parasitic inductance $L_{CE}$ is connected to the electrolytic capacitor $C_E$, and a parasitic inductance $L_{C1}$ is connected to the snubber capacitor C1. In the present embodiment, the load inductance L1 is connected between the drain and the source in the first MISFET Q1 at the high side, between the gate and the source in the first MISFET Q1 is short-circuited by a signal terminal portion, and then the gate drive voltage is applied from the gate driver 50 to between the gate and the source in the second MISFET Q4 at the low side in a state where the first MISFET Q1 is turned OFF.

In the present embodiment, the power supply voltage E is 100V, the load inductance L1 is 500 pH, the gate drive voltage is 18V/0V, and the externally connected gate resistance is 0Ω.

Figure 11B:
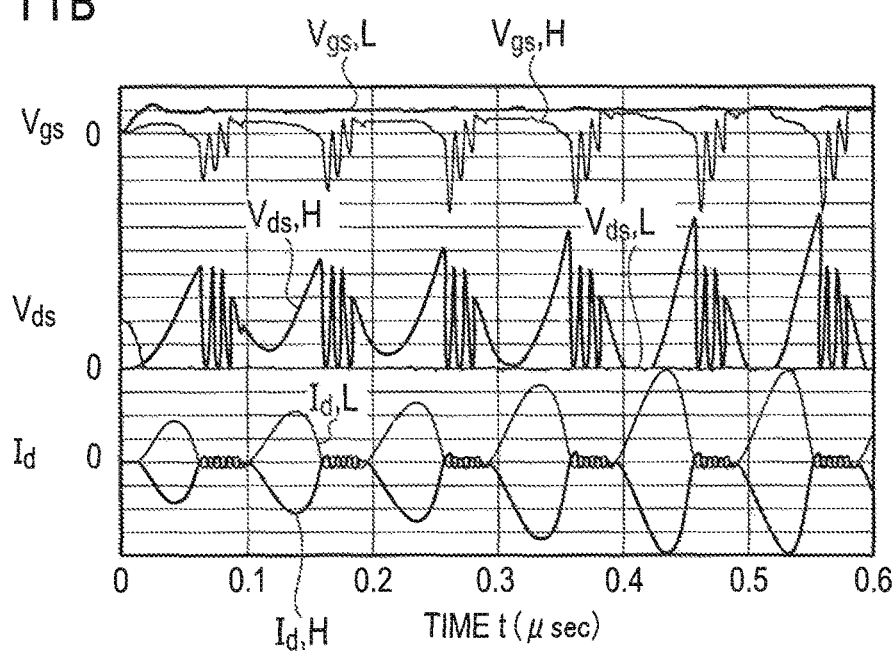
FIG. 11B shows a waveform example of voltages ($V_{gs}$, H) ($V_{gs}$, L) between the gate and the source sense, a waveform example of voltages ($V_{gs}$, H), ($V_{ds}$, L) between the drain and the source, and a waveform example of drain currents ($I_d$, H), ($I_d$, L), in FIG. 11A.

FIG. 11B shows a waveform example of voltages ($V_{gs}$, H) ($V_{gs}$, L) between the gate and the source sense, a waveform example of voltages ($V_{ds}$, H), ($V_{ds}$, L) between the drain and the source, and a waveform example of the drain currents ($I_d$, H), ($I_d$, L), after applying the gate drive voltage, on the above-mentioned conditions. In FIG. 11B, the voltages ($V_{gs}$, H), ($V_{gs}$, L) between the gate and the source sense are 20V/div, voltages ($V_{ds}$, H), ($V_{ds}$, L) between the drain and the source are 50V/div, and drain currents ($I_d$, H), ($I_d$, L) are 25 A/div.

As shown in FIG. 11B, a phenomenon in which the gate in the first MISFET Q1 at the high side which should continue OFF repeats ON and OFF not be intended has occurred at the time when the second MISFET Q4 at the low side is ON. Moreover, a voltage equal to or greater than twice of the power supply voltage E=100V is applied to the voltage ($V_{ds}$, H) between the drain and the source in the first MISFET Q1 at the high side, and it will easily lead to a device breakdown if the power supply voltage E is higher.

Moreover, since $I_d$, H denotes a drain current in the first MISFET Q1 at the high side (direction from the source to the drain), and $I_d$, L denotes a drain current in the second MISFET Q4 at the low side (direction from the drain to the source), the short-circuit current between high-side and low-side arms between the first MISFET Q1 at the high side and the second MISFET Q4 at the low side is flowing, as shown in FIG. 11B.

Figure 12:
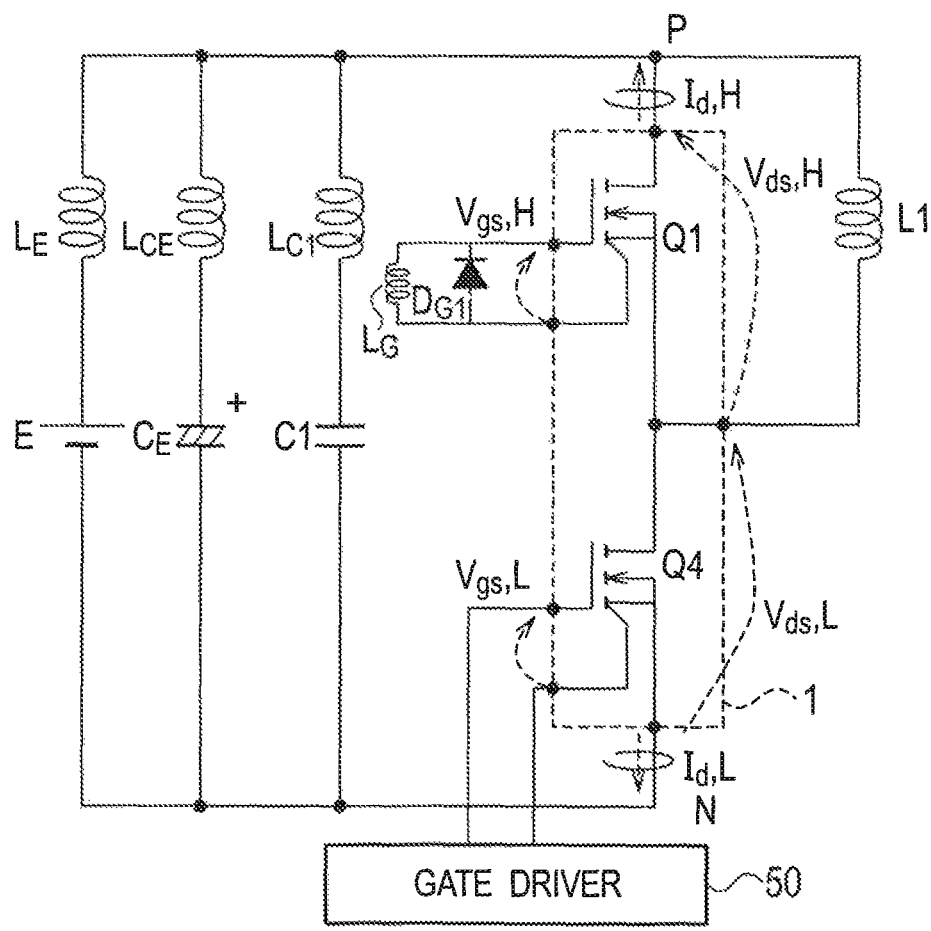
FIG. 12 is a circuit diagram for explaining an operation simulation when connecting the gated diode as a control circuit thereto, in the power circuit according to the first embodiment.

FIG. 12 shows a circuit diagram for explaining an operation simulation when connecting the gated diode $D_{G1}$ as a control circuit, in the power circuit according to the first embodiment using the SiC TMISFET. In FIG. 12, the gated diode $D_{G1}$ as a control circuit is connected between the gate and the source in the first MISFET Q1 at the high side. Other configurations are the same as those shown in FIG. 11A.

Figure 13A:
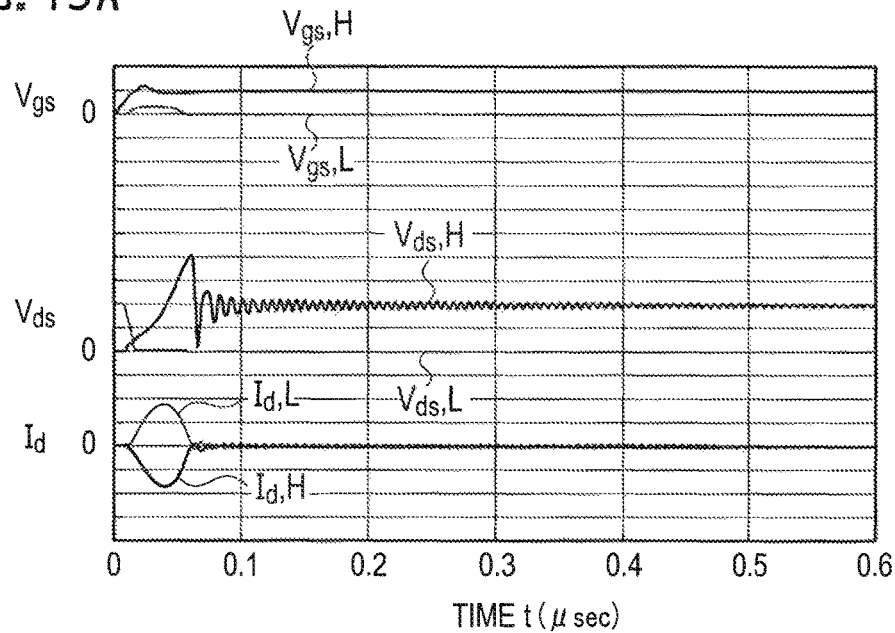
FIG. 13A shows a waveform example of voltages ($V_{gs}$, H), ($V_{gs}$, L) between the gate and the source sense, a waveform example of voltages ($V_{ds}$, H), ($V_{ds}$, L) between the drain and the source, and a waveform example of drain currents ($I_d$, H), ($I_d$, L), in FIG. 12.

FIG. 13A shows a waveform example of voltages ($V_{gs}$, H) ($V_{gs}$, L) between the gate and the source sense, a waveform example of voltages ($V_{ds}$, H), ($V_{ds}$, L) between the drain and the source, and a waveform example of the drain currents ($I_d$, H), ($I_d$, L), after applying the gate drive voltage, in FIG.

12. In FIG. 13A, the voltages ($V_{gs}$, H), ($V_{gs}$, L) between the gate and the source sense are 20V/div, voltages ($V_{ds}$, H), ($V_{ds}$, L) between the drain and the source are 50V/div, and drain currents ($I_d$, H), ($I_d$, L) are 25 A/div.

As shown in FIG. 13A, a phenomenon in which the gate in the first MISFET Q1 at the high side which should continue OFF repeats ON and OFF is suppressed at the time when the second MISFET Q4 at the low side is ON. Moreover, generation of the surge voltage in the voltage ($V_{d3}$, H) between the drain and the source in the first MISFET Q1 at the high side is also suppressed.

Moreover, the flowing of short-circuit current between high-side and low-side arms between the first MISFET Q1 at the high side and the second MISFET Q4 at the low side is also suppressed as shown in FIG. 13A.

FIG. 12B shows a waveform example (solid line) of a voltage ($V_{gs}$, H) between the gate and the source sense when connecting the gated diode $D_{G1}$ as a control circuit thereto (FIG. 12), and a waveform example (dashed line) of a voltage ($V_{gs}$, H) between the gate and the source sense when not connecting the gated diode $D_{G1}$ thereto (FIG. 11A).

In the waveform example (dashed line) of the voltage ($V_{gs}$, H) between the gate and the source sense when not connecting the gated diode $D_{G1}$ thereto (FIG. 11A), as shown in FIG. 12B, the phenomenon in which the gate in the first MISFET Q1 at the high side which should continue OFF repeats ON and OFF not be intended has occurred at the time when the second MISFET Q4 at the low side is ON. However, the phenomenon in which repeats ON and OFF the gate in the first MISFET Q1 at the high side which should continue OFF is suppressed, in the waveform example (solid line) of the voltage ($V_{gs}$, H) between the gate and the source sense when connecting the gated diode $D_{G1}$ thereto (FIG. 12). In particular, the waveform example (solid line) of the voltage ($V_{gs}$, H) between the gate and the source sense is clamped approximately −0.5V. The value reflects a value of the forward voltage of the gated diode $D_{G1}$.

Figure 13B:
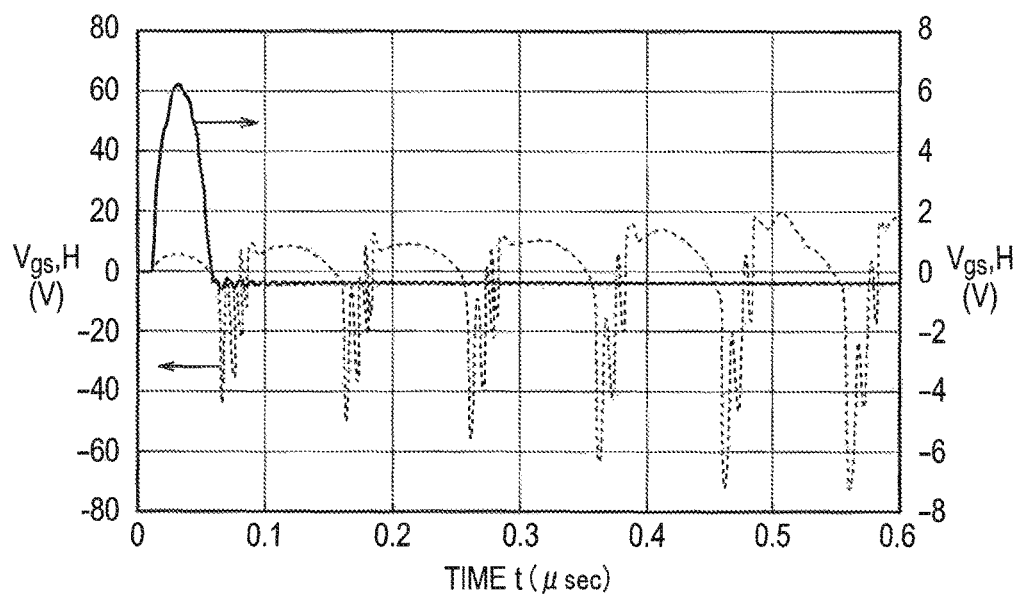
FIG. 13B shows a waveform example (solid line) of a voltage ($V_{gs}$, H) between the gate and the source sense when connecting the gated diode as a control circuit thereto, and a waveform example (dashed line) of a voltage ($V_{gs}$, H) between the gate and the source sense when not connecting the gated diode thereto.

Furthermore, FIG. 13A shows a circuit diagram for explaining an operation simulation when short-circuiting between the gate and the source in the first MISFET Q1 at the high side by the transistor $Q_{M1}$ for active mirror clamp, in the power circuit 1. FIG. 13B shows a waveform example of voltages ($V_{gs}$, H), ($V_{gs}$, L) between the gate and the source sense, a waveform example of voltages ($V_{ds}$, H), ($V_{ds}$, L) between the drain and the source, and a waveform example of drain currents ($I_d$, H), ($I_d$, L), in FIG. 13A. In FIG. 14B, the voltages ($V_{gs}$, H), ($V_{gs}$, L) between the gate and the source sense are 20V/div, voltages ($V_{cis}$, H) ($V_{ds}$, L) between the drain and the source are 50V/div, and drain currents ($I_d$, H), ($I_d$, L) are 25 A/div. Also when between the gate and the source in the first MISFET Q1 at the high side is short-circuited by the transistor $Q_{M1}$ for active mirror clamp, the phenomenon which repeats ON and OFF in the gate of the first MISFET Q1 at the high side which should continue OFF is suppressed. Since between the gate and the source sense has already short-circuited with the low inductance in particular at the time of sudden change of the voltage ($V_{ds}$, H) between the drain and the source in the first MISFET Q1 at the high side accompanying the on-operation of the second MISFET Q2 at the low side, an increment of the voltage ($V_{gs}$, H) between the gate and the source sense of in the first MISFET Q1 at the high side, and short circuit duration can be suppressed. Moreover, generation of a surge voltage in the voltage ($V_d$, H) between the drain and the source in the first MISFET Q1 at the high side, and a reverse direction voltage surge to the voltage between the gate and the source sense, and a short circuit between the arms in the first MISFET Q1 at the high side and the second MISFET Q4 at the low side can also be suppressed. An example of applying the transistor $Q_{M1}$ for active mirror clamp will be explained in detail in a power circuit according to the second embodiment shown in FIG. 20.

As mentioned above, according to the first embodiment, there can be provided the power circuit capable of reducing the erroneous turning-on and the induction from the erroneous turning-on to the parasitic oscillation at the time of operation of the power circuit composed of the MISFET, and further capable of realizing miniaturization and high speed switching performance; and a power module in which such a power circuit is mounted.

(Power Module)

Figure 16:
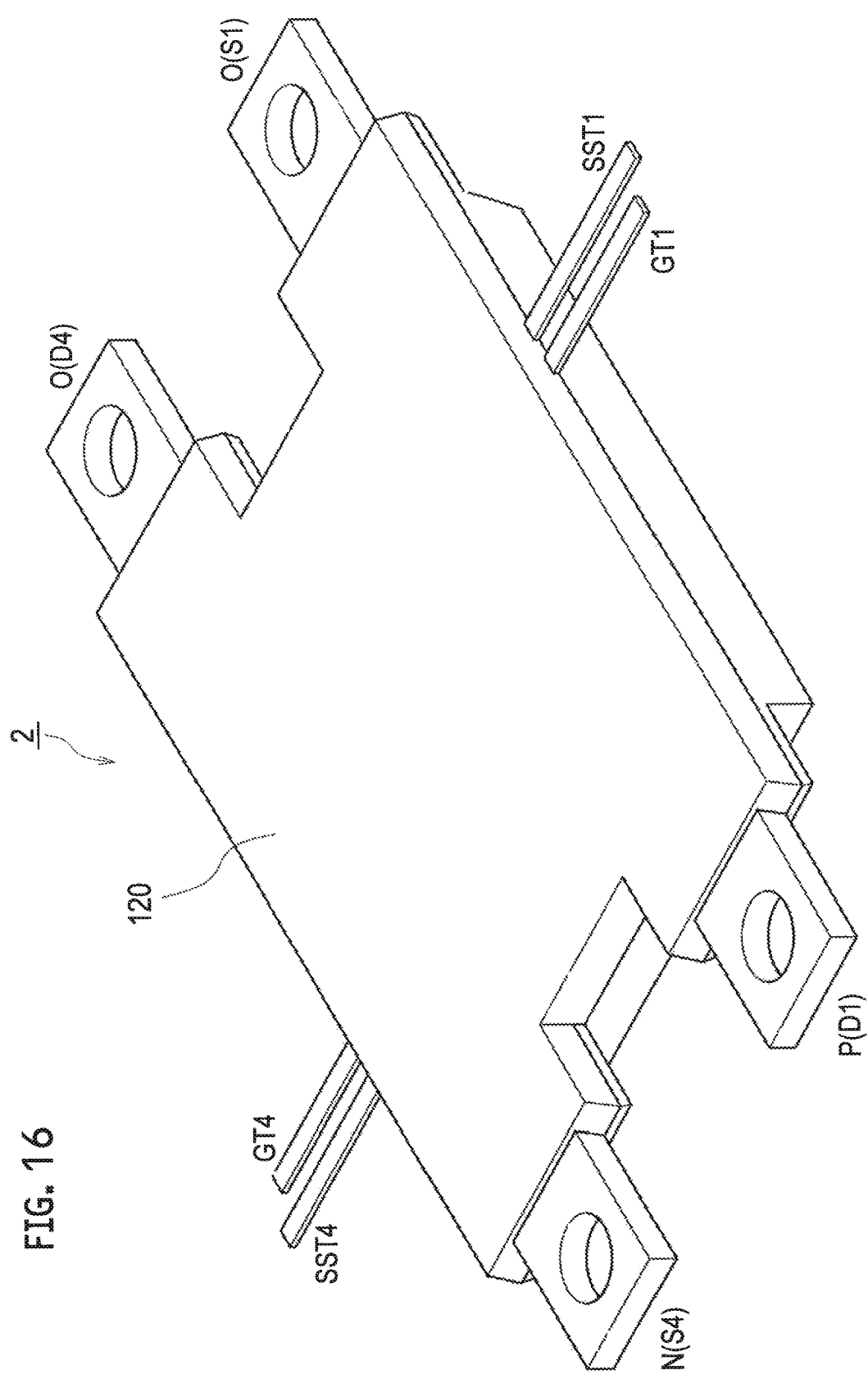
FIG. 16 is a schematic bird's-eye view configuration diagram after forming the resin layer in the module with a built-in half-bridge, in the power module according to the first embodiment.

FIG. 15 shows a schematic planar pattern configuration before forming a resin layer 120 in a module with the built-in half-bridge, in the power module 2 in which the power circuit 1 according to the first embodiment is mounted, and FIG. 16 shows a schematic bird's-eye view configuration after forming a resin layer 120 thereon. The power module according to the first embodiment 2 includes a configuration of a module with the built-in half-bridge. More specifically, two MOSFETs Q1, Q4 are built in one module.

The circuit configuration of the power module 2 shown in FIG. 15 corresponds to that of the power circuit 1 shown in FIG. 1. FIG. 15 shows an example of 4-chip of the MISFETs Q1 and 4-chip of the MISFETs Q4 respectively disposed in parallel.

As shown in FIGS. 15 and 16, the power module according to the first embodiment 2 includes: a positive-side power terminal P and a negative-side power terminal N disposed at a first side of the ceramic substrate 10 covered with the resin layer 120; a gate terminal GT1 and a source sense terminal SST1 disposed at a second side adjacent to the first side; an output terminal O disposed at a third side opposite to the first side; and a gate terminal GT4 and a source sense terminal SST4 disposed at a fourth side opposite to the second side. In the present embodiment, the gate terminal GT1 and the source sense terminal SST1 are connected to the signal wiring pattern GL1 for gate and the signal wiring pattern SL1 for source in the MISFET Q1; and the gate terminal GT4 and the source sense terminal SST4 are connected to the signal wiring pattern GL4 for gate and the signal wiring pattern SL4 for source in the MISFET Q4.

As shown in FIG. 15, wires GW1, GW4 for gate and wires SSW1, SSW4 for source sense are connected towards the signal wiring patterns GL1, GL4 for gate and the signal wiring patterns SL1, SL4 for source sense which are disposed on the signal substrates $14_1$, $14_4$ from the MISFETs Q1, Q4. Moreover, gate terminals GT1, GT4 and SST1, SST4 for external extraction are connected to the signal wiring patterns GL1, GL4 for gate and the signal wiring patterns SL1, SL4 for source sense by soldering etc.

As shown in FIG. 15, a gated diode $D_{G1}$ is connected by soldering etc. so that the signal wiring patterns may be straddled, on the signal wiring pattern GL1 for gate, and the signal wiring pattern SL1 for source sense. Similarly, a gated diode $D_{G4}$ is connected by soldering etc. so that the signal wiring patterns may be straddled, on the signal wiring pattern GL4 for gate and the signal wiring pattern SL4 for source sense. Accordingly, when the gated diodes $D_{G1}$, $D_{G4}$ operate, an electric current which flows towards the gates G1, G4 from the source senses SS1, SS4 passes along a low inductance path only inside the module which does not include the gate terminals GT1, GT4 and SST1, SST4 for external extraction. As shown in FIGS. 1 and 15, the gated diodes $D_{G1}$, $D_{G4}$ effectively acts by being connected on the wiring including no main circuit wiring. The signal substrates $14_1$, $14_4$ are connected by soldering etc. on the main substrate 10.

As shown in FIG. 15, the power module according to the first embodiment 2 may include a snubber capacitor $C_B$ electrically connected between the positive-side power terminal P and the negative-side power terminal N.

Figure 17:
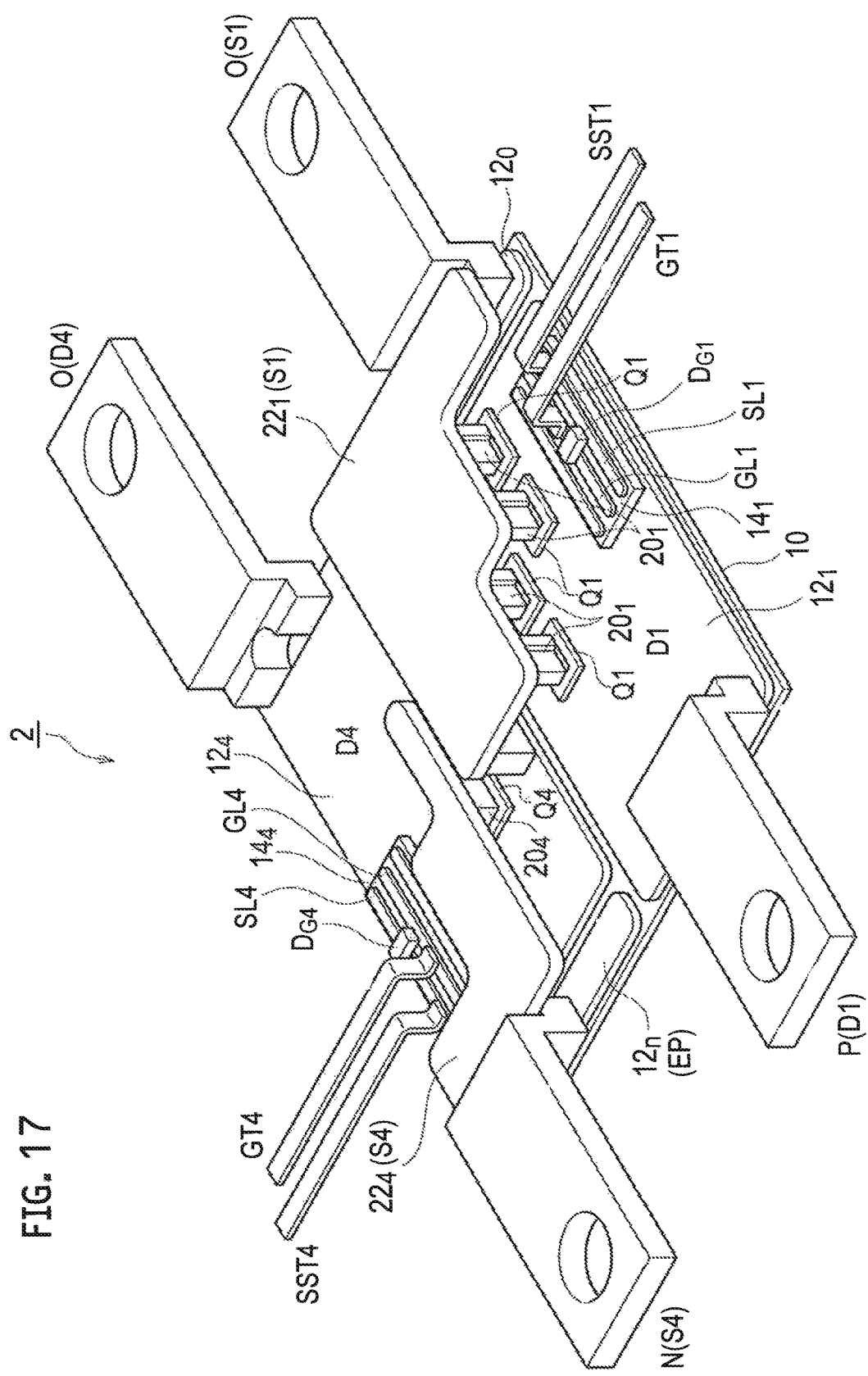
FIG. 17 is a schematic bird's-eye view configuration diagram before forming the resin layer and after forming an upper surface plate electrode in the module with the built-in half-bridge, in the power module according to the first embodiment.

Moreover, FIG. 17 shows a schematic bird's-eye view configuration after forming the upper surface plate electrodes $22_1$, $22_4$ and before forming the resin layer 120, in the power module according to the first embodiment 2. The sources S1, S4 of 4 chips of the MISFETs Q1, Q4 respectively disposed in parallel are commonly connected with the upper surface plate electrodes $22_1$, $22_4$. Note that the wires GW1, GW4 for gate and the wires SSW1, SSW4 for source sense are not shown in FIG. 17.

In the power module according to the first embodiment 2, a variation in the distance between the control circuit (gated diodes $D_{G1}$, $D_{G4}$) and the MISFETs Q1, Q4 can be reduced, and thereby the effect of the parasitic inductance can be controlled.

Although illustration is omitted in FIGS. 1 and 15-19, the diodes may be connected reversely in parallel between D1 and S1 and between D4 and S4 of the MISFETs Q1, Q4.

Although the sources S1, S4 of 4 chips of the MISFETs Q1, Q4 disposed in parallel are commonly connected with the upper surface plate electrodes $22_1$, $22_4$ in an example shown in FIGS. 15-19, the sources may be conducted to one another with the wire instead of the upper surface plate electrodes $22_1$, $22_4$.

The positive-side power terminal P and the negative-side power terminal N, and the gate terminals GT1, GT4 and SST1, SST4 for external extraction can be formed of Cu, for example.

The main substrate 10 and the signal substrates $14_1$, $14_4$ can be formed of a ceramic substrate. For example, the ceramic substrate 10 may be formed of $Al_2O_3$, AlN, SiN, AlSiC, or SiC of which at least the surface is insulation.

The main wiring conductors (electrode patterns) 12, $12_0$, $12_1$, $12_4$, $12_n$ can be formed of Cu, Al, etc., for example.

The electrode pillars $20_1$, $20_4$ and the upper surface plate electrodes $22_1$, $22_4$ portion for connecting the sources S1, S4 of the MISFETs Q1, Q4 and the upper surface plate electrodes $22_1$, $22_4$ may be formed of CuMo, Cu, etc., for example. If materials of the same size of which the values of Coefficient of Thermal Expansion (CTE) are equivalent to each other are compared, the generated stress of materials having a larger value of Young's modulus becomes larger than that of materials having a smaller value of Young's modulus. Accordingly, if materials of which the value of Young's modulus x CTE is smaller is selected, structural members having a smaller value of the generated stress can be obtained. CuMo has such an advantage. Moreover, although CuMo is inferior to Cu, the electric resistivity of CuMo is also relatively low. Moreover, a separation distance along the surface between the upper surface plate electrodes $22_1$, $22_4$ is called a creepage distance. A value of the creepage distance thereof is approximately 2 mm, for example.

The wires GW1, GW4 for gate and the wires SSW1, SSW4 for source sense can be formed of Al, AlCu, etc., for example.

SiC based power devices, e.g. SiC DIMISFET and SiC TMISFET, or GaN based power devices, e.g. GaN based High Electron Mobility Transistor (HEMT), are applicable as the MISFETs Q1, Q4. In some instances, power devices, e.g. Si based MISFETs and IGBT, are also applicable thereto.

As the gated diodes $D_{G1}$, $D_{G4}$, an Si based SBD or a Zener diode, or SBD or a Zener diode using, e.g. an SiC based or a GaN based wide gap semiconductors, are applicable.

Moreover, a ceramic capacitor etc. are applicable, as the snubber capacitor connected between the positive-side power terminal P and the negative-side power terminal N.

Moreover, transfer mold resins, thermosetting resins, etc. applicable to the SiC based semiconductor device can be used as the resin layer 120. Moreover, silicone based resins, e.g. silicone gel, may partially be applied thereto, or case type power modules may be adopted to be applied to the whole thereof.

Modified Example

Figure 18:
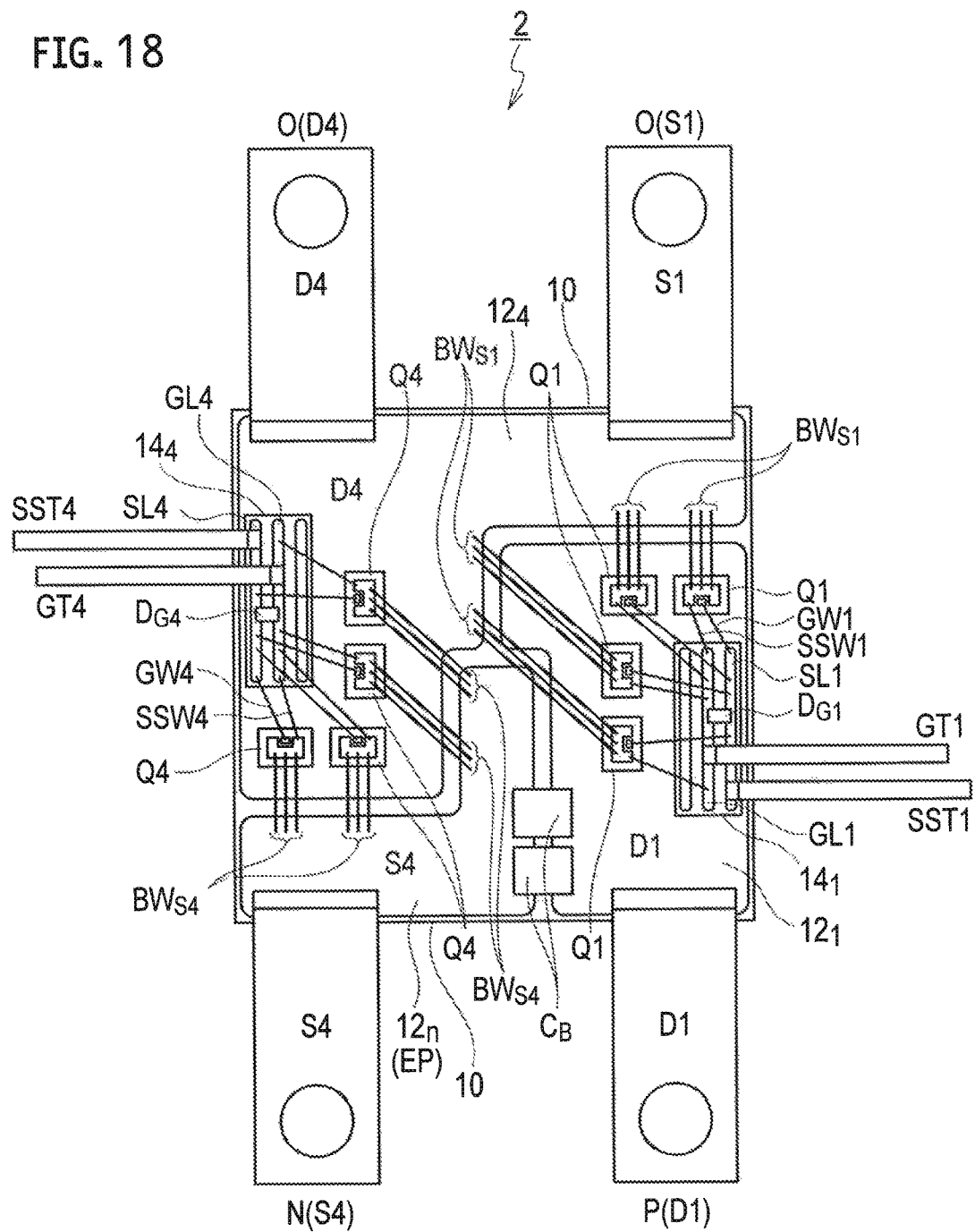
FIG. 18 is a schematic planar pattern configuration diagram before forming the resin layer in the module with the built-in half-bridge, in the power module according to a modified example 1 of the first embodiment.
Figure 19:
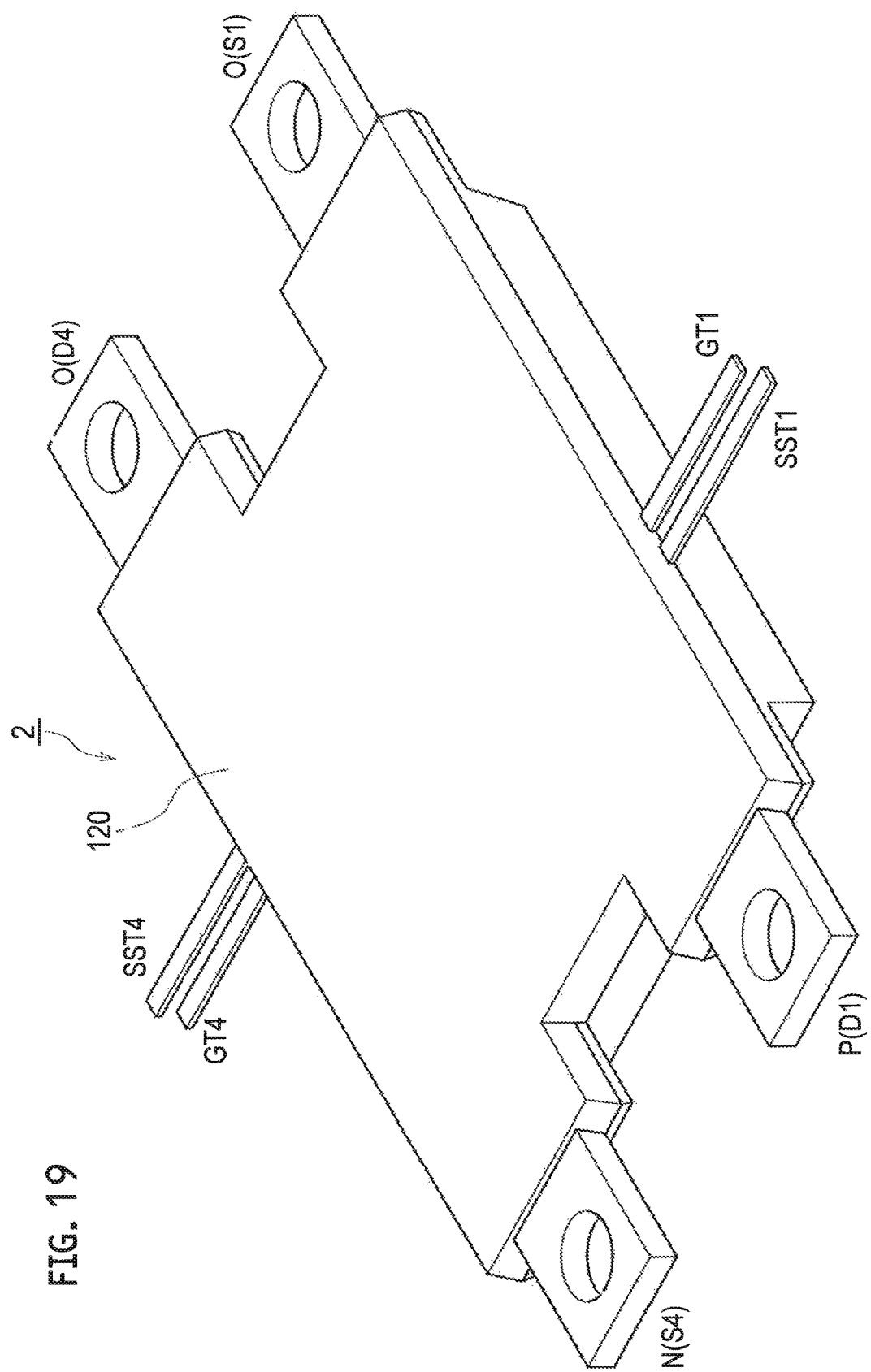
FIG. 19 is a schematic bird's-eye view configuration diagram of a module with a built-in half-bridge, in the power module according to a modified example 1 of the first embodiment.

In the power module 2 according to a modified example of the first embodiment, FIG. 18 shows a schematic planar pattern configuration before forming the resin layer 120, and FIG. 19 shows a schematic bird's-eye view configuration after forming the resin layer 120 thereon. In the power module 2 according to the modified example of the first embodiment, bonding wires. $BW_{S1}$, $BW_{S4}$ are used therefor instead of the upper surface plate electrodes $22_1$, $22_4$. More specifically, as shown in FIG. 18, between the source pad electrode SP1 of the MISFET Q1 and the electrode pattern $12_4$ is connected via the bonding wire $BW_{S1}$, and the source pad electrode SP4 of the MISFET Q4 and the electrode pattern $12_n$ (EP) are connected to each other via the bonding wire $BW_{S1}$. The bonding wires $BW_{S1}$, $BW_{S4}$ can be formed of Al, AlCu, etc., for example.

The distance between the signal substrates $14_1$, $14_4$ and the MISFETs Q1, Q4 is separated for approximately 2 mm, for example. This is because of forming the bonding wires $BW_{S1}$, $BW_4$ shorter.

Moreover, as shown in FIG. 18, the power module 2 according to the modified example of the first embodiment may include snubber capacitors $C_B$, $C_B$ connected between the positive-side power terminal P and the negative-side power terminal N. Since other configurations are the same as that of the first embodiment, the duplicated explanation of each part is omitted.

Second Embodiment (Power Circuit and Power Module)

Figure 20:
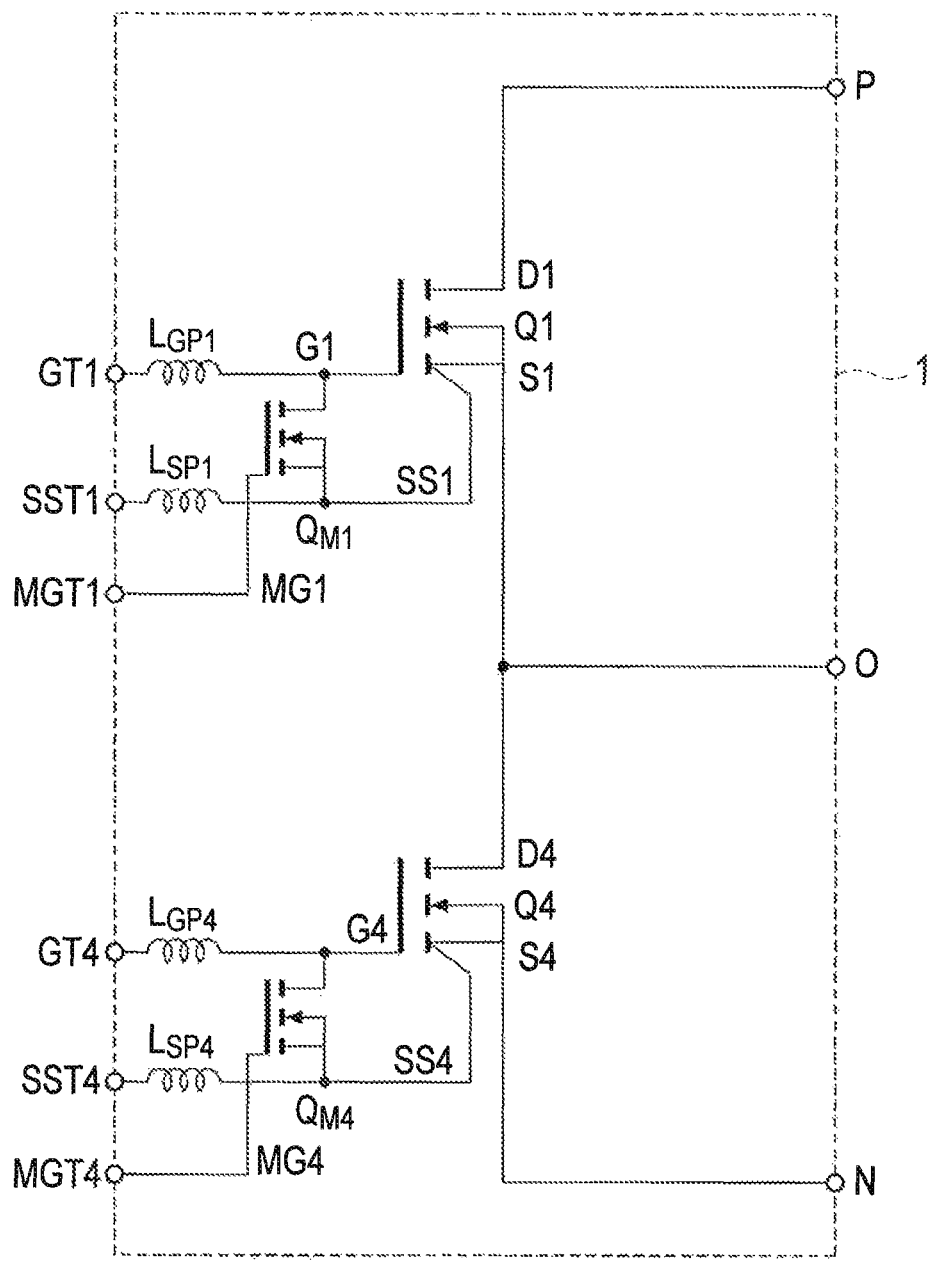
FIG. 20 is a schematic circuit configuration diagram of a half bridge circuit, in a power circuit according to a second embodiment.

FIG. 20 shows a schematic circuit configuration of a half bridge circuit, in a power circuit 1 according to a second embodiment. Note that the power circuit 1 according to the second embodiment is not limited to such a half bridge circuit, but can be applied also to a full bridge circuit or a three-phase bridge circuit.

Moreover, FIG. 15 also shows a schematic planar pattern configuration before forming a resin layer 120 in a module with the built-in half-bridge, in the power module 2 in which the power circuit 1 according to the second embodiment is mounted.

Moreover, the same configuration as a configuration example of the power module 2 according to the first embodiment and its modified example (FIGS. 15-19) is applicable to the power module 2 according to the second embodiment.

In the power circuit 1 according to the second embodiment and the power module 2 in which such a power circuit 1 is mounted, as shown in FIG. 20, transistors $Q_{M1}$, $Q_{M4}$ for active mirror clamp are applied instead of the gated diodes $D_{G1}$, $D_{G4}$ as in the first embodiment.

Figure 21A:
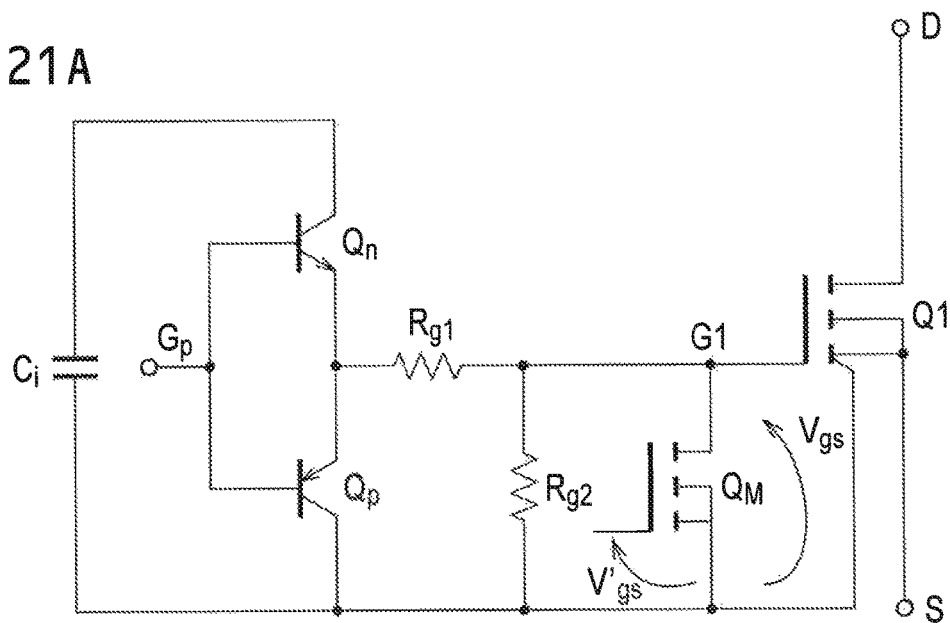
FIG. 21A is an operation circuit explanatory diagram of an active mirror clamp applied as a control circuit, in the power circuit according to the second embodiment.
Figure 21B:
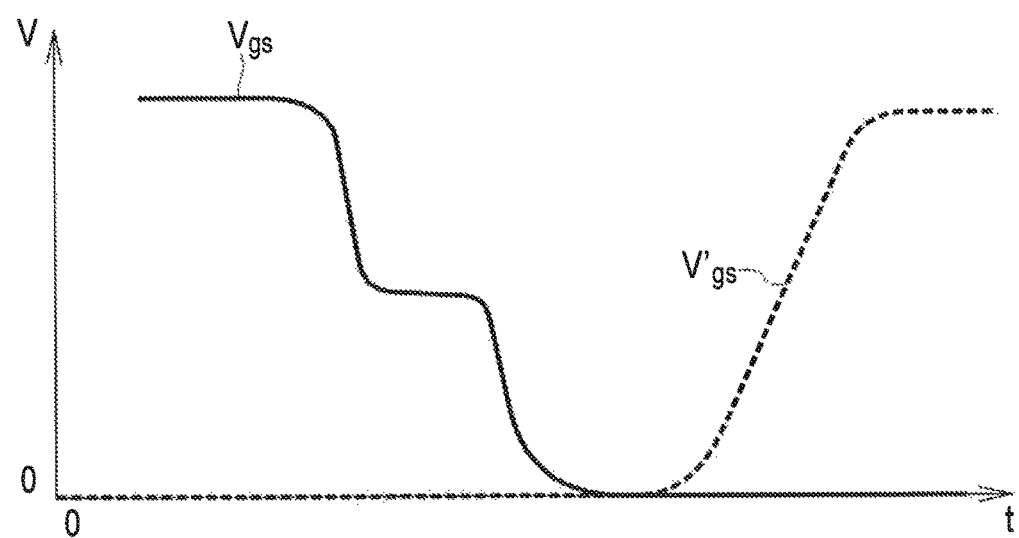
FIG. 21B is an explanatory diagram of operation waveform in FIG. 21A.

Moreover, FIG. 21A shows an operation circuit explanatory diagram of an active mirror clamp applied as a control circuit, in the power circuit 1 according to the second embodiment, and FIG. 21B shows an operation waveform explanatory diagram shown in FIG. 21A.

As shown in FIG. 21A, the transistors $Q_{M1}$ for active mirror clamp are connected in parallel between the gate and the source in the first MISFET Q1, and provides a dead time of OFF state mutually with the first MISFET Q1 to fundamentally execute complementary operation. More specifically, as shown in FIG. 21B, if the voltage $V_{gs}'$ between the gate and the source of the transistor $Q_{M1}$ for active mirror clamp is high-level, the voltage $V_{gs}$ between the gate and the source of the first MISFET Q1 equal to the voltage between the drain and the source of the transistor $Q_{M1}$ for active mirror clamp is a low level, and if a gate driving signal is input in a state where the voltage $V_{gs}'$ between the gate and the source of the transistor $Q_{M1}$ for active mirror clamp is in a low level, the voltage $V_{gs}$ between the gate and the source of the first MISFET Q1 equal to the voltage between the drain and the source of the transistor $Q_{M1}$ for active mirror clamp becomes high-level.

In FIG. 21A, the gate resistance $R_{g1}$, $R_{g2}$, a pnp type bipolar junction transistor $Q_p$, npn type bipolar junction transistor $Q_n$, and the capacitor $C_i$ schematically express a gate driver circuit of the first MISFET Q1. ON and OFF driving of the first MISFET Q1 can be performed by inputting a signal into the gate terminals $G_p$ of the pnp type bipolar junction transistor $Q_p$ and npn type bipolar junction transistor $Q_n$ of the inverter configuration. In addition, a Complementary Metal Oxide Semiconductor (CMOS) FET may be applied instead of the pnp type bipolar junction transistor $Q_p$ and the npn type bipolar junction transistor $Q_n$.

In the power circuit 1 according to the second embodiment and the power module 2 in which such a power circuit 1 is mounted, the active mirror clamp circuit (transistors $Q_{M1}$, $Q_{M4}$ for active mirror clamp) for complementarily operating to the voltages $V_{gs}$, $V_{gs}$ between the gate and the source sense of the first MISFET Q1 and the second MISFET Q4 is provided in the module, and corresponding transistors $Q_{M1} \ldots Q_{M4}$ for active mirror clamp are operated during the respective gate OFF periods of the first MISFET Q1 and the second MISFET Q4, and thereby the same effect as that of the gated diodes $D_{G1}$, $D_{G4}$ in the first embodiment can be obtained when the negative-direction voltage is applied to the capacitance between gate and source.

Although gate signal wiring patterns of the transistors $Q_{M1} \ldots Q_{M4}$ for active mirror clamp and the gate terminals MGT1, MGT4 for mirror clamp are newly required, an erroneous turning-on caused by drain voltage change can also be suppressed since the diode response time can be skipped and a low impedance effect of short circuit wiring can be obtained, with compared with the gated diodes $D_{G1}$, $D_{G4}$.

Moreover, an effect of instantaneous heat generation from the semiconductor chip can be avoided by disposing the transistors for active mirror clamp $Q_{M1} \ldots Q_{M4}$ on the signal substrates $14_1$, $14_4$.

Figure 14A:
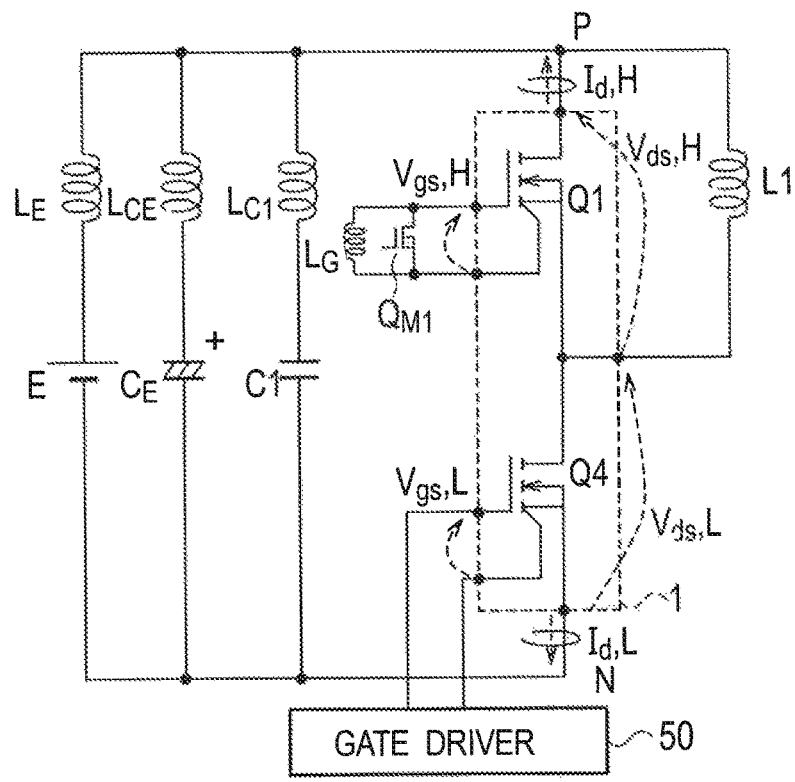
FIG. 14A is a circuit diagram for explaining an operation simulation when a transistor $Q_{M1}$ for active mirror clamp is short-circuited between the gate and the source of a first MISFET Q1 at a reflux side (high side), in the power circuit according to the first embodiment.
Figure 14B:
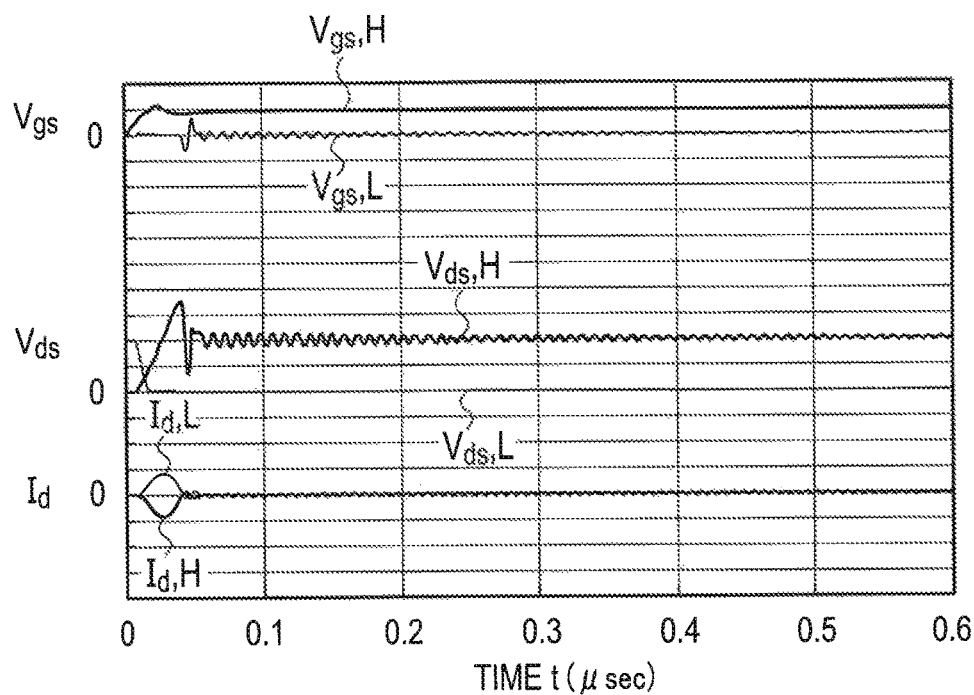
FIG. 14B shows a waveform example of voltages ($V_{gs}$, H), ($V_{gs}$, L) between the gate and the source sense, a waveform example of voltages ($V_{ds}$, H), ($V_{ds}$, L) between the drain and the source, and a waveform example of drain currents ($I_d$, H), ($I_d$, L), in FIG. 14A.

In the power circuit 1, an operation simulation when short-circuiting between the gate and the source in the first MISFET Q1 at the high side by the transistor $Q_{M1}$ for active mirror clamps is as explained in FIGS. 14A and 14B. Also when between the gate and the source in the first MISFET Q1 at the high side is short-circuited by the transistor $Q_{M1}$ for active mirror clamps, the phenomenon which repeats ON and OFF in the gate of the first MISFET Q1 at the high side which should continue OFF is suppressed. Since between the gate and the source sense has already short-circuited with the low parasitic inductance in particular at the time of sudden change of the voltage ($V_{ds}$, H) between the drain and the source in the first MISFET Q1 at the high side accompanying the on-operation of the second MISFET Q2 at the low side, an increment of the voltage ($V_{gs}$, H) between the gate and the source sense of in the first MISFET Q1 at the high side, and short circuit duration can be suppressed. Moreover, generation of a surge voltage in the voltage ($V_{ds}$, H) between the drain and the source in the first MISFET Q1 at the high side, and a short circuit between the arms in the first MISFET Q1 at the high side and the second MISFET Q4 at the low side can also be suppressed.

As shown in FIGS. 20 and 15, the power circuit 1 according to the second embodiment is a circuit in which a plurality of MISFET is included, and drains D1, D4 of the first MISFET Q1 and the second MISFET Q4 are electrically connected on the main substrate 10 including electrode patterns $12_1$, $12_n$, $12_4$. The power circuit 1 according to the second embodiment simultaneously includes gates G1, G4, source senses SS1, SS4, a gate terminal GT1 for external extraction, a source sense terminal SST1, and power terminals P, N; and includes a first control circuit for controlling at least a current path conducted from the first source S1 towards the first gate G1 of the first MISFET Q1.

Furthermore, particularly as shown in FIGS. 20 and 15, the power circuit 1 according to the second embodiment includes: a main substrate 10; a first electrode pattern $12_1$ disposed on the main substrate 10 and connected to a positive-side power terminal P; a second electrode pattern $12_n$ disposed on the main substrate 10 and connected to a negative-side power terminal N; a third electrode pattern $12_4$ disposed on the main substrate 10 and connected to an output terminal O; a first MISFET Q1 in which a first drain D1 is disposed on the first electrode pattern $12_1$; a second MISFET Q4 in which a second drain D4 is disposed on the third electrode pattern $12_4$; and a first control circuit connected between the first gate G1 and the first source S1 of the first MISFET Q1, the first control circuit configured to control a current path conducted from the first source S1 towards the first gate G1.

The power circuit 1 according to the second embodiment further may include a second control circuit connected between the second gate G4 and the second source S4 of the second MISFET Q4, the second control circuit configured to control a current path conducted from the second source S4 towards the second gate G4.

In the present embodiment, the first control circuit includes a third MISFET $Q_{M1}$ for mirror clamp in which a third drain is connected to a first gate and a third source is connected to a first source.

Moreover, the second control circuit includes a fourth MISFET $Q_{M4}$ 4 for mirror clamp in which a fourth drain is connected to a second gate and a fourth source is connected to a second source.

Moreover, as shown in FIGS. 20 and 15, in the power circuit 1 according to the second embodiment, a part of the electrode patterns $12_1$, $12_n$, $12_4$ may be disposed on signal substrates $14_1$, $14_4$ different from the main substrate 10, the signal substrates $14_1$, $14_4$ may be disposed on the main substrate 10, and the control circuit may be disposed on the signal substrates $14_1$, $14_4$. By adopting such a configuration, the control circuit becomes difficult to receive an effect of instantaneous heat generation of the transistor, and thereby can avoid a misoperation.

In particularly, in the same manner as FIG. 15, the power circuit 1 according to the second embodiment may include a first signal substrate $14_1$ disposed on a main substrate 10, the first signal substrate $14_1$ in which: a signal wiring pattern GL1 for first gate connected to the first gate G1; a signal wiring pattern SL1 for first source sense connected to the first source S1; and a signal wiring pattern MGL1 (not shown) for gate for active mirror clamps connected to the gate MG1 for active mirror clamp are mounted.

In the same manner as FIG. 15, the power circuit 1 according to the second embodiment may include a second signal substrate $14_4$ disposed on the main substrate 10, the second signal substrate $14_4$ in which: a signal wiring pattern GL4 for second gate connected to the second gate G4; and a signal wiring pattern SL4 for second source sense connected to the second source S4; and a signal wiring pattern MGL4 (not shown) for gate for active mirror clamp connected to the gate MG4 for active mirror clamp are mounted.

In the present embodiment, the first control circuit may include a third MISFET $Q_{M1}$ for active mirror clamp connected between the signal wiring pattern for first gate and the signal wiring pattern for first source sense.

Moreover, the second control circuit may include a fourth MISFET $Q_{M4}$ 4 for active mirror clamp connected between the signal wiring pattern for second gate and the signal wiring pattern for second source sense.

In the case of the active mirror clamp circuit, it can be compactly formed by forming the gates MG1, MG4 of the MISFETs $Q_{M1}$, $Q_{M4}$ for active mirror clamp on the signal substrates $14_1$, $14_4$. In this case, it is preferable to be configured so that three wirings (i.e., signal wiring patterns GL1, GL4 for gate of the MISFETs $Q_1$, $Q_4$, signal wiring patterns SL1, SL4 for source sense, signal wiring patterns MGL1, MGL4 for active mirror clamp gate of the MISFETs $Q_{M1}$, $Q_{M4}$) are disposed in parallel on the planar main substrate 10, and the signal wiring patterns MGL1, MGL4 for active mirror clamp gate of the MISFETs $Q_{M1}$, $Q_{M4}$ are inserted between other wirings.

In the power circuit 1 according to the second embodiment and the power module 2 in which such a power circuit 1 is mounted, the third MISFET $Q_{M1}$ for active mirror clamp for reducing a vibration of the voltage between the gate and the source is connected to the gate G1 and source sense SS1 wiring patterns in which the first MISFET is mounted thereon (the source is at the source sense SS1 side and the drain is at the gate G1 side) (it is important to be disposed inside from the signal terminals GT1, SST1 connected to outside). By connecting the third MISFET $Q_{M1}$ in this way, even when the erroneous turning-on occurs, the electric current which flow into in a negative direction to the capacitance between gate and source and vibration of the voltage between the gate and the source can be suppressed, and thereby stable operation can be obtained. Moreover, the power circuit 1 can be miniaturized since it can be composed with a simple circuit. Since it can be always operated unlike the diodes, it can be immediately operated, and the voltage between the gate and the source change and the erroneous turning-on which are caused by changing of the voltage between the drain and the source can also be suppressed.

As shown in FIG. 20, there are parasitic inductances $L_{GP1}$, $L_{SP1}$ associated with routing of signal terminals GT1, SST1 and electrode wiring, etc. between the signal terminals GT1, SST1 for external extraction and the gate G1, the source sense SS1 in the first MISFET Q1. Since such an inductance component exists in a gate closed circuit of the first MISFET Q1, it causes an operation delay in a gate driving of the first MISFET Q1.

Although the third MISFET $Q_{M1}$ is disposed between the gate G1 wiring and the source sense SS1 wiring, the effect becomes higher as the distance from the drain and the source in the third MISFET $Q_{M1}$ to the gate pad electrode GP and the source sense pad electrode SSP in the first MISFET Q1 becomes shorter in order to reduce the parasitic effect due to such an inductance component. In the present embodiment, the gate pad electrode GP and the source sense pad electrode SSP in the first MISFET Q1 are formed on a front side surface of the first MISFET Q1. Accordingly, even if the third MISFET $Q_{M1}$ is built in the same chip as the first MISFET Q1, the source of the third MISFET $Q_{M1}$ can also directly be soldered on the source pad electrode SP of the first MISFET Q1.

Moreover, although the third MISFET $Q_{M1}$ may be disposed collectively for every first MISFET Q1 disposed in parallel, it is more effective to individually connect the third MISFET QM1 to every first MISFET Q1, respectively.

Although, it is important for the third MISFET $Q_{M1}$ to be disposed inside from the signal terminals GT1, SST1 for external extraction having parasitic inductances $L_{GP1}$, $L_{SP1}$, and therefore it is more effective as nearest to the first MISFET Q1.

However, since temperature becomes higher when connecting the third MISFET $Q_{M1}$ directly on the chip of the first MISFET Q1, it is preferable to compose the third MISFET $Q_{M1}$ from wideband gap semiconductors, e.g. SiC, GaN, etc. with satisfactory high-temperature characteristics. The above-mentioned explanation is the same also as that of the fourth MISFET $Q_{M4}$ for mirror clamp.

As explained above, according to the power circuit 1 according to the second embodiment, there can be obtained the small-sized half bridge circuit for reducing the oscillation. Note that it is not limited to such a half bridge circuit, but a full bridge circuit or a three-phase bridge circuit can also similarly be applied thereto.

Moreover, any one the first MISFET Q1 or the second MISFET Q2 can be composed of the SiC MISFET. SiC can realize low on resistance $R_{on}$ by realizing high concentration of a drift layer since the dielectric breakdown electric field is higher. However, since an expansion width of depletion layer with respect to the drift layer is limited for the amount thereof and a feedback capacitance $C_{rss}$ is not easily reduced, the $C_{gs}$:$C_{gd}$ ratio is not excellent, and a gate erroneous turning-on operation caused by the drain voltage change $dV_{ds}/dt$ easily occurs, but the misoperation and the parasitic oscillation can be reduced and high speed switching performance can be secured by applying the power circuit 1 according to the second embodiment thereto.

According to the power module 2 including the power circuit 1 according to the second embodiment therein, there can be composed a module into which the control circuit is also incorporated. Accordingly, a variation in the distance between the control circuit and the MISFET can be reduced, and therefore the effect of the parasitic inductance can be controlled.

Modified Example

Figure 22:
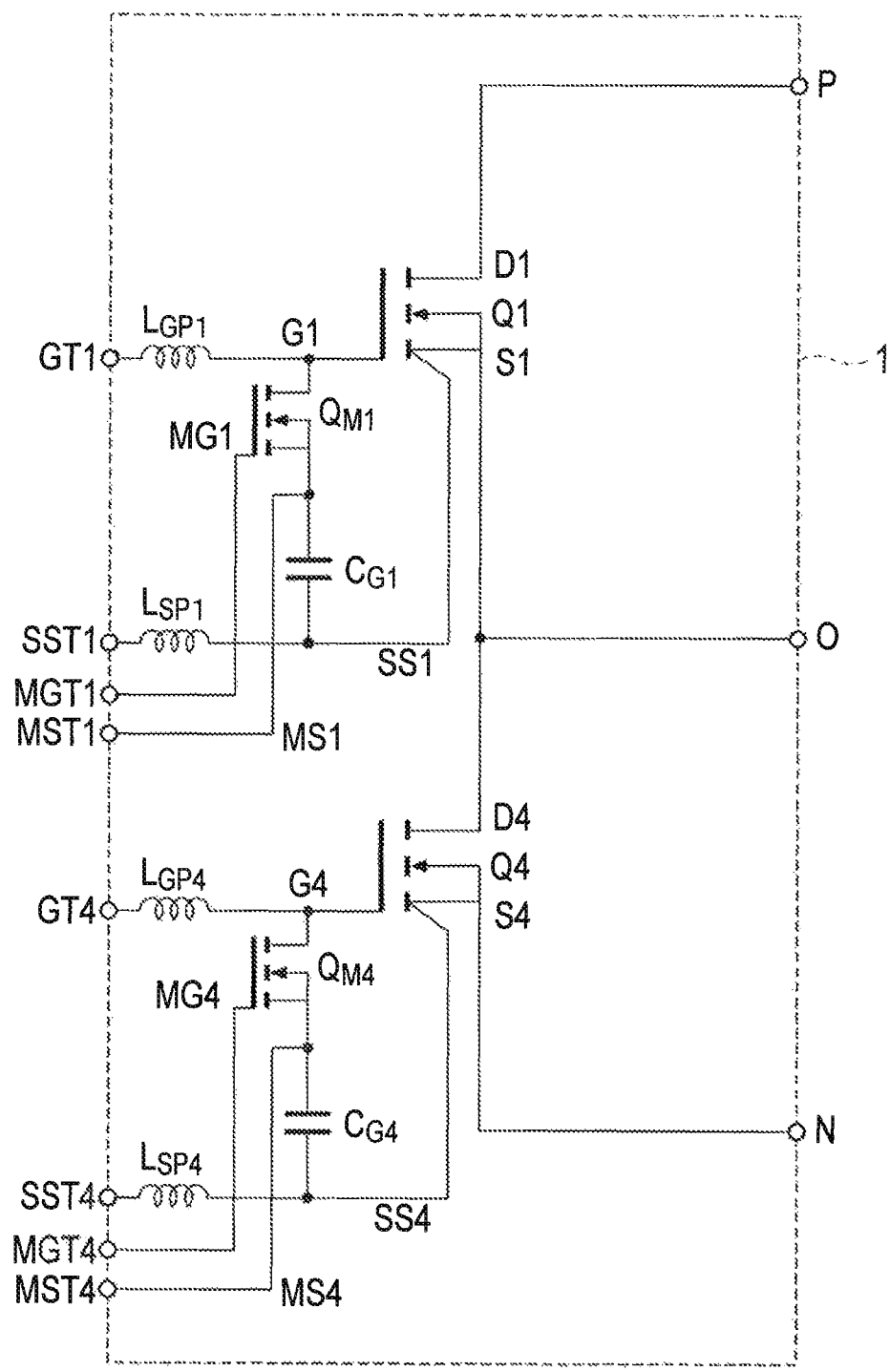
FIG. 22 is a schematic circuit configuration diagram of the half bridge circuit, in the power circuit related to a modified example of the second embodiment.

FIG. 22 shows a schematic circuit configuration of a half bridge circuit, in a power circuit 1 according to a modified example of the second embodiment.

Figure 23:
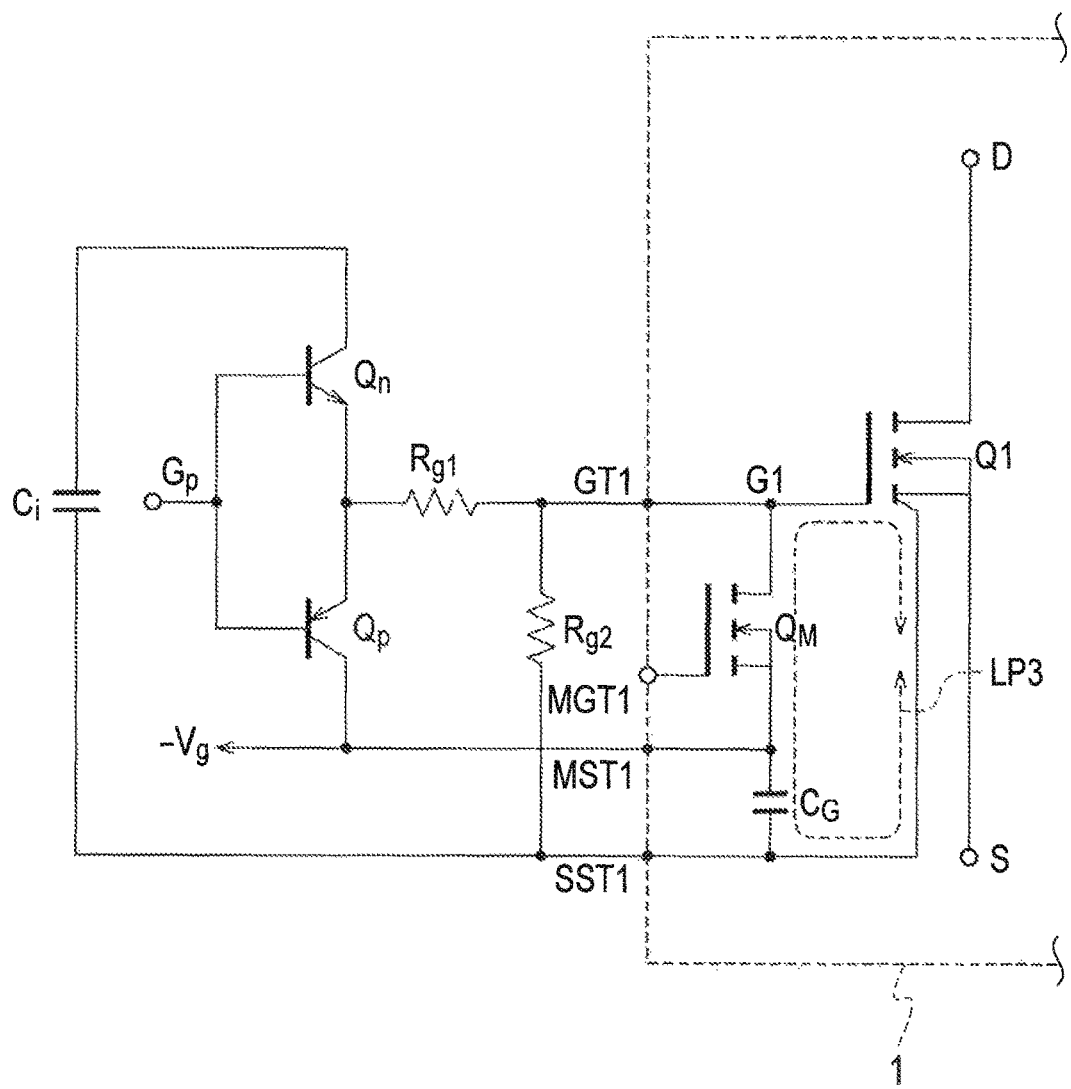
FIG. 23 is an operation circuit explanatory diagram of the active mirror clamp applied as a control circuit, in the power circuit according to the modified example of the second embodiment.

FIG. 23 shows an operation circuit explanatory diagram of the active mirror clamp applied thereto as a control circuit, in the power circuit 1 according to the modified example of the second embodiment.

In FIG. 22, an inside of the power module includes a first gate capacitor $C_{G1}$ and a second gate capacitor $C_{G4}$ for applying gate-negative bias respectively connected between the sources $M_{S1}$, $M_{S4}$ in the third and fourth MISFETs $Q_{M1}$, $Q_{M4}$ for active mirror clamp, and the source senses SS1, SS4 in the first and second MISFETs Q1, Q4. Moreover, the power module includes a source terminal MST1 for first active mirror clamp and a source terminal MST4 for second active mirror clamp electrically connected to sources MS1, MS4 in the third and fourth MISFETs $Q_{M1}$, $Q_{M4}$ for active mirror clamp, respectively.

Moreover, as shown in FIG. 23, a gate-negative bias $(-V_g)$ input and a collector side of the pnp transistor $Q_p$ are connected to the signal terminal MST1 for active mirror clamp, and thereby the parasitic inductance of the closed loop LP3 between the gate and the source sense in the MISFET Q1 including the gate capacitor $C_G$ can be reduced. Accordingly, although one piece of the signal terminal is further required, it becomes possible to utilize the active mirror clamp circuit with a low parasitic inductance, while the gate voltage is applied to the negative bias $(-V_g)$ side when the MISFET Q1 is in OFF state, and thereby it is possible to suppress more effectively the erroneous turning-on operation and the oscillation caused by a rapid change of the voltage between the drain and the source.

As mentioned above, according to the second embodiment, there can be provided the power circuit capable of reducing the erroneous turning-on and the induction from the erroneous turning-onto the parasitic oscillation at the time of operation of the power circuit composed of the MISFET, and further capable of realizing miniaturization and high speed switching performance; and a power module in which such a power circuit is mounted.

Third Embodiment (Power Circuit and Power Module)

Figure 24:
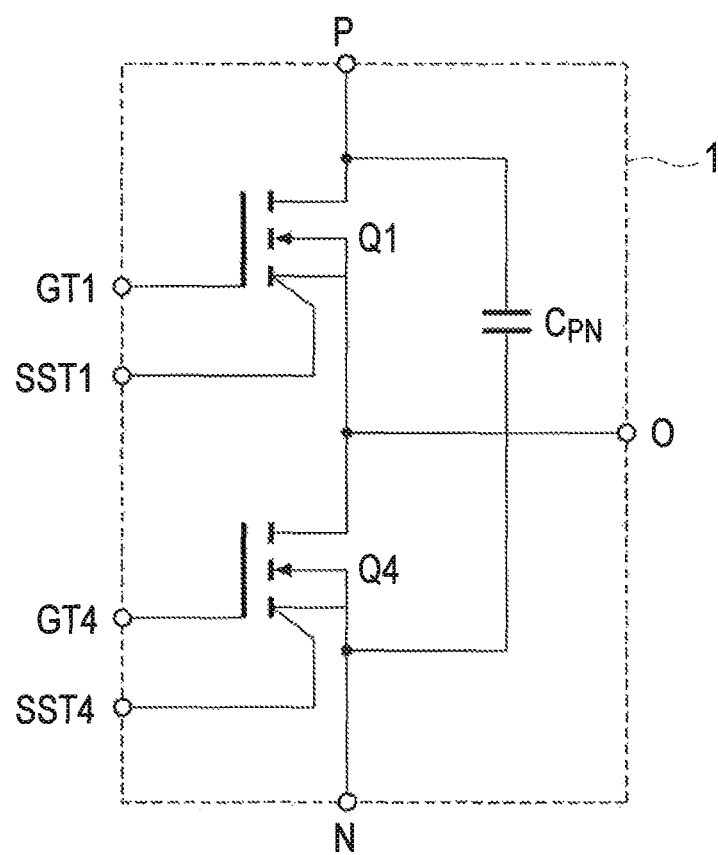
FIG. 24 is a schematic circuit configuration diagram of a half bridge circuit, in a power circuit according to a third embodiment.

FIG. 24 shows a schematic circuit configuration of a half bridge circuit, in a power circuit 1 according to a third embodiment.

Figure 25:
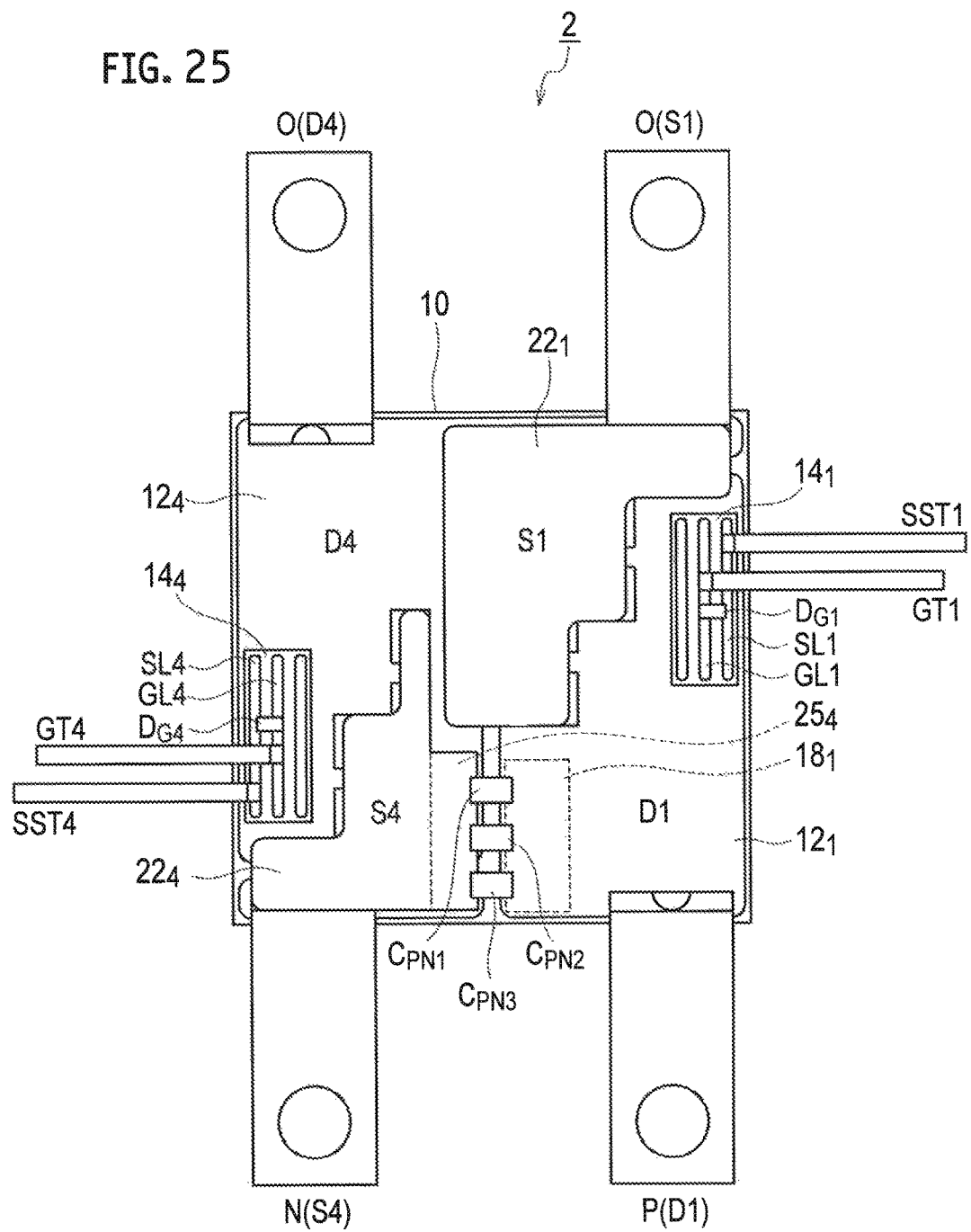
FIG. 25 is a top view diagram before forming the resin layer in the module with the built-in half-bridge, in the power module according to the third embodiment.

FIG. 25 shows a top view diagram before forming a resin layer, in a power module 2 in which a power circuit 1 according to the third embodiment is mounted.

The power circuit 1 according to the third embodiment includes a snubber capacitor $C_{PN}$ connected between the positive-side power terminal P and the negative-side power terminal N in order to reduce a drain voltage serge by suppressing a parasitic inductance in a short-circuit current path. Although illustration is omitted, other configurations are the same as those of the power circuits 1 according to the first and second embodiments including the control circuit.

Since the parasitic inductance of the short-circuit current path is reduced by the snubber capacitor $C_{PN}$, not only the drain voltage serge is reduced, but also short circuit duration when the erroneous turning-on occurs is reduced, and thereby a supply energy for continuing the oscillation can be reduced. More specifically, the oscillation can be reduced by building therein the snubber capacitor $C_{PN}$ connected between the positive-side power terminal P and the negative-side power terminal N, in the power circuit 1 according to the third embodiment. In addition, the method of building therein the snubber capacitor $C_{PN}$ connected between the positive-side power terminal P and the negative-side power terminal N can be similarly applied to the power circuits 1 according to the first and second embodiments, and thereby the oscillation can be similarly reduced.

Such a snubber capacitor $C_{PN}$ built in the power module 2 has a restriction on a size thereof in accordance with a size of the module, and if the capacitance value is small, the voltage between the positive-side power terminal P and the negative-side power terminals N and a drain current will be vibrated by ringing, a voltage drop at the time of short circuit occurring, and electric charging to the snubber capacitor $C_{PN}$ from the power supply, and it will lead to breakdown or will become a noise source. Accordingly, an appropriate design for suitable capacitance values and an appropriate selection of the target power supply circuits are required therefor. The oscillation can be more effectively suppressed by combining the aforementioned method and the power circuits according to the first to third embodiments. Since the parasitic inductance of the short circuit path between the gate and the source sense have an effect on the short circuit duration when the erroneous turning-on occurs, the parasitic inductance of the short circuit path between the gate and the source may also be simultaneously adjusted.

In particular, in the power module 2 in which the power circuit 1 according to the third embodiment is mounted, a layout in the module is devised so as to remove the positive-side power terminal P and the negative-side power terminal N from the short circuit path, in order to further reduce the parasitic inductance related to the short circuit or ringing. More specifically, as shown in FIG. 25, the power module 2 may include: an extended electrode $25_4$ for extending an upper surface plate electrode $22_4$ in a direction along the positive-side power terminal P; and a pillar connection electrode $18_1$ disposed on the electrode pattern $12_1$, so that a plurality of snubber capacitors $C_{PN1}$, $C_{PN2}$, $C_{PN3}$ may be connected in parallel between the extended electrode $25_4$ and the pillar connection electrode $18_1$. In addition, the pillar connection electrode $18_1$ can be formed of metallic poles, e.g. Cu, etc., and/or may be formed as an extended portion of the positive-side power terminal P. Moreover, ceramic capacitors etc. are applicable as the snubber capacitors $C_{PN1}$, $C_{PN2}$, $C_{PN3}$.

As shown in FIG. 25, in the power module according to the third embodiment 2, the parasitic inductance related to the short circuit or ringing can be reduced by directly connecting the plurality of the snubber capacitors $C_{PN1}$, $C_{PN2}$ $C_{PN3}$ in parallel so as to straddle between the extended electrode $25_4$ and the pillar connection electrode $18_1$. Moreover, space of the disposition in which the plurality of the snubber capacitors $C_{PN1}$, $C_{PN2}$, $C_{PN3}$ are connected thereto in parallel can be obtained by forming a top face of the upper surface plate so as to be lower than the top faces of the positive-side power terminal P and the negative-side power terminal N.

Modified Example 1

Figure 26:
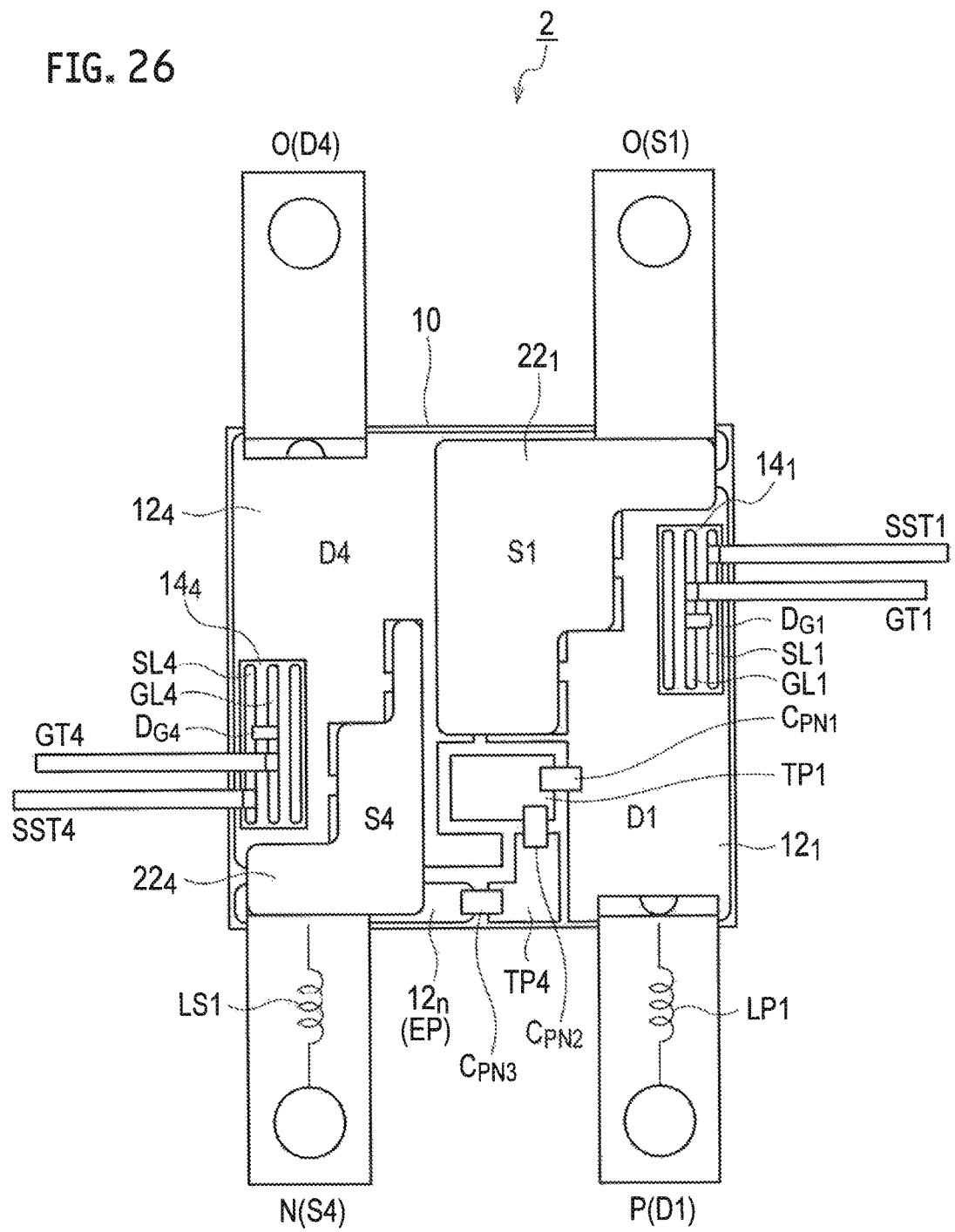
FIG. 26 is a top view diagram before forming the resin layer in the module with the built-in half-bridge, in the power module according to a modified example 1 of the third embodiment.

FIG. 26 is a top view diagram before forming a resin layer in the module with the built-in half-bridge, in the power module 2 according to a modified example 1 of the third embodiment.

Figure 27:
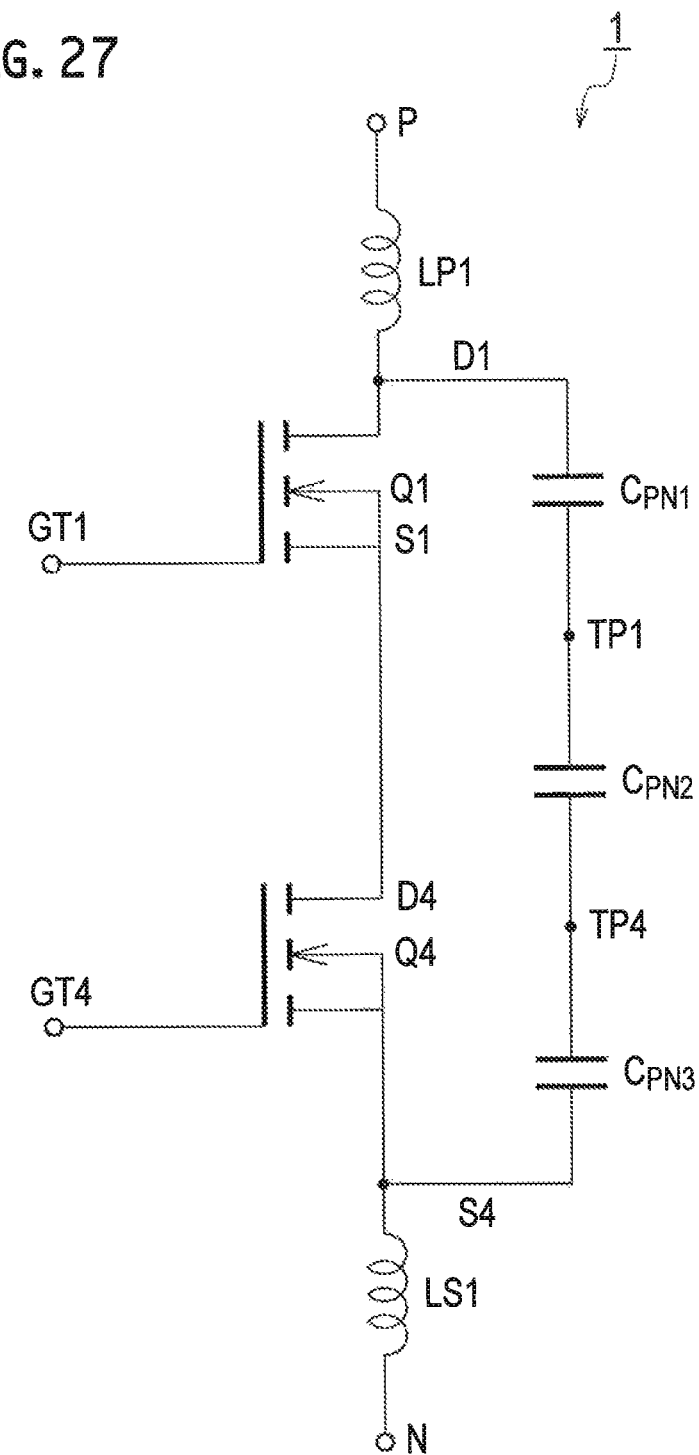
FIG. 27 is a schematic circuit configuration diagram of the half bridge circuit corresponding to FIG. 26, in the power circuit according to a modified example 1 of the third embodiment.

FIG. 27 shows a schematic circuit configuration of the half bridge circuit corresponding to that in FIG. 26, in a power circuit 1 according to the modified example 1 of the third embodiment.

The power circuit 1 according to the modified example of the third embodiment includes a snubber capacitors $C_{PN1}$, $C_{PN2}$, $C_{PN3}$ connected in series between the positive-side power terminal P and the negative-side power terminal N in order to reduce a drain voltage serge by suppressing a parasitic inductance in a short-circuit current path. Other configurations are the same as those of the power circuit 1 according to the third embodiment.

In addition, FIGS. 26 and 27 show schematically power terminal inductances LP1, LS1 as a parasitic inductance accompanying the positive-side power terminal P and the negative-side power terminal N. Also the power circuit 1 according to the modified example 1 of the third embodiment can be execute operation in which the power terminal inductances LP1, LS1 as the parasitic inductance accompanying the positive-side power terminal P and the negative-side power terminal N are removed.

The supply energy for continuing the oscillation can be reduced by providing the snubber capacitors $C_{PN1}$, $C_{PN2}$, $C_{PN3}$ therewith. More specifically, the oscillation can be reduced by building therein the snubber capacitors $C_{PN1}$, $C_{PN2}$, $C_{PN3}$ connected in series between the positive-side power terminal P and the negative-side power terminal N, in the power circuit 1 according to the modified example 1 of the third embodiment.

In particular, in the power module 2 in which the power circuit 1 according to the modified example 1 of the third embodiment is mounted, a layout in the module is devised so as to remove the positive-side power terminal P and the negative-side power terminal N from the short circuit path in order to further reduce the parasitic inductance related to the short circuit or ringing. More specifically, as shown in FIG. 26, the power module 2 includes adjacent patterns TP1, TP4 disposed so as to be adjacent to the electrode patterns $12_1$, $12_4$, $12_n$, so that the snubber capacitor $C_{PN1}$ is connected between the electrode pattern $12_1$ and the adjacent pattern TP1, the snubber capacitor $C_{PN2}$ is connected between the adjacent patterns TP1, TP4, and the snubber capacitor $C_{PN3}$ is connected between the adjacent pattern TP4 and the electrode pattern $12_n$. Moreover, ceramic capacitors etc. are applicable as the snubber capacitors $C_{PN1}$, $C_{PN2}$ $C_{PN3}$.

In the power module 2 according to the modified example 1 of the third embodiment, the parasitic inductance concerned can be reduced by disposing the snubber capacitors $C_{PN1}$, $C_{PN2}$, $C_{PN3}$, connected in series between the positive-side power terminal P and the negative-side power terminal N, so as to straddle between the patterns. The breakdown voltage of the snubber capacitors $C_{PN1}$, $C_{PN2}$ $C_{PN3}$ connected thereto in series can be improved by connecting the snubber capacitors in series. In this case, a numerical example of the snubber capacitors $C_{PN1}$, $C_{PN2}$ $C_{PN3}$ is approximately 10 nF/breakdown voltage of 600V per one capacitor, for example, and a desired function can be obtained while securing the breakdown voltage by connecting a plurality of the snubber capacitors in series thereto. Each snubber capacitor and its installation pattern in this case are disposed in parallel to a part of closed loop circuit formed of the half bridge and the snubber capacitor. Thereby, the effect is improved by reducing the parasitic inductance in the closed loop. Moreover, even if a plurality of the snubber capacitors $C_{PN1}$, $C_{PN2}$ $C_{PN3}$ are formed by being respectively connected thereto in parallel, a resistance for keeping a balance of the voltages applied to the respective capacitances may be inserted therein, and it may be designed so that the resonant frequency of the closed loop may be adjusted with the capacitance value.

Modified Example 2

Figure 28:
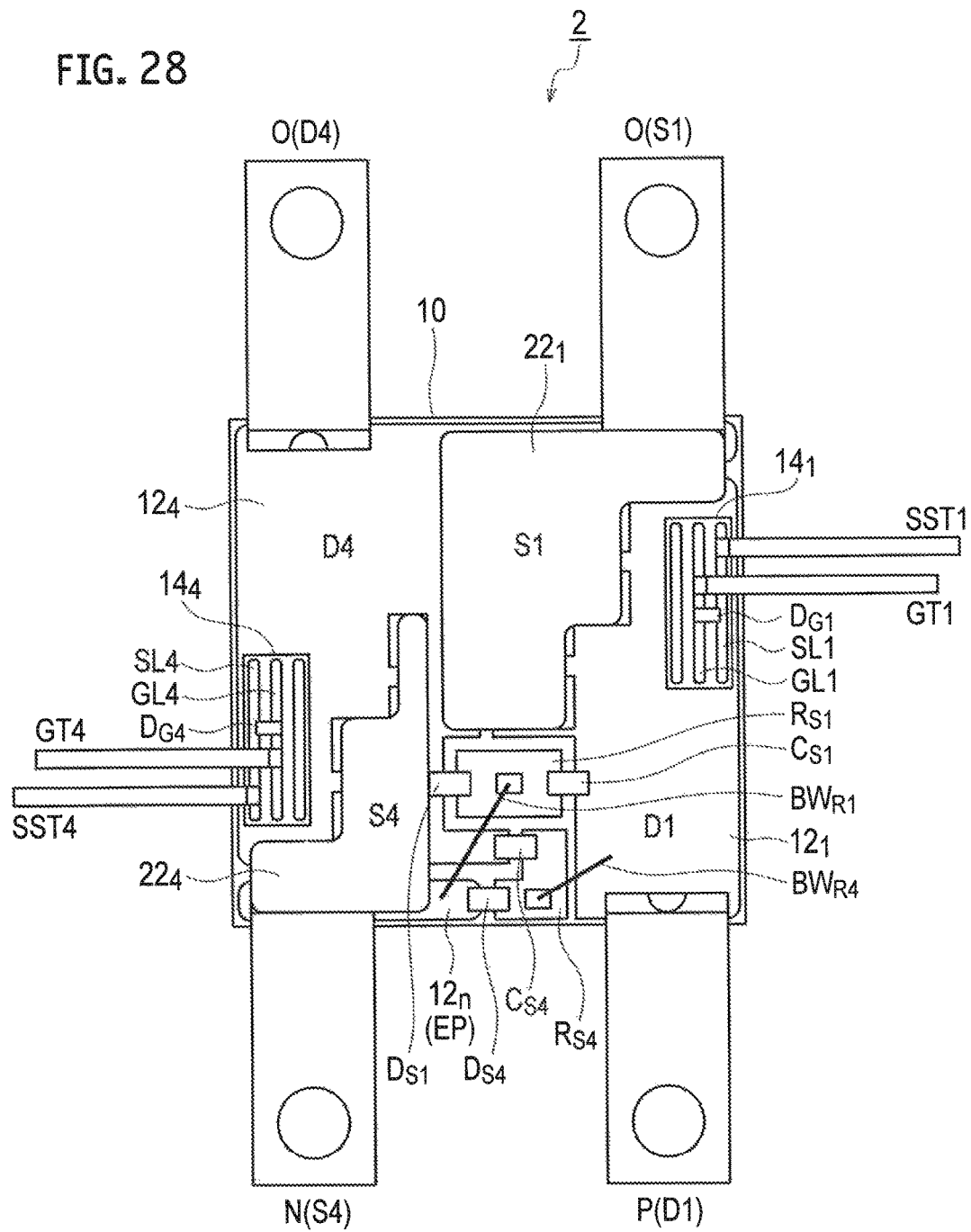
FIG. 28 is a top view diagram before forming the resin layer in the module with the built-in half-bridge, in the power module according to a modified example 2 of the third embodiment.

FIG. 28 is a top view diagram before forming a resin layer in the module with the built-in half-bridge, in the power module 2 according to a modified example 2 of the third embodiment.

Figure 29:
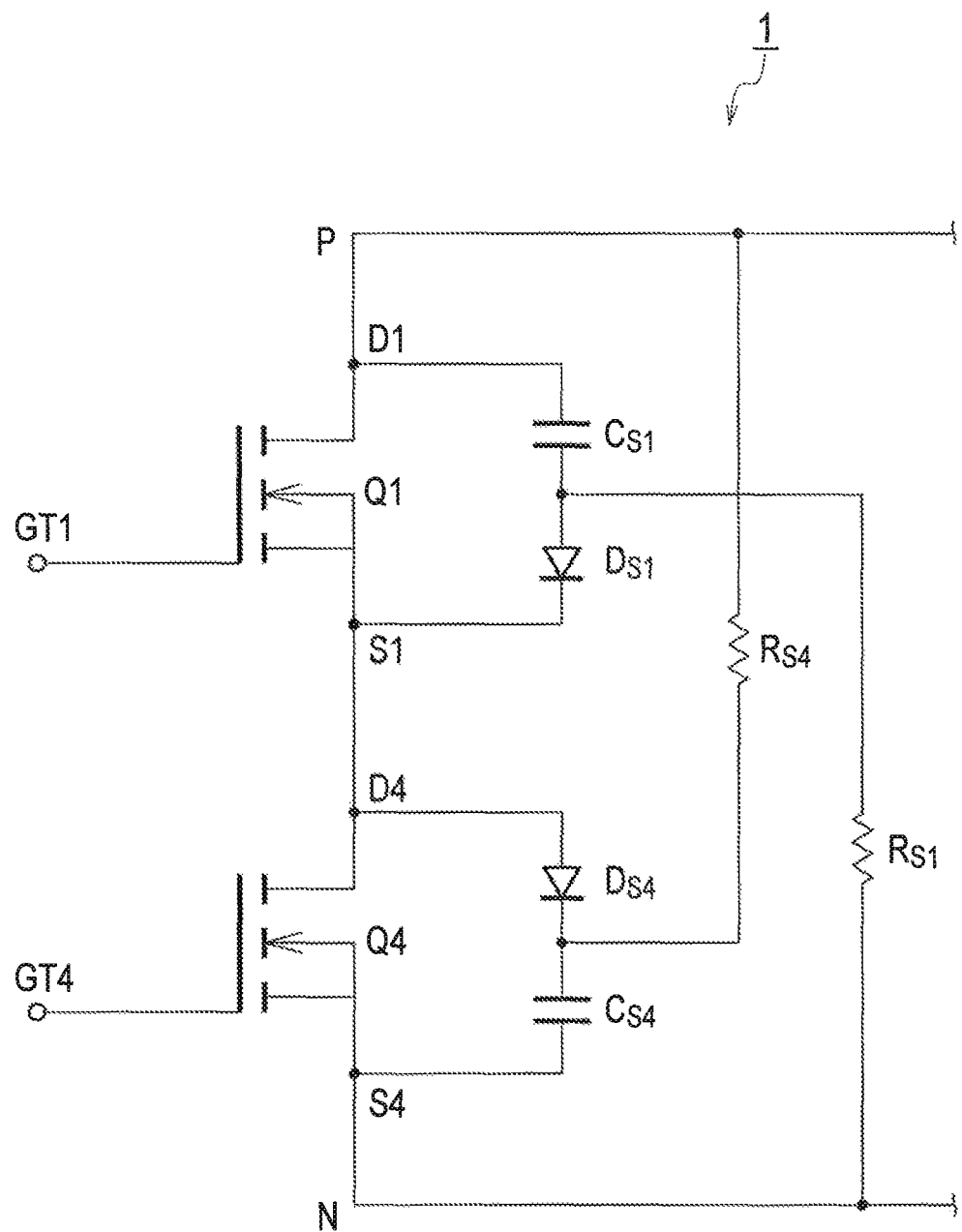
FIG. 29 is a schematic circuit configuration diagram of the half bridge circuit corresponding to FIG. 28, in the power circuit according to the modified example 2 of the third embodiment.

Moreover, FIG. 29 shows a schematic circuit configuration of the half bridge circuit corresponding to that in FIG. 28, in a power circuit 1 according to the modified example 2 of the third embodiment.

The power circuit 1 according to the modified example 2 of the third embodiment includes RCD snubber circuits ($R_{S1}$, $C_{S1}$, $D_{S1}$ and $R_{S4}$, $C_{S4}$, $D_{S4}$) between the positive-side power terminal P and the negative-side power terminal N in order to reduce the drain voltage serge by suppressing the parasitic inductance of the short-circuit current path. Other configurations are the same as those of the power circuit 1 according to the third embodiment.

The supply energy for continuing the oscillation can be reduced by the RCD snubber circuits ($R_{S1}$, $C_{S1}$, $D_{S1}$ and $R_{S4}$, $C_{S4}$, $D_{S4}$). More specifically, also in the power circuit 1 according to the modified example 2 of the third embodiment, the oscillation can be suppressed by building therein the RCD snubber circuits ($R_{S1}$, $C_{S1}$, $D_{S1}$ and $R_{S4}$, $C_{S4}$, $D_{S4}$) between the positive-side power terminal P and the negative-side power terminal N.

In particular, in the power module 2 in which the power circuit 1 according to the modified example 2 of the third embodiment is mounted, a layout in the module is devised so as to remove the positive-side power terminal P and the negative-side power terminal N from the short circuit path in order to further reduce the parasitic inductance related to the short circuit or ringing. More specifically, as shown in FIG. 28, the power module 2 includes resistance patterns $R_{S1}$, $R_{S4}$ disposed so as to be adjacent to the electrode patterns $12_1$, $12_4$, $12_n$, the snubber capacitor $C_{S1}$ is connected between the electrode pattern $12_1$ and the resistance pattern $R_{S1}$, the snubber capacitor $C_{S4}$ is connected between the electrode pattern $12_4$ and the resistance pattern $R_{S4}$, the snubber diode $D_{S1}$ is connected between the resistance pattern $R_{si}$ and the electrode pattern $12_4$, and the snubber diode $D_{S4}$ is connected between the resistance pattern $R_{S4}$ and the electrode pattern $12_n$. Moreover, between the electrode pattern $12_n$ and the resistance pattern $R_{S1}$ is connected with a bonding wire $B_{WR1}$, and between the resistance pattern $R_{S4}$ and the electrode pattern $12_1$ is connected with a bonding wire $B_{WR4}$. As the snubber capacitors $C_{S1}$, $C_{S4}$, ceramic capacitors etc. are applicable. An Si based SBD, or SBD using wide gap semiconductors, e.g. a GaN based SBD, an SiC based SBD, etc. are applicable, as the snubber diodes $D_{S1}$, $D_{S4}$.

In the power module 2 according to the modified example 2 of the third embodiment, the parasitic inductance concerned can be reduced by connecting the RCD snubber circuit ($R_{S1}$, $C_{S1}$, $D_{S1}$ and $R_{S4}$, $C_{S4}$, $D_{S4}$) between the positive-side power terminal P and the negative-side power terminal N so as to straddle between the patterns or so as to connect each element with wire connection.

(Substrate Structure)

Figure 30:
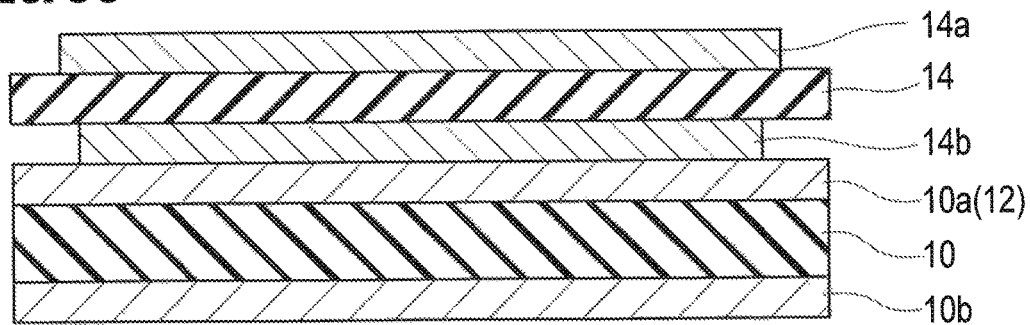
FIG. 30 is a schematic cross-sectional structure diagram of a ceramic substrate and a signal substrate disposed on the ceramic substrate, in a substrate structure applied to the power module according to the first to third embodiments.

FIG. 30 shows a schematic cross-sectional structure of the main substrate (ceramic substrate) 10 and the signal substrate 14 disposed on the ceramic substrate 10, in a substrate structure applied to the power module 2 according to the first to third embodiments. The signal substrate 14 can also be formed of ceramic substrates. A solder layer for connecting between the ceramic substrate 10 and the signal substrate 14 is omitted in FIG. 30.

A copper plate layer 10a and a copperplate layer 10b are respectively formed on a front side surface and a back side surface of the ceramic substrate 10. A copper plate layer 14a and a copper plate layer 14b are respectively formed also on a front side surface and a back side surface of the signal substrate 14. In the present embodiment, the thickness of the signal substrate 14 is approximately 0.8 mm, for example, and the thicknesses of the copper plate layer 14a and the copper plate layer 14b are approximately 0.4 mm, for example, and these thicknesses thereof may be designed so as to be a value by which the effect of the radiation noise can be reduced by spatially separating the control circuit from the MISFET. The copper plate layer 10b has a function as a heat spreader.

The power module 2 according to the first to third embodiments may include a shield for shielding the radiation noise between the inside of first signal substrate 14₁ or the main substrate 10, and the first signal substrate 14₁. Similarly, the power module 2 may include a shield for shielding the radiation noise between the inside of second signal substrate 14₄ or the main substrate 10, and the second signal substrate 14₄.

Figure 31:
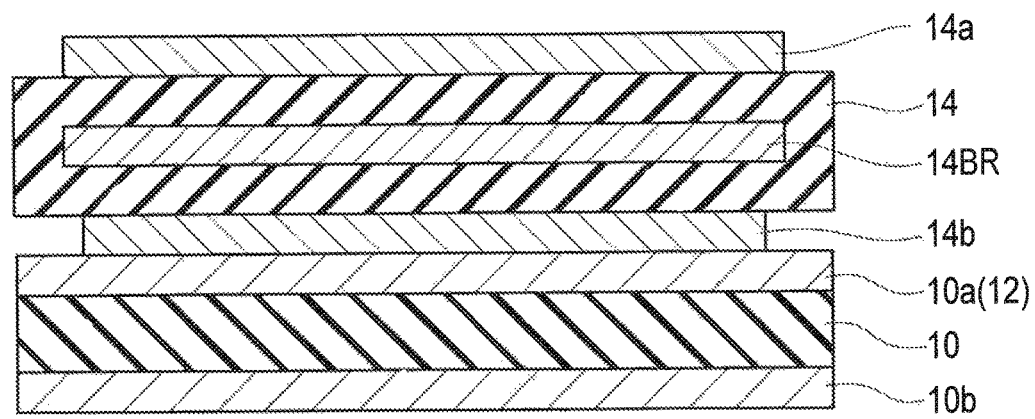
FIG. 31 is a schematic cross-sectional structure diagram of a ceramic substrate, and a signal substrate which is disposed on the ceramic substrate and includes a shield layer therein, in the substrate structure applied to the power module according to the first to third embodiments.

FIG. 31 shows a schematic cross-sectional structure of the main substrate (ceramic substrate) 10 and the signal substrate 14 disposed on the ceramic substrate 10 and having a shield layer 14BR therein, in a substrate structure applied to the power module 2 according to the first to third embodiments. A solder layer for connecting between the ceramic substrate 10 and the signal substrate 14 is omitted in FIG. 31.

Figure 32:
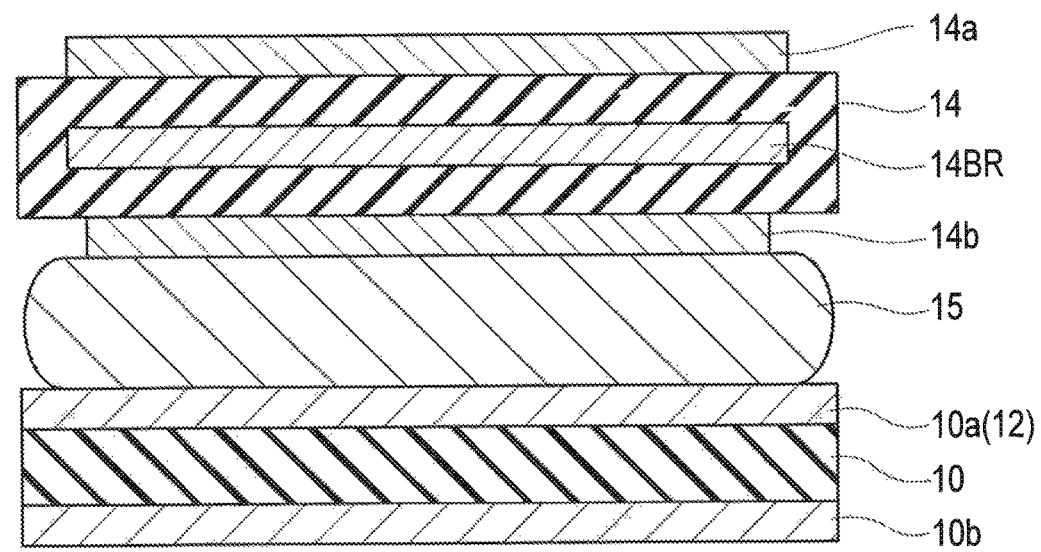
FIG. 32 is a schematic cross-sectional structure diagram of a ceramic substrate, and a signal substrate which is disposed on the ceramic substrate via a shield metallic plate and has a shield layer therein, in the substrate structure applied to the power module according to the first to third embodiments.

FIG. 32 shows a schematic cross-sectional structure of the ceramic substrate 10 and the signal substrate 14 disposed on the ceramic substrate 10 via a shield metallic plate 15 and having a shield layer 14BR therein, in a substrate structure applied to the power module 2 according to the first to third embodiments. A solder layer for connecting between the ceramic substrate 10 and the signal substrate 14 is omitted in FIG. 32.

In the power module according to the first embodiment 2, not only the effect of the instantaneous heat generation in the semiconductor chip can be avoided by disposing the gated diodes $D_{G1}$, $D_{G4}$ on the signal substrates 14₁, 14₄, but also the misoperation of the control circuit due to the effect of the radiation noise can be prevented by providing the shield layer 14BR in the inside of the signal substrates 14₁, 14₄. Moreover, the same effect can be obtained even by providing the shield metallic plate 15 for shielding the radiation noise between the main substrate 10 and the second signal substrate 14₄.

Similarly, in the power module 2 according to the second embodiment, not only the effect of the instantaneous heat generation from the semiconductor chip can be avoided by disposing the transistor $Q_{M1}$, $Q_{M4}$ for active mirror clamp on the signal substrates 14₁, 14₄, but also the misoperation of the active mirror clamp gate control circuit can be prevented due to the effect of the radiation noise by providing the shield layer 14BR in the inside of the signal substrates 14₁, 14₄. Moreover, the same effect can be obtained even by providing the shield metallic plate 15 for shielding the radiation noise between the main substrate 10 and the second signal substrate 14₄. With respect to the radiation noise tolerance of the signal wiring patterns GL1, GL4 for gate and the signal wiring patterns SL1, SL4 for source sense, an effect equal to or greater than the effect that both are at a distance from each other can be obtained.

Fourth Embodiment

Figure 33A:
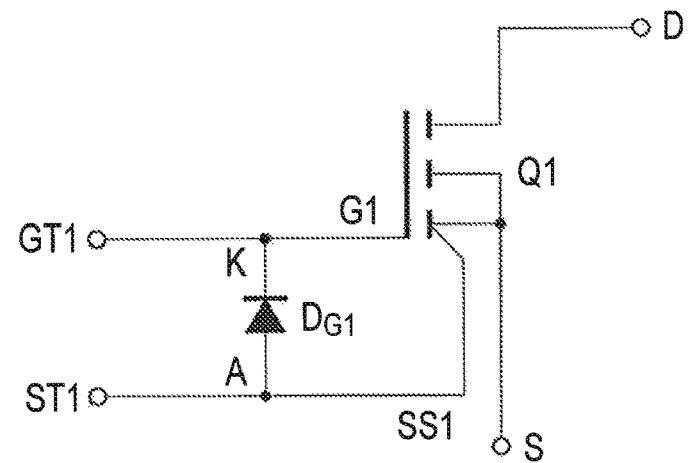
FIG. 33A is a circuit configuration diagram composed of a discrete device, in a power circuit according to a fourth embodiment.
Figure 33B:
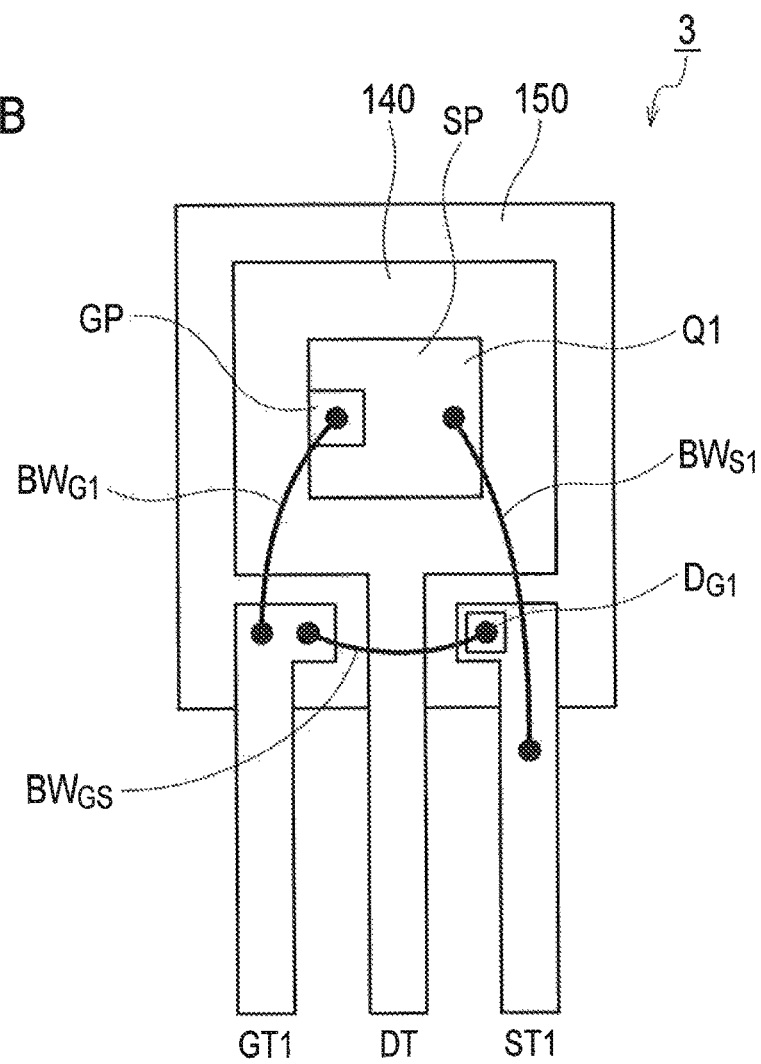
FIG. 33B is a plane configuration diagram of the power module corresponding to FIG. 33A.

FIG. 33A shows an example of a circuit configuration composed of a discrete device, in a power circuit according to a fourth embodiment, and FIG. 33B shows an example of a plane configuration of a power module 3 corresponding to FIG. 33A.

In the power module 3 according to the fourth embodiment, as shown in FIG. 33B, an MISFET Q1 to which a drain is connected on a metal die 140 is contained in a package 150. The gated diode $D_{G1}$ is disposed in the package 150 so that the anode thereof is connected on the source sense terminal SST1. The source pad electrode SP and the gate pad electrode GP of the MISFET Q1 are disposed at a front surface side, as shown in FIG. 33B.

In the power module 3 according to the fourth embodiment, the gate G1 of the MISFET Q1 corresponds to the gate pad electrode GP, and the source sense SS1 of the MISFET Q1 corresponds to the source pad electrode SP commonly connected to the source S.

Furthermore, in the package 150, between the source pad electrode SP and the source sense terminal SST1 is connected via a bonding wire $BW_{S1}$, between the gate pad electrode GP and the gate terminal GT1 is connected via a bonding wire $BW_{G1}$, and between the cathode K and gate terminal GT1 of the gated diode $D_{G1}$ disposed on the source sense terminal SST1 is connected via a bonding wire $BW_{GS}$. The metal die 140 to which the drain of the MISFET Q1 is connected extends in that condition to form the diode terminal DT.

Also in the power module 3 according to the fourth embodiment, the parasitic inductance concerned in the gate terminal GT1 and the source sense terminal SST1 can be reduced by disposing the gated diode $D_{G1}$ so as to be adjacent to the MISFET Q1 in the package 150.

In the power module 3 according to the fourth embodiment, if an electric current conducts between the drain and the source, an inductance component between the source pad electrode SP and the source terminal ST1 will electrify, and then a voltage applied between the gate the source will be inhibited, and therefore a switch response becomes slow and the drain voltage change $dV_{ds}/dt$ becomes small. Consequently, the erroneous turning-on does not easily occur originally due to the electrification of source wiring since a divide value of voltage due to a feedback capacitance is suppressed and increase of the gate voltage is suppressed. However, also when the erroneous turning-on occurs, it can prevent from leading to the oscillation by the gated diode $D_{G1}$.

According to the fourth embodiment, there can be provided the power circuit and the power module for suppressing an induction from the erroneous turning-on to the parasitic oscillation.

Modified Example

Figure 34A:
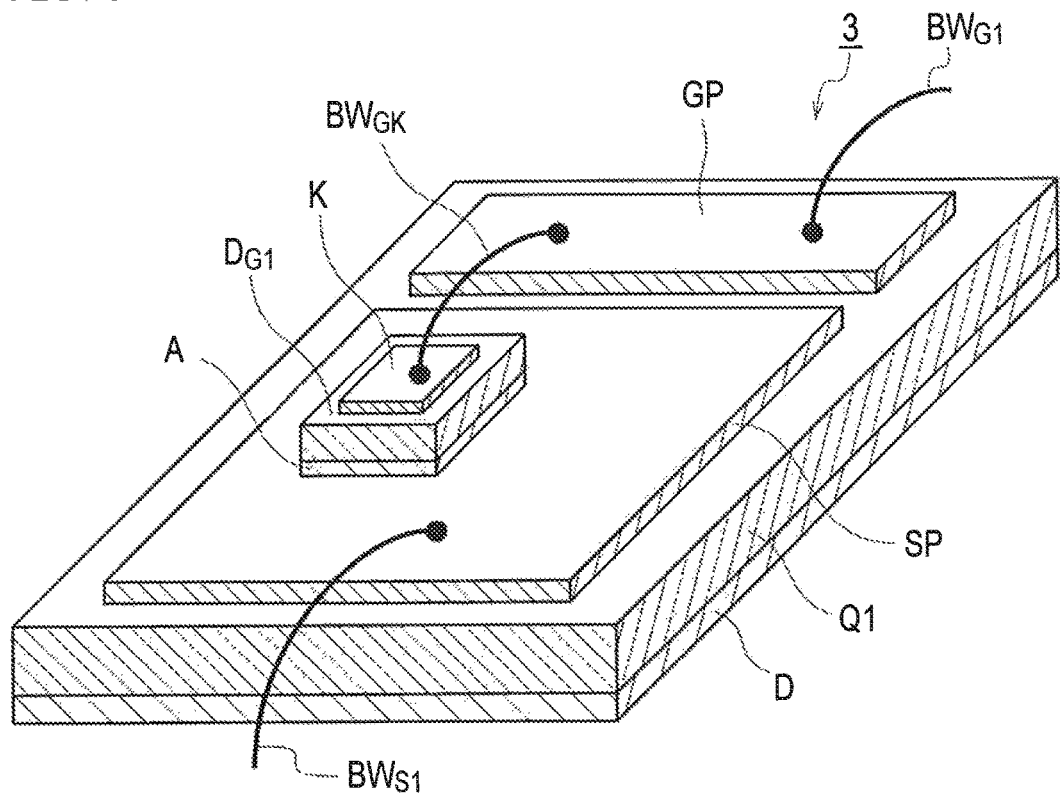
FIG. 34A is a schematic bird's-eye view configuration diagram composed of a hybrid device, in a power module according to a modified example of the fourth embodiment.
Figure 34B:
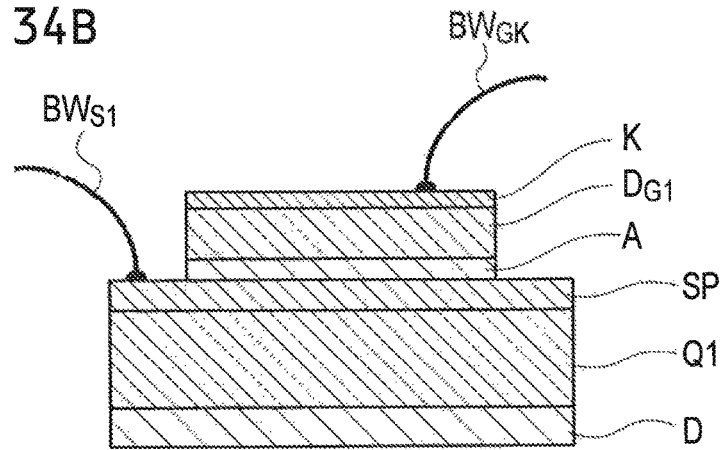
FIG. 34B is a schematic cross-sectional structure diagram of a structure portion in which the diode is mounted on a semiconductor device (SiC TMISFET), in the power module according to the modified example of the fourth embodiment.

FIG. 34A shows a schematic bird's-eye view configuration composed of a hybrid device in a power module 3 according to a modified example of the fourth embodiment, and FIG. 34B shows a schematic cross-sectional structure of a structure portion in which the diode is mounted on the MISFET Q1 in FIG. 34A. The circuit configuration is similarly shown as FIG. 33A. Although detailed structure is omitted in the MISFET Q1 shown in FIG. 34, the structure of the SiC based MISFET shown in FIGS. 2 and 3 is applicable thereto.

As shown in FIGS. 34A and 34B, in the power module 3 according to the modified example of the fourth embodiment, the source pad electrode SP and the gate pad electrode GP of the MISFET Q1 are disposed at a front surface side, as shown in FIG. 34B, the anode of the gated diode DG1 is disposed so as to be connected on the source pad electrode SP of the MISFET Q1, and the cathode K of the gated diode DG1 is connected to the gate pad electrode GP of the MISFET Q1 via the bonding wire BWGK.

In the power module 3 according to the modified example of the fourth embodiment, the gate G1 of the MISFET Q1 corresponds to the gate pad electrode GP, and the source sense SS1 of the MISFET Q1 corresponds to the source pad electrode SP commonly connected to the source S.

Furthermore, the power module 3 according to the modified example of the fourth embodiment is contained in the package 150 (illustration is omitted) in the same manner as the fourth embodiment, between the source pad electrode SP and the source sense terminal SST1 is connected via a bonding wire $BW_{S1}$, between the gate pad electrode GP and the gate terminal GT1 is connected via a bonding wire $BW_{G1}$. The metal die 140 to which the drain of the MISFET Q1 is connected extends in that condition to form the diode terminal DT.

Also in the power module 3 according to the modified example of the fourth embodiment, the parasitic inductance concerned in the gate terminal GT1 and the source sense terminal SST1 can be reduced by disposing the gated diode $D_{G1}$ so as to be adjacent to the MISFET Q1, in the package 150. The control circuit may be built in another region in the same chip as the MISFET Q1.

According to the modified example of the fourth embodiment, there can be provided the power circuit and the power module for suppressing an induction from the erroneous turning-on to the parasitic oscillation.

The power circuits and the power modules according to the first to fourth embodiments are applicable to converters and inverters for HEV/EV, motors built-in wheel (Power Factor Correction (PFC) circuits and three phase inverter circuits for motor driving used for boosting from batteries), converters for power conditioners of solar battery systems, converters and inverters for industrial equipment, etc. In particular, the power circuits and power modules according to first to fourth embodiments are effectively applicable to converters and inverters with which a high-frequency operation and a miniaturization are required in order to miniaturize the passive element.

As explained above, according to the embodiments, there can be provided the power circuit capable of reducing the misoperation and the parasitic oscillation and further capable of realizing the high speed switching performance; and the power module in which such a power circuit is mounted.

OTHER EMBODIMENTS

The first to fourth embodiments have been described, as a disclosure including associated description and drawings to be construed as illustrative, not restrictive. This disclosure makes clear a variety of alternative embodiment, working examples, and operational techniques for those skilled in the art. Moreover, the same effect can be obtained by taking same countermeasure also using a power circuit or power module in which only patterns are prepared with metallic plates or metallic frames, without using the main substrate, and the arrangement relationship holding and insulating holding between the patterns which are roles of the main substrate are realized with resin sealing, insulating sheets, etc.

Such being the case, the embodiment covers a variety of embodiments, whether described or not.

INDUSTRIAL APPLICABILITY

The power module and power circuit according to the embodiments are available to whole of power devices, e.g. SiC power modules, intelligent power modules, and are applicable to in particular wide applicable fields, e.g., converters and inverters for HEV/EV, motors built-in wheel (PFC circuits and three phase inverter circuits for motor driving used for boosting from batteries), step-up (boost) converters used for power conditioners of solar battery systems, converters and inverters for industrial equipment, etc.

What is claimed is:

1. A power circuit comprising:
    a main substrate comprising a front side surface and a back side surface;
    a first wiring pattern disposed on the front side surface of the main substrate;
    a second wiring pattern disposed on the front side surface of the main substrate;
    a first MISFET of which a first drain is disposed on the first electrode pattern, the first MISFET comprising a source electrode and a gate electrode on an upper surface thereof;
    a third wiring pattern disposed on the front side surface of the main substrate, the third wiring pattern electrically connected to the gate electrode; and
    a fourth wiring pattern disposed on the front side surface of the main substrate, the fourth wiring pattern electrically connected to the source electrode, wherein
    a first control circuit configured to control a current path conducted towards the gate electrode from the source electrode is disposed between the third wiring pattern and the fourth wiring pattern.

2. The power circuit according to claim 1, further comprising
    a connecting means configured to electrically connect the source electrode and the second wiring pattern.

3. The power circuit according to claim 1, wherein
    the first MISFET is configured to connect a plurality of chips in parallel, and
    the third wiring pattern and the fourth wiring pattern are wiring patterns configured to commonly connect each of the chips of the first MISFET.

4. The power circuit according to claim 1, wherein
    external terminals extending from each electrode on the main substrate to an outside of the main substrate are respectively connected to the first to fourth wiring patterns.

5. The power circuit according to claim 1, further comprising
    a shield layer inserted in an inside of each of the first to fourth wiring patterns or inserted between each of the first to fourth wiring patterns and the main substrate.

6. The power circuit according to claim 1, further comprising:
    a fifth wiring pattern disposed on the front side surface of the main substrate;
    a second MISFET which is disposed on the 2nd above-mentioned wiring pattern, the second MISFET comprising a source electrode and a gate electrode on an upper surface thereof;
    a sixth wiring pattern disposed on the front side surface of the main substrate, the sixth wiring pattern electrically connected to the gate electrode of the second MISFET; and
    a seventh wiring pattern disposed on the front side surface of the main substrate, the seventh wiring pattern electrically connected to the source electrode of the second MISFET.

7. The power circuit according to claim 6, further comprising
a second control circuit configured to control a current path conducted towards the gate electrode from the source electrode, the second control circuit disposed between the six wiring pattern and the seventh wiring pattern.

8. The power circuit according to claim 1, further comprising:
a snubber capacitor connected between the first wiring pattern and the fifth wiring pattern.

9. The power circuit according to claim 1, wherein
the first MISFET is a wideband-gap type power semiconductor device.

10. The power circuit according to claim 6, wherein
the second MISFET is a wideband-gap type power semiconductor device.

11. The power circuit according to claim 4, further comprising:
a package configured to seal at least a part of each external terminal, the first MISFET, the control circuit, and the connecting means.

12. The power circuit according to claim 1, wherein
the first control circuit comprises a first gated diode of which a first cathode is connected to a first gate of the first MISFET and a first anode is connected to the first source of the first MISFET.

13. The power circuit according to claim 7, wherein
the second control circuit comprises a second gated diode of which a second cathode is connected to the second gate of the second MISFET, and a second anode is connected to the second source of the second MISFET.

14. The power circuit according to claim 1, wherein
the first control circuit comprises a third MISFET of which a third drain is connected to the first gate, and a third source is connected to the first source.

15. The power circuit according to claim 7, wherein
the second control circuit comprises a fourth MISFET of which a fourth drain is connected to the second gate, and a fourth source is connected to the second source.

16. The power circuit according to claim 1, further comprising:
a first signal substrate on which the third wiring pattern and the fourth wiring pattern are mounted.

17. The power circuit according to claim 1, wherein
the first control circuit comprises an first gated diode connected between the third wiring pattern and the fourth wiring pattern.

18. The power circuit according to claim 1, wherein
the first control circuit comprises a third MISFET connected between the third wiring pattern and the fourth wiring pattern.

19. The power circuit according to claim 18, wherein
the power circuit comprises a first gate capacitor for applying gate-negative bias, the first gate capacitor connected between a source of the third MISFET and a source sense of the first MISFET.

20. The power circuit according to claim 7, wherein
the second control circuit comprises a fourth MISFET connected between the sixth wiring pattern and the seventh wiring pattern, and
the power circuit comprises a second gate capacitor for applying gate-negative bias, the second gate capacitor connected between a source of the fourth MISFET and a source sense of the second MISFET.

21. The power circuit according to claim 12, wherein
a circuit constant is set up so that a forward voltage when the first gated diode is conducting becomes lower than a negative-side absolute maximum rating of a voltage between the gate and the source in the first MISFET.

22. The power circuit according to claim 21, wherein
the first gated diode is a diode selected from the group consisting of a Zener diode and a Schottky barrier diode.

23. The power circuit according to claim 16, further comprising:
a shield for shielding a radiation noise between an inside of the first signal substrate or the main substrate, and the first signal substrate.

24. The power circuit according to claim 6, wherein
one selected from the group consisting of the first MISFET and the second MISFET comprises an SiC MISFET.

25. The power circuit according to claim 6, wherein
one selected from the group consisting of the first MISFET and the second MISFET comprises an SiC Trench MISFET.

26. A power module comprising a power circuit, wherein the power circuit comprises:
a main substrate comprising a front side surface and a back side surface;
a first wiring pattern disposed on the front side surface of the main substrate, the first wiring pattern connected to a first terminal;
a second wiring pattern disposed on the front side surface of the main substrate, the third wiring pattern connected to a second terminal;
a first MISFET of which a first drain is disposed on the first electrode pattern, the first MISFET comprising a source electrode and a gate electrode on an upper surface thereof;
a third wiring pattern disposed on the front side surface of the main substrate, the third wiring pattern electrically connected to the gate electrode; and
a fourth wiring pattern disposed on the front side surface of the main substrate, the fourth wiring pattern electrically connected to the source electrode, wherein
a first control circuit configured to control a current path conducted towards the gate electrode from the source electrode is disposed between the third wiring pattern and the fourth wiring pattern, wherein
the power module further comprising external terminals configured to respectively extend signals of the third and fourth wiring patterns to an outside of the main substrate.

27. The power module according to claim 26, wherein
the power module except for at least a part of each terminal is sealed with a thermosetting resin.

28. The power module according to claim 26, wherein
the first gated diode is disposed nearer to a semiconductor chip side than a mounting position of a signal terminal of the fourth wiring pattern on the main substrate.

29. The power module according to claim 26, wherein
the first terminal and the third terminal are disposed at a first side of the main substrate, the output terminal is disposed at a third side opposite to the first side, a signal terminal of the first control circuit is disposed at a second side adjacent to the first side, and a signal terminal of the second control circuit is disposed at a fourth side opposite to the second side.

30. A converter comprising a plurality of power modules according to claim 26.

31. An inverter comprising a plurality of power modules according to claim 26.

32. A semiconductor device, comprising:
a die substrate comprising a front side surface and a back side surface, the die substrate further comprising a first external terminal;
an MISFET of which a drain is disposed on the front side surface of the die substrate, the MISFET comprising a source electrode and a gate electrode on the upper surface thereof;
a second external terminal disposed so as to be adjacent to the first external terminal, the second external terminal electrically connected to the source electrode;
a third external terminal disposed so as to be adjacent to the first external terminal, the third external terminal electrically connected to the gate electrode;
a control circuit of which an anode electrode is disposed on the second external terminal, and a cathode electrode disposed on the upper surface thereof;
a connecting means configured to electrically connect the third external terminal with the cathode electrode; and
a package configured to seal at least a part of each external terminal, the first MISFET, and the connecting means.

33. The semiconductor device according to claim 32, wherein
the anode electrode of the control circuit is disposed on one end of the second external terminal, and
the cathode electrode of the control circuit is electrically connected to an one end of the third external terminal.

34. The semiconductor device according to claim 32, wherein
an anode electrode of the control circuit is disposed on the source electrode, and
the cathode electrode of the control circuit is electrically connected to an one end of the third external terminal.

35. The semiconductor device according to claim 32, wherein
the control circuit comprises a gated diode.

36. The semiconductor device according to claim 35, wherein
a circuit constant is set up so that a forward voltage when the gated diode is conducting becomes lower than a negative-side absolute maximum rating of a voltage between the gate and the source in the MISFET.

37. The semiconductor device according to claim 35, wherein
the gated diode is a diode selected from the group consisting of a Zener diode and a Schottky barrier diode.

38. A converter comprising a plurality of the semiconductor devices according to claim 32 used as a switching element.

39. An inverter comprising a plurality of the semiconductor devices according to claim 32 used as a switching element.

40. A power module comprising:
a main substrate comprising a front side surface;
a first wiring pattern disposed on the front side surface of the main substrate;
a second wiring pattern disposed on the front side surface of the main substrate;
a first MISFET of which a first drain is disposed on the first wiring pattern, the first MISFET comprising a source electrode and a gate electrode on an upper surface thereof;
a first pillar connection electrode electrically connected to the source electrode of the first MISFET;
a plate electrode electrically connected to the first pillar connection electrode; and
a gate control conductive portion electrically connected between the gate electrode of the first MISFET and the second wiring pattern.

41. The power module according to claim 40, wherein the gate control conductive portion is a wire.

42. The power module according to claim 41, wherein the plate electrode is electrically connected to a source lead terminal of the power module.

43. The power module according to claim 42, wherein a conductive material is provided between the first wiring pattern and the first MISFET.

44. The power module according to claim 43, wherein a conductive material is provided between the first pillar connection electrode and the source electrode of the first MISFET.

45. The power module according to claim 44, wherein a height of the wire is not higher than a height of the plate electrode.

46. The power module according to claim 45, wherein the first wiring pattern and the second wiring pattern are isolated electrically.

47. The power module according to claim 46, wherein the first wiring pattern is electrically connected to a drain lead terminal.

48. The power module according to claim 47, wherein both of the source lead terminal and the drain lead terminal are protruding in opposite directions from one another.

49. The power module according to claim 48, further comprising:
a second MISFET having a source electrode and a gate electrode;
a second pillar connection electrode;
a third wiring pattern disposed on the front side surface of the main substrate;
wherein the second pillar connection electrode is electrically connected to the source electrode of the second MISFET, and the second MISFET is electrically connected to the third wiring pattern.

50. The power module according to claim 49, wherein both of the first MISFET and the second MISFET are controlled in a manner so that a same voltage potential is provided to the gate electrode of the first MISFET and to the gate electrode of the second MISFET.

* * * * *